US011133326B2

(12) United States Patent
Takizawa et al.

(10) Patent No.: US 11,133,326 B2
(45) Date of Patent: Sep. 28, 2021

(54) SEMICONDUCTOR DEVICE AND METHOD OF MANUFACTURING THEREOF

(71) Applicant: RENESAS ELECTRONICS CORPORATION, Tokyo (JP)

(72) Inventors: Naoki Takizawa, Tokyo (JP); Tomoya Saito, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/410,692

(22) Filed: May 13, 2019

(65) Prior Publication Data

US 2019/0378851 A1 Dec. 12, 2019

(30) Foreign Application Priority Data

Jun. 8, 2018 (JP) .............................. JP2018-110008

(51) Int. Cl.
*H01L 29/792* (2006.01)
*H01L 27/11568* (2017.01)
(Continued)

(52) U.S. Cl.
CPC .... *H01L 27/11568* (2013.01); *G11C 16/0466* (2013.01); *H01L 27/1158* (2013.01); *H01L 27/11573* (2013.01)

(58) Field of Classification Search
CPC .......... H01L 27/11568; H01L 27/1158; H01L 27/11573; H01L 29/40117; H01L 27/11519; H01L 27/11521; H01L 27/11565; H01L 29/42328; H01L 29/42344; H01L 29/792; H01L 29/66833; H01L 27/115; H01L 29/66545; H01L 29/40114; H01L 29/66795; H01L 29/4234; H01L 29/518; H01L 29/665; (Continued)

(56) References Cited

U.S. PATENT DOCUMENTS 9,543,315 B1 * 1/2017 Chakihara ......... H01L 27/11573
10,043,814 B2 8/2018 Yamashita
(Continued)

FOREIGN PATENT DOCUMENTS

JP 2007-005771 A 1/2007
JP 2017-045860 A 3/2017
(Continued)

OTHER PUBLICATIONS

Japanese Notice of Reasons for Refusal issued in corresponding Japanese Patent Application No. 2018-110008, dated Jul. 13, 2021, with English translation.

*Primary Examiner* — Samuel Park
(74) *Attorney, Agent, or Firm* — McDermott Will & Emery LLP

(57) ABSTRACT

In a semiconductor device including a plurality of memory regions formed of split-gate type MONOS memories, threshold voltages of memory cells are set to different values for each memory region. Memory cells having different threshold voltages are formed by forming a metal film, which is a work function film constituting a memory gate electrode of a memory cell in a data region, and a metal film, which is a work function film constituting a memory gate electrode of a memory cell in a code region, of different materials or different thicknesses.

13 Claims, 35 Drawing Sheets

(51) Int. Cl.
*G11C 16/04* (2006.01)
*H01L 27/1158* (2017.01)
*H01L 27/11573* (2017.01)

(58) Field of Classification Search
CPC ............... H01L 29/785; H01L 29/513; H01L 29/66825; H01L 29/7851; G11C 16/0466; G11C 16/3495; G11C 16/10; G11C 16/26; G11C 16/14; G11C 16/0425
See application file for complete search history.

(56) References Cited

U.S. PATENT DOCUMENTS

| | | | |
|---|---|---|---|
| 2006/0281262 A1 | 12/2006 | Hisamoto et al. | |
| 2015/0145023 A1* | 5/2015 | Arigane | H01L 27/11568 257/326 |
| 2015/0270279 A1* | 9/2015 | Arigane | H01L 29/40117 257/324 |
| 2016/0064507 A1* | 3/2016 | Amo | H01L 29/4975 257/314 |
| 2017/0062445 A1* | 3/2017 | Yamashita | H01L 21/823431 |
| 2017/0084625 A1 | 3/2017 | Takeuchi et al. | |
| 2017/0200729 A1* | 7/2017 | Dai | H01L 29/66545 |
| 2018/0061997 A1 | 3/2018 | Kawashima et al. | |
| 2019/0131302 A1* | 5/2019 | Yi | H01L 29/785 |

FOREIGN PATENT DOCUMENTS

| | | |
|---|---|---|
| JP | 2017-059796 A | 3/2017 |
| JP | 2018-037503 A | 3/2018 |

\* cited by examiner

| OPERATION \ APPLIED VOLTAGE | Vd | Vcg | Vmg | Vs | Vb |
|---|---|---|---|---|---|
| WRITE | Vdd | 1V | 12V | 6V | 0 |
| ERASE | 0 | 0 | −6V | 6V | 0 |
| READ | Vdd | Vdd | 0 | 0 | 0 |

Vdd = 1.5V

SEMICONDUCTOR DEVICE AND METHOD OF MANUFACTURING THEREOF

CROSS-REFERENCE TO RELATED APPLICATIONS

The disclosure of Japanese Patent Application No. 2018-110008 filed on Jun. 8, 2018 including the specification, drawings and abstract is incorporated herein by reference in its entirety.

BACKGROUND

The present invention relates to a semiconductor device and a method of manufacturing thereof, and more particularly, the present invention relates to a technique useful for application to a semiconductor device including split-gate type MONOS memories.

EEPROM (Electrically Erasable and Programmable Read Only Memory) is widely used as a nonvolatile semiconductor memory device capable of electrically writing and erasing. These storage devices typified by flash memories which are widely used at present have a conductive floating gate electrode or a trapping insulating film surrounded by an oxide film below a gate electrode of a MISFET, and charge accumulation states in the floating gate or the trapping insulating film are used as storage information, and the stored information is read out as a threshold value of a transistor. The trapping insulating film refers to an insulating film capable of accumulating charges, and as an example, a silicon nitride film or the like can be given. The threshold of the MISFET is shifted to allow the MISFET to operate as a storage element by injecting/discharging charges into/from the charge storage regions. As the flash memory, there is a split-gate type cell using a MONOS (Metal-Oxide-Nitride-Oxide-Semiconductor) film.

In addition, a fin transistor is known as a field-effect transistor which has a high operating speed and can reduce leakage current and power consumption and can be miniaturized. The fin-type transistor (FinFET: Fin Field Effect Transistor) is, for example, a semiconductor device having a pattern of a plate-like (wall-like) semiconductor layer protruding from a substrate as a channel layer, and having gate electrodes formed so as to stride the pattern.

Japanese unexamined Patent Application publication No. 2017-45860 discloses a split-gate flash memory having a FinFET.

SUMMARY

In split-gate type MONOS memories, characteristics may be deteriorated by repeating rewriting. When the characteristics deteriorate, for example, an erase time or a write time required to obtain a predetermined threshold voltage are increased. Since there is a difference in the number of times of rewriting depending on the memory regions, the above-mentioned degradation causes a difference in the characteristics of the MONOS memory between the memory regions.

Other objects and novel features will become apparent from the description of the specification and the accompanying drawings.

The typical ones of the embodiments disclosed in the present application will be briefly described as follows.

In a semiconductor device of one embodiment, work-function films constituting memory gate electrodes of a split-gate type MONOS memory are formed of different materials or different thicknesses for each memory region.

In addition, in a manufacturing process of the split-gate type MONOS memory, in the manufacturing process of the semiconductor device according to the embodiment, after forming the control gate electrode made of the metal film with keeping the upper surface of the dummy gate electrode in the form of the charge-storage film protected by the first insulating film, protecting the upper surface of the control gate electrode by the second insulating film, and then the dummy gate electrode in the respective memory regions is replaced by the memory gate electrode. Here, the work function film constituting the memory gate electrode of each memory region is formed of a different material or a different film thickness for each memory region.

According to the embodiment disclosed in the present application, characteristics of split-gate type MONOS memories can be improved.

DETAILED DESCRIPTION

Figure 1:
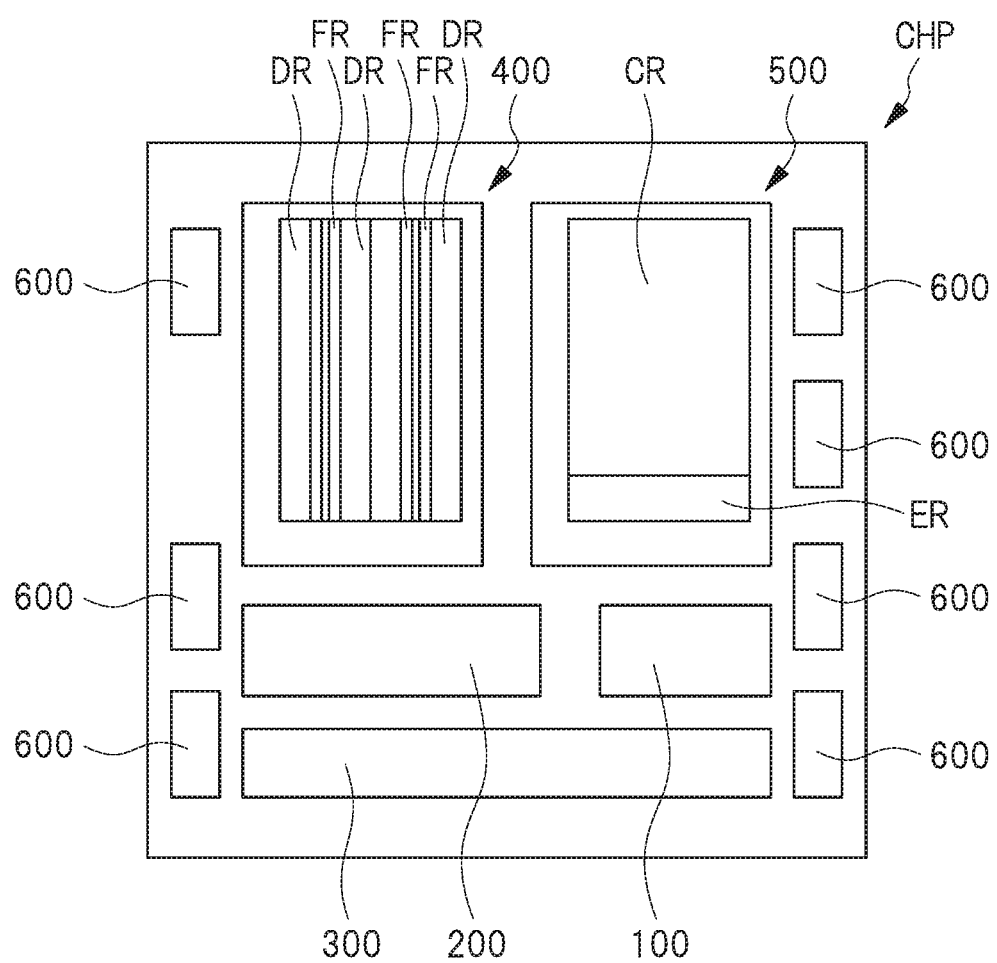
FIG. 1 is a schematic diagram showing a layout configuration of a semiconductor chip according to a first embodiment of the present invention.

In the following embodiments, if necessary for the sake of convenience, the embodiments will be each described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others. Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers.

Furthermore, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers. Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe embodiments in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

First Embodiment

Layout Example of Semiconductor Chip

A semiconductor device having a nonvolatile memory according to the present embodiment will be described with reference to the drawings. First, a layout configuration of a semiconductor device (semiconductor chip) in which a system including a nonvolatile memory is formed will be described. FIG. 1 is a schematic diagram showing an example of a layout configuration of a semiconductor chip CHP according to the present embodiment.

In FIG. 1, the semiconductor chip CHP includes a CPU (Central Processing Unit) 100, a RAM (Random Access Memory) 200, and analog circuits 300. The semiconductor chip CHP includes an EEPROM (Electrically Erasable Programmable Read Only Memory) 400, a flash memory 500, and I/O (Input/Output) circuits 600, and the semiconductor chip CHP are being comprised of a semiconductor device.

The CPU (circuit) 100 is also called a central processing unit (CPU) and reads and decodes instructions from a storage device, and performs various operations and controls based on the instructions.

The RAM (circuit) 200 is a memory capable of randomly reading/writing stored information, that is, reading stored information and newly writing stored information from time to time, and is also called a memory capable of writing/reading stored information from time to time. As the RAM, a SRAM (Static RAM using static circuits) is used.

The analog circuit 300 is a circuit that handles signals of voltage and current that continuously change in time, i.e., analog signals. The analog circuit 300 is comprised of, for example, an amplifier circuit, a conversion circuit, a modulation circuit, an oscillation circuit, a power supply circuit, and the like.

The EEPROM 400 and flash memory 500 are a type of nonvolatile memory in which stored data can be electrically rewritten in a write operation and an erase operation, and is also referred to as an electrically erasable programmable read only memory. The EEPROM 400 and the memory cell of the flash memory 500 are comprised of, for example, a MONOS (Metal Oxide Nitride Oxide Semiconductor) type transistor or a MNOS (Metal Nitride Oxide Semiconductor) type transistor for storage (memory). The difference between the EEPROM 400 and the flash memory 500 is that the EEPROM 400 is a nonvolatile memory which can be erased in units of bytes, for example, while the flash memory 500 is a nonvolatile memory which can be erased in units of word lines, for example. Generally, the flash memory 500 stores programs and the like for executing various processes in the CPU 100. On the other hand, the EEPROM 400 stores various types of data that are more frequently rewritten than programs. The various types of data include, for example, data used when the program is executed.

The EEPROM 400 or flash memory 500 includes a memory array in which a plurality of nonvolatile memory cells is arranged in rows and columns, address buffers, row decoders, column decoders, verify sense amplifier circuits, sense amplifier circuits, write circuits, and the like.

The I/O circuit 600 is an input/output circuit for outputting data from the inside of the semiconductor chip CHP to a device connected to the outside of the semiconductor chip CHP, or inputting data from a device connected to the outside of the semiconductor chip CHP to the inside of the semiconductor chip.

The semiconductor device of this embodiment includes a memory cell region and a logic circuit region. In the memory cell region, a memory array in which a plurality of nonvolatile memory cells is arranged in a matrix is formed. In the logic circuit area, a CPU 100, a RAM 200, an analogue circuit 300, an I/O circuit 600, and address buffers, a row decoder, a column decoder, a verify sense amplifier circuit, a sense amplifier circuit, a write circuit, and the like of the EEPROM 400 or flash memory 500 are formed.

The memory array comprising the flash memory 500 includes a code region CR and an extra region ER. The code region CR is an region in which codes of programs for executing processes in the CPU 100 are stored. The extra region ER is an region for storing a trimming code or the like required for trimming the power supply voltage of the flash memory.

The memory array comprising the EEPROM 400 includes a data region DR and a flag region FR. The data region DR is an region for storing various data having a high rewrite frequency, such as data used when a program is executed.

The flag region FR is, for example, a region for storing a flag indicating that the data region DR data has been written or has not been written.

When the semiconductor chip CHP is used, in particular, the rewriting is often performed in the data region DR among the data region DR, the flag region FR, the code region CR, and the extra region ER. In the present application, the data region DR, the flag region FR, the code region CR, the extra region ER, and the like are referred to as memory regions.

Here, the number of times of rewriting in the data region DR is larger than that in the code region CR, and the characteristic of the memory transistor is apt to be deteriorated. This characteristic deterioration occurs depending on the difference between the threshold voltage of the memory transistor in the write state and the threshold voltage of the memory transistor in the erase state. Therefore, characteristic degradation can be suppressed by setting the threshold voltage in the erase state high and reducing the difference between the threshold voltage in the write state and the threshold voltage in the erase state.

However, when the threshold voltage in the erase state is set high, the read current in the erase state decreases. On the other hand, by setting the threshold voltage of the memory transistor to be low, the amount of the read current can be ensured while maintaining the difference between the threshold voltages.

As described above, it is desirable to adjust the threshold voltage of the memory transistor to a different value for each memory region in accordance with the required performance.

Configuration of Semiconductor Device

Figure 2:
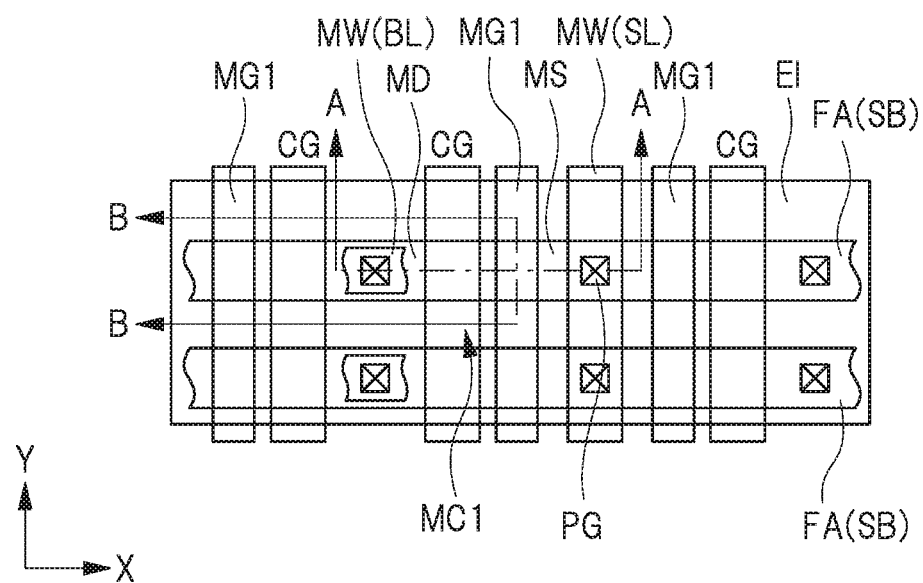
FIG. 2 is a plan view showing a semiconductor device according to a first embodiment of the present invention.
Figure 3:
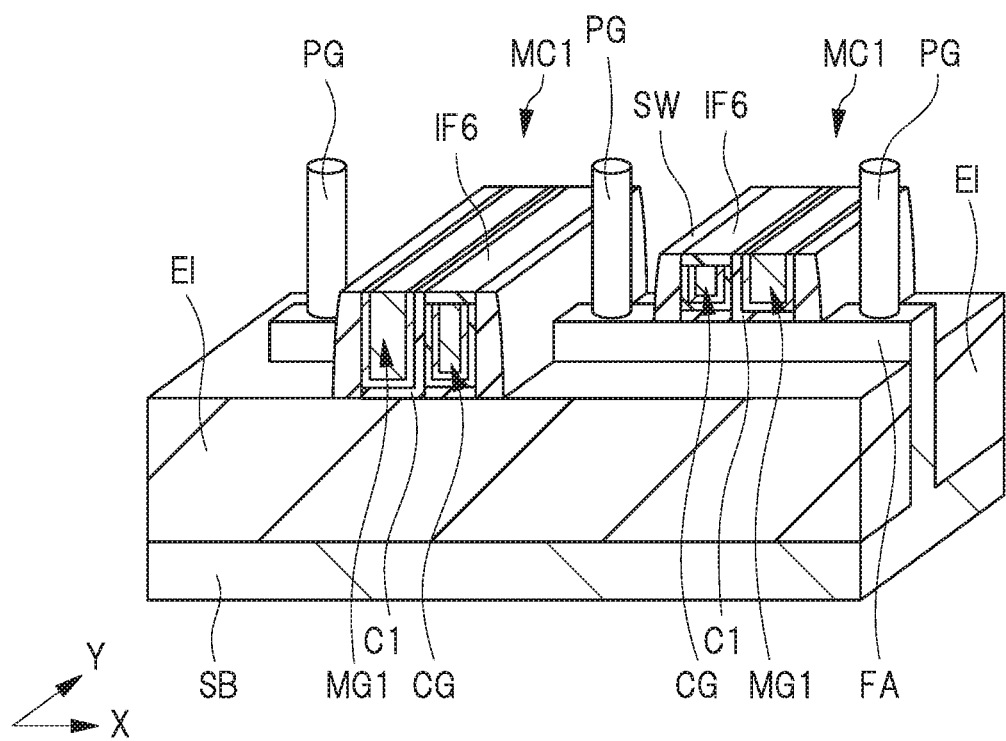
FIG. 3 is a perspective view showing a semiconductor device according to a first embodiment of the present invention.
Figure 4:
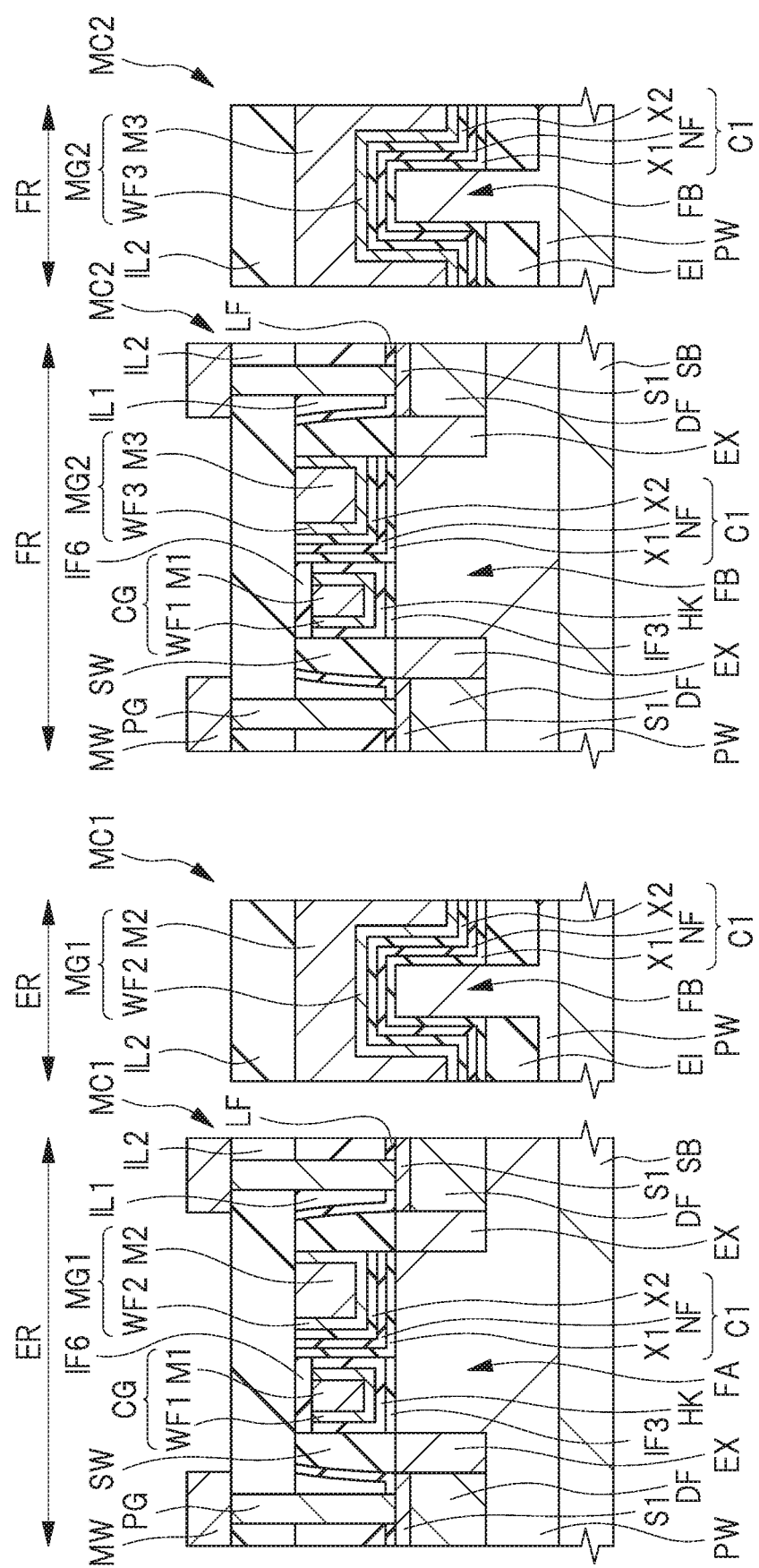
FIG. 4 is a cross-sectional view showing a semiconductor device according to a first embodiment of the present invention.

Hereinafter, the structure of the semiconductor device of this embodiment will be described with reference to FIGS. 2 to 4. FIG. 2 is a plan view of the semiconductor device according to the present embodiment. FIG. 3 is a perspective view of the semiconductor device according to the present embodiment. FIG. 4 is a cross-sectional view of the semiconductor device according to the present embodiment. FIG. 2 and FIG. 3 show MONOS memories of the extra regions ER, among the data regions DR, the flag regions FR, the code regions CR, and the extra regions ER. In FIG. 3, the interlayer insulating film, silicide layers, and wirings on the semiconductor substrate, and the source/drain regions and wells in the semiconductor substrate are not shown.

In FIG. 4, two cross-sections of the MONOS memory in the extra region ER and two cross-sections of the MONOS memory in the flag region FR are shown side by side. That is, the left side of FIG. 4 shows two cross-sections of the extra region ER of FIG. 2 along the lines A-A and B-B, respectively, and the right side of FIG. 4 shows a cross-section of the flag region FR of FIG. 2 along the lines A-A and B-B, respectively. In FIG. 4, a cross-section along the gate length direction (X direction) and a cross-section including the memory gate electrode along the gate width direction (Y direction) are alternately arranged in order from the left side to the right side.

FIG. 2 shows a plan view of the memory array. The plurality of memory cells MC1 formed in the memory array is nonvolatile memory elements formed in the extra region ER in the flash memory 500 of FIG. 1. Hereinafter, a region in which a memory cell is formed is referred to as a memory cell region.

In the memory cell region, a plurality of fins FA extending in the X direction are arranged at equal intervals in the Y direction. The X direction and the Y direction are directions along the main surface of the semiconductor substrate SB.

The X direction is orthogonal to the Y direction. The fin FA is, for example, a rectangular parallelepiped shaped protruding portion (convex portion) selectively protruding from the main surface (upper surface) of the semiconductor substrate SB, and has a wall shape (plate shape). The fin FA is a part of the semiconductor substrate SB and is an active region of the semiconductor substrate SB. In plan view, a space between adjacent fins FA is filled with the element isolation film EI, and the fins FA is surrounded by the element isolation film EI. The fin FA is an active region for forming the memory cell MC1. The semiconductor substrate SB is made of, for example, p-type monocrystalline silicon having a resistivity of about 1 to 10 Ωcm.

The lower end portion of the fin FA is surrounded by the element isolation film EI covering the main surface of the semiconductor substrate SB in plan view. However, a part of the fin FA protrudes above the element isolation film EI. That is, not all regions between adjacent fins are completely filled with the element isolation EI.

A plurality of control gate electrodes CG extending in the Y direction and a plurality of memory gate electrodes MG1 extending in the Y direction are arranged on the plurality of fins FA. A drain region MD located in the side of the control gate electrode CG and a source region MS located in the side of the memory gate electrode are formed inside the fin FA including the upper surface and the side surface of the fin FA so as to sandwich the control gate electrode CG and the memory gate electrode MG1. That is, in the X direction, one control gate electrode CG and one memory gate electrode MG1 adjacent to each other are located between the source region MS and the drain region MD. region MS are n-type semiconductor regions. The drain region MD is formed between two adjacent control gate electrodes CG in the X direction, and the source region MS is formed between two adjacent memory gate electrodes MG1 in the X direction. The memory cell MC1 is a nonvolatile memory element having a control gate electrode CG, a memory gate electrode MG1, a drain region MD, and a source region MS. Hereinafter, the source region MS and the drain region MD constituting one memory cell MC1 may be referred to as a source/drain region.

Two memory cells MC1 adjacent to each other in the X direction share one drain region MD or one source region MS. Two memory cells MC1 sharing the drain region MD have line symmetry in the X direction with the drain region MD extending in the Y direction as an axis, and two memory cells MC1 sharing the source region MS have line symmetry in the X direction with the source region MS extending in the Y direction as an axis.

A plurality of memory cells MC1 arranged in the X direction are formed on each fin FA. Each source region MS of the plurality of memory cells MC1 arranged on one fin is electrically connected to a source line SL formed of a wiring MW via a plug (contact plug, conductive connection portion) PG formed inside a contact hole penetrating an interlayer insulating film (not shown) formed on the memory cell MC1. The drain regions MD of the plurality of memory cells MC1 arranged in the Y direction are electrically connected to the bit line BL formed of the wiring MW via the plugs PG. The source line SL extends in the Y direction, and the bit line BL extends in the X direction.

The fin FA is, for example, a rectangular parallelepiped shaped protrusion that protrudes from the main surface of the semiconductor substrate SB in a direction perpendicular to the main surface. The fin FA does not necessarily have to be a rectangular parallelepiped, and the corners of the rectangle may be rounded when viewed in cross section in the short side direction. Each side surface of the fin FA may be perpendicular to the main surface of the semiconductor substrate SB, but may have an inclination angle close to perpendicular. That is, the cross-sectional shape of each of the fins FA is a rectangular parallelepiped or a trapezoid. Here, each side surface of the fin FA is inclined obliquely with respect to the main surface of the semiconductor substrate SB. In each drawing of the present application, the inclination is not shown.

As shown in FIG. 2, the direction in which the fin FA extends in plan view is the long side direction (longitudinal direction) of each fin, and the direction orthogonal to the long side direction is the short side direction (short side direction) of each fin. That is, the length of the fin in the X direction is larger than the width of the fin in the Y direction. The fin FA may have any shape as long as it is a protrusion having a length, a width, and a height. For example, it may have a serpentine layout in plan view.

FIG. 3 shows two memory cells MC1 formed side by side on one fin FA. For the sake of clarity, the control gate electrode CG, the memory gate electrode MG1, and the ONO film (insulating film) C1 of the memory cell MC1 on the left side of FIG. 3 are shown in a cross section immediately above the element isolation film EI, and the control gate electrode CG, the memory gate electrode MG1, and the ONO film C1 of the memory cell MC1 on the right side of FIG. 3 are shown in a cross section immediately above the fin FA. A memory cell MC1 is formed on the fin FA constituting the semiconductor substrate SB in the memory cell region. As shown in FIG. 3, the control gate electrode CG and the memory gate electrode MG1 extend in the Y direction so as to stride the fin FA. In FIG. 3, the ONO film C1 is shown as a single insulating film without distinguishing the insulating films constituting the ONO (Oxide Nitride Oxide) film C1 having the stacked structures.

Although the structure of the memory cell MC1 in the extra region ER will be described below with reference to FIG. 4, the memory cell formed in each of the data region DR, the flag region FR, and the code region CR shown in FIG. 1 also has the same structure as the memory cell MC1. That is, the structure of the memory cell MC2 in the flag region FR shown on the right side of FIG. 4 is substantially the same as that of the memory cell MC1. Therefore, the structure of the memory cell MC1 in the extra region ER will be mainly described below, and the description of the structure of the memory cell MC2 may be omitted. However, at least the metal film (work function film) WF2 composing the memory gate electrode MG1 of the memory cell MC1 and the metal film (work function film) WF3 composing the memory gate electrode MG2 of the memory cell MC2 are comprised of different materials.

As shown in FIG. 3 and FIG. 4, a plurality of protrusions, which are part of the semiconductor substrate SB, are formed side by side in the Y direction on the semiconductor substrate SB in the extra region ER. Part of each side surface of each fin FA is surrounded by an element isolation film EI formed on the main surface of the semiconductor substrate SB. The element isolation film EI is filled between the adjacent fins FA. However, the element isolation film EI is filled only a part of the region between the adjacent fins FA, and the upper end of each fin FA protrudes above the element isolation film EI. That is, the fins FA are separated from each other by the element isolation film EI. As shown in FIG. 4, a p-type well PW, which is a p-type semiconductor region, is formed in the fin FA from the upper surface to the lower portion of the fin FA. In the flag region FR, similarly to the fin FA of the extra region ER, a fin FB is formed, and a p-type well PW is formed in the fin FB.

A control gate electrode CG is formed on the upper surface of the fin FA, on the side surface of the fin FA, and on the element isolation film EI via a gate insulating film, and a memory gate electrode MG1 is formed in a region adjacent to the control gate electrode CG via an ONO film C1 in the long side direction (X direction) of the fin FA. An ONO film C1 is interposed between the control gate electrode CG and the memory gate electrode MG1, and the ONO film C1 electrically separates the control gate electrode CG and the memory gate electrode MG1. The ONO film C1 is also interposed between the memory gate electrode MG1 and the upper surface of the fin FA. The ONO film C1 is continuously formed so as to cover the side surface and the bottom surface of the memory gate electrode MG1. Therefore, the ONO film C1 has an L-shaped cross section along the gate length direction as shown in FIG. 4.

The gate insulating film under the control gate electrode CG is comprised of a laminated film of a thermal oxide film (silicon oxide film, insulating film IF3) formed by thermally oxidizing the main surface and the side surface of the fin FA, which is the protruding portion of the semiconductor substrate SB made of silicon, and a high dielectric constant film (high dielectric film) HK, and the thickness of the gate insulating film is, for example, 2.5 nm. The thickness of the insulating film IF3 constituting the gate insulating film is, for example, 1 nm, and the thickness of the high dielectric constant film HK formed on the insulating film IF3 and constituting the gate insulating film is, for example, 1.5 nm. The high dielectric constant film HK is an insulating film made of an HfO film, a HfON film, a HfSiON film, or the like, and the dielectric constant of the high dielectric constant film HK is higher than either of the dielectric constant of silicon oxide and the dielectric constant of silicon nitride.

The entire insulating film IF3 is formed along the surface of the fin FA. That is, the insulating film IF3 is formed so as to cover the bottom surface of the control gate electrode CG. On the other hand, the high dielectric constant film HK is formed so as to cover the bottom surface and the side surface of the control gate electrode CG. That is, the high dielectric constant film HK has a U-shaped cross section.

The ONO film C1 includes a silicon oxide film X1 made of a thermal oxide film (silicon oxide film) having a thickness of 4 nm formed by thermally oxidizing the main surface and the side surface of the fin FA, which is the protruding portion of the semiconductor substrate SB made of silicon, a silicon nitride film NF formed on the silicon oxide film X1, and a silicon oxide film X2 formed on the silicon nitride film NF. The silicon nitride film NF is a charge storage portion (charge storage film, charge storage layer) of the memory cell MC1. The silicon nitride film NF has a film thickness of, for example, 7 nm, and the silicon oxide film X2 has a film thickness of, for example, 9 nm.

That is, the ONO film C1 has a stacked structure comprised of a silicon oxide film X1, a silicon nitride film NF, and a silicon oxide film X2 stacked in this order from the top surface of the fin FA and the side surface of the control gate electrode CG.

The thickness of the ONO film C1 is, for example, 20 nm, which is larger than the thickness of the gate insulating film under the control gate electrode CG. The silicon oxide film X2 may be formed of a silicon oxynitride film.

The control gate electrode CG extends in the short side direction (Y direction) of the fin FA, and is formed adjacent to the upper surface and the side surface of the fin FA and the upper surface of the element isolation film EI via the gate insulating film. Similarly, the memory gate electrode MG1 extends in the short side direction of the fin FA, and is adjacent to the upper surface and the side surface of the fin FA and the upper surface of the element isolation film EI via the ONO film C1. That is, the gate insulating film and the control gate electrode CG completely fill the opening between the fins FA adjacent to each other in the short side direction of the fin FA. The ONO film C1 and the memory gate electrode MG1 completely fill the opening between the fins FA adjacent to each other in the short side direction of the fin FA.

The upper surface of the control gate electrode CG is covered with the insulating film IF6, and the insulating film IF6 extends in the Y direction similarly to the control gate electrode CG. The insulating film IF6 is made of, for example, a silicon nitride film. The insulating film IF6 is located at a height adjacent to the memory gate electrode MG1. In other words, the insulating film IF6 is adjacent to the side surface of the memory gate electrode MG1 via the ONO film C1. That is, the height of the upper surface of the insulating film IF6 is equal to the height of the upper surface of the memory gate electrode MG1, and the lower surface of the insulating film IF6 is located at a position lower than the upper surface of the memory gate electrode MG1. The insulating film IF6 is formed only directly on the control gate electrode CG, and the upper surface of the control gate electrode CG is in contact with the insulating film IF6. On the other hand, the upper surface of the memory gate electrode MG1 is exposed from the insulating film IF6 and is separated from the insulating film IF6.

The side surfaces of the pattern including the control gate electrode CG, the memory gate electrode MG1, the ONO film C1, and the insulating film IF6 are covered with the sidewall spacers SW. The sidewall spacer SW has, for example, a stacked structure of a silicon nitride film and a silicon oxide film. However, in FIGS. 3 and 4, the sidewall spacer SW is shown as one film, and the silicon nitride film and the silicon oxide film are not shown separately.

As shown in FIG. 4, a pair of source/drain regions are formed in the fin FA so as to sandwich the surface of the fin FA immediately below the pattern including the control gate electrode CG and the memory gate electrode MG1, that is, the channel region. Each of the source region and the drain region has an extension region EX which is an $n^-$ type semiconductor region formed in the fin FA and a diffusion region DF which is an $n^+$ type semiconductor region formed in the fin FA. The extension region EX and the diffusion region DF are semiconductor regions in which an n-type impurity (e.g., P (phosphorus) or arsenic (As)) is introduced into the fin FA.

The impurity concentration of the diffusion region DF is higher than that of the extension region EX. The extension region EX may have a shallower or deeper formation depth than the diffusion region DF. In each of the source region and the drain region, the extension region EX and the diffusion region DF are in contact with each other, and the extension region EX is located on the surface of the fin FA immediately below the above-mentioned pattern, that is, on the channel formation region.

The drain region is adjacent to the fin FA immediately below the control gate electrode CG, and the source region is adjacent to the fin FA immediately below the memory gate electrode MG1. That is, of the source/drain regions sandwiching the pattern including the control gate electrode CG and the memory gate electrode MG1 in plan view, the drain region is located on the control gate electrode CG side, and the source region is located on the memory gate electrode MG1 side. In other words, in plan view, the drain region is adjacent to the control gate electrode CG, and the source region is adjacent to the memory gate electrode MG1.

As described above, by forming the source/drain regions having the structure including the extension regions EX having a low impurity concentration and the diffusion regions DF having a high impurity concentration, that is, the LDD (Lightly Doped Drain) structure, the short-channel characteristics of the transistor having the source/drain regions can be improved. The source region corresponds to the source region MS shown in FIG. 2, and the drain region corresponds to the drain region MD shown in FIG. 2.

A silicide layer S1 is formed on the surface of each of the source region and the drain region exposed from the pattern including the control gate electrode CG, the memory gate electrode MG1, and the sidewall spacer SW, that is, on the surface of the diffusion region DF. The silicide layers S1 are made of, for example, nickel silicide (NiSi).

An interlayer insulating film IL1 made of, for example, a silicon oxide film is formed on the fin FA and the element isolation film EI viaa liner insulating film LF made of, for example, a silicon nitride film. The liner insulating film LF and the interlayer insulating film IL1 cover the fin FA, the element isolation film EI, and the silicide layer S1, and the upper surface of the interlayer insulating film IL1 is flattened at substantially the same height as the upper surfaces of the insulating film IF6, the memory gate electrode MG1, and the sidewall spacer SW. A liner insulating film LF is interposed between the side surface of the sidewall spacer SW and the interlayer insulating film IL1. An interlayer insulating film IL2 is formed on the interlayer insulating film IL1 to cover the upper surfaces of the insulating film IF6, the memory gate electrode MG1, and the sidewall spacers SW. The upper surface of the interlayer insulating film IL2 is flattened. The interlayer insulating film IL2 is made of, for example, a silicon oxide film.

A plurality of wirings MW are formed on the interlayer insulating film IL2, and the wirings MW are electrically connected to the source region or the drain region of the memory cell MC1 through plugs PG provided in contact hole penetrating the interlayer insulating films IL1 and IL2. That is, the bottom surface of the plug PG is in direct contact with the upper surface of the silicide layer S1, and the plug PG is electrically connected to the source region or the drain region via the silicide layer S1. The silicide layer S1 has a function of reducing the connection resistance between the plug PG, which is a connection portion made of a metal film mainly containing tungsten (W), for example, and the source/drain regions in the fin FA made of a semiconductor.

In the power supply region (not shown) of the control gate electrode CG, a plug is connected to the upper surface of the control gate electrode CG. A plug PG is connected to an upper surface of the memory gate electrode MG1 in a power supply region (not shown) of the memory gate electrode MG1.

The memory cell MC1 is a nonvolatile memory element having a control gate electrode CG, a memory gate electrode MG1, a drain region, and a source region. The control gate electrode CG and the source/drain region constitute a control transistor, the memory gate electrode MG1 and the source/drain region constitute a memory transistor, and the memory cell MC1 is comprised of a control transistor and a memory transistor. That is, the control transistor and the memory transistor share a source/drain region. The distance between the drain region and the source region in the gate length direction (X direction) of the control gate electrode CG and the memory gate electrode MG1 corresponds to the channel length of the memory cell MC1. The control transistor and the memory transistor are FinFET, that is, fin-type field-effect transistors having the surfaces of the fin FA as channels.

Similarly, in the flag region FR shown in FIG. 4, a memory cell MC2, which is a nonvolatile memory element having a control gate electrode CG, a memory gate electrode MG2, a drain region, and a source region, is formed on the fin FB. Also in the flag region FR, the control gate electrode CG and the source/drain region constitute a control transistor, the memory gate electrode MG2 and the source/drain region constitute a memory transistor, and the memory cell MC2 is comprised of a control transistor and a memory transistor. That is, the control transistor and the memory transistor share a source/drain region.

Here, the control gate electrode CG of each of the extra region ER and the flag region FR is comprised of a metal film (work function film) WF1 for adjusting the threshold voltage of the control transistor, and a metal film M1 on the metal film WF1. That is, the control gate electrodes CG of the extra region ER and the flag region FR are made of the same material. The metal film WF1 covers the bottom surface and the side surface of the metal film M1. The metal film WF1 is made of, for example, a TiAl film. The metal film M1 is a main conductor film of the control gate electrode CG, and is made of, for example, an Al (aluminum) film or a W (tungsten) film. The metal film WF1 has a work function different from a region including the upper surface and the side surface of each of the fins FA and FB covered with the control gate electrode CG, that is, a channel formation region.

Here, the resistance of the control gate electrode CG is reduced by configuring the control gate electrode CG not by the polysilicon film but by the metal films WF1 and M1. In addition, the resistance of the control gate electrode CG is lowered, and the resistance of the gate electrodes of the memory transistors sharing the channel with the control transistor, that is, the memory gate electrodes MG1 and MG2, is also lowered. That is, in the present embodiment, as described below, a part of each of the memory gate electrodes MG1 and MG2 is formed of the metal film M2 or M3. In order to adjust the threshold voltage of the memory transistor including the memory gate electrode MG1 or MG2, metal films (work function film) WF2 and WF3 are formed immediately below the metal films M2 and M3, respectively.

The metal film WF2 has a work function different from a region including the upper surface and the side surface of the fin FA covered with the memory gate electrode MG1, that is, a channel formation region. The metal film WF3 has a work function different from a region including the upper surface and the side surface of the fin FB covered with the memory gate electrode MG2, that is, a channel formation region. The metal film (work function film) constituting the memory gate electrode of each of the extra region ER, the flag region FR, the code region CR, and the data region DR (see FIG. 1) has a work function different from any of the channel formation regions of the extra region ER, the flag region FR, the code region CR, and the data region DR.

That is, the memory gate electrode MG1 of the extra region ER is comprised of a metal film WF2 and a metal film M2 which are sequentially formed on the ONO film C1. The metal film WF2 is made of, for example, a TiAl (titanium aluminum) film or a TiN (titanium nitride) film. The metal film M2 is made of, for example, an Al (aluminum) film or a W (tungsten) film. The resistance of the metal film M2 is lower than the resistance of the metal film WF2.

Similarly, the memory gate electrode MG2 of the flag region FR is comprised of a metal film WF3 and a metal film M3 which are sequentially formed on the ONO film C1. The metal film WF3 is made of, for example, a TiAl (titanium aluminum) film or a TiN (titanium nitride) film. The metal film M3 is made of, for example, an Al (aluminum) film or a W (tungsten) film. The resistance of the metal film M3 is lower than the resistance of the metal film WF3.

Here, the metal films WF2 and WF3 are made of different materials. Each of the metal films M2 and M3 may be formed of the same material or different materials. When the metal film WF2 or WF3 is made of a TiAl film, the thickness of the TiAl film is, for example, 6 nm to 8 nm. When the metal film WF2 or WF3 is made of a TiN film, the thickness of the TiN film is, for example, 6 to 10 nm.

As shown in the second drawing from the left in FIG. 4, the upper surface of a part of the metal film WF2 constituting the memory gate electrode MG1 is formed below the upper surface of the fin FA. That is, the groove between two adjacent fins FA and immediately above the element isolation film EI is not completely filled with only the ONO film C1 and the metal film WF2. The opening between the two fins FA is completely filled with the ONO film C1 and the metal films WF2 and M2. Here, the completely embedded state refers to a state in which all the regions between the adjacent fins FA are filled with a single film or a plurality of films. The fact that the space between the adjacent fins FA is not completely filled with the ONO film C1 and the metal film WF2 means that the total thickness of the ONO film C1 and the metal film WF2 is less than ½ of the distance between the adjacent fins FA. Similarly, the groove between the two fins FB is completely filled with the ONO film C1 and the metal films WF3 and M3.

An upper surface of each of the metal films WF1 and M1 is present on the upper surface of the control gate electrode CG. That is, the upper surfaces of the metal films WF1 and M1 are in contact with the lower surface of the insulating film IF6. The upper surfaces of the metal films WF2 and M2 exist on the upper surface of the memory gate electrode MG1. The upper surfaces of the metal films WF3 and M3 exist on the upper surface of the memory gate electrode MG2. The upper surfaces of the metal films WF2, M2, WF3, and M3 are in contact with the lower surface of the interlayer insulating film IL2.

One of the main features of the semiconductor device of this embodiment is that memory cells in different memory regions have memory gate electrodes including work function films (e.g., metal films WF2 and WF3) made of different materials (compositions), so that the memory transistors in these regions have different threshold voltages. However, the work function films of the memory regions may be formed of films made of the same material (composition) and formed to have different thicknesses, thereby providing a difference in threshold voltage of the memory transistors of the memory regions.

Operation of Non-Volatile Memory

Next, an operation example of the nonvolatile memory will be described with reference to FIGS. 5 and 6.

Figures 5, 6:
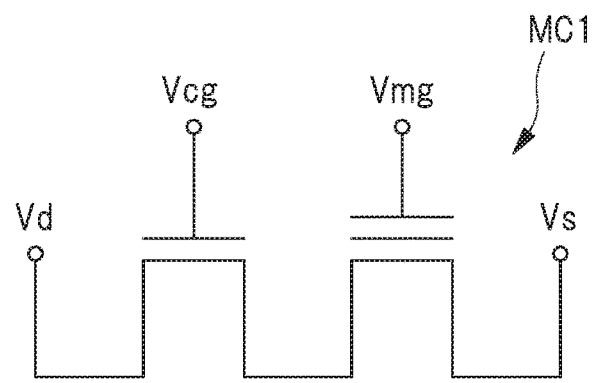
FIG. 5 is an equivalent circuit diagram of a memory cell of a non-volatile memory.
FIG. 6 is a table illustrating an example of a condition for applying a voltage to each part of a selected memory cell during "write", "erase" and "read".

FIG. 5 is an equivalent circuit diagram of the memory cell MC1 of the nonvolatile memory. FIG. 6 is a table showing an example of a condition for applying a voltage to each portion of the selected memory cell at the time of "write", "erase" and "read". In the table of FIG. 6, the voltage Vmg applied to the memory gate electrode MG1 (see FIG. 4) of the memory cell (selected memory cell) MC1 shown in FIG. 5, the voltage Vs applied to the source region, the voltage Vcg applied to the control gate electrode CG (see FIG. 4), the voltage Vd applied to the drain region, and the voltage Vb applied to the p-type well PW (see FIG. 4) are described at the time of "write", "erase", and "read" respectively. Note that what is shown in the table of FIG. 6 is a suitable example of the voltage application condition, and is not limited to this, and can be variously changed as necessary. In this embodiment mode, injection of electrons into the silicon nitride film NF (see FIG. 4), which is the charge storage portion in the ONO film C1 of the memory transistor, is defined as "writing" and injection of holes is defined as "erasing".

As the writing method, a writing method (hot electron injection writing method) in which writing is performed by hot electron injection by source side injection, which is called a so-called SSI (Source Side Injection) method, can be used. For example, writing is performed by applying a voltage as shown in the column of "write" in FIG. 6 to each portion of the selected memory cell in which writing is performed, and injecting electrons into the silicon nitride film NF in the ONO film C1 of the selected memory cell.

At this time, hot electrons are generated in the channel region (between the source and the drain) below between the two gate electrodes (the memory gate electrode MG1 and the control gate electrode CG), and are injected into the silicon nitride film NF, which is a charge storage portion in the ONO film C1 below the memory gate electrode MG1. The injected hot electrons are captured by the trap level of the silicon nitride film NF in the silicon nitride film NF, and as a result, the threshold voltage of the memory transistor rises. That is, the memory transistor is in the write state.

As an erasing method, an erasing method (hot hole injection erasing method) in which erasing is performed by hot hole injection using BTBT (Band-To-Band Tunneling), which is called a so-called BTBT method, can be used. That is, erasing is performed by injecting holes generated by BTBT (band-to-band tunneling) into the charge storage portion (the silicon nitride film NF in the ONO film C1). For example, a voltage as shown in the column "Erase" in FIG. 6 is applied to the respective portions of the selected memory cell to be erased, holes are generated by BTBT phenomena, and holes are injected into the silicon nitride film NF in the ONO film C1 of the selected memory cell by electric field acceleration, thereby lowering the threshold voltage of the memory transistor. That is, the memory transistor is in the erase state.

At the time of reading, for example, a voltage as shown in the column of "read" in FIG. 6 is applied to each portion of the selected memory cell to be read. By setting the voltage Vmg applied to the memory gate electrode MG1 at the time of reading to a value between the threshold voltage of the memory transistor in the write state and the threshold voltage of the memory transistor in the erase state, it is possible to discriminate between the write state and the erase state.

Here, the operation conditions of the memory cell MC1 in the extra region ER shown in FIG. 1 have been described, but the memory cells in the data region DR, the flag region FR, and the code region CR shown in FIG. 1 can also be operated under the same conditions.

Effect of Semiconductor Device of First Embodiment

Characteristics of the flash memory are deteriorated by repeating rewriting. As a result, for example, when a voltage is applied to a memory cell, a time required to obtain a predetermined threshold voltage, i.e., an erase time or a write time, increases. The occurrence of this deterioration depends on, for example, the depth of the threshold voltage in the erase operation, i.e., the difference between the threshold voltage in the erase state and the threshold voltage in the write state, and by making the depth of the threshold voltage in the erase operation shallow, characteristic deterioration can be suppressed and the number of times of rewriting can be increased. Since the data region is a region in which the number of times of rewriting is larger than the code region, it is desirable to set the threshold voltage of the memory cell lower in advance and to make the depth of the threshold voltage at the time of the erase operation relatively shallow.

For the above reasons, it is desirable to set the threshold voltage of the memory cell in the EEPROM including the data region lower than the threshold voltage of the memory cell of the flash memory including the code region. Further, the flag region included in the EEPROM is arranged in a region arranged in a vertical band of several bits perpendicular to the word line in the memory array of the EEPROM in plan view, for example, and the threshold voltage of the flag region is desirably set higher than the threshold voltage of the data region or the code region. This is because, in the case where the flag region is comprised of a plurality of single cells, for example, a plurality of times more current flows than in the case of reading one bit, and therefore, assuming a threshold voltage defined by the same current level, it appears that the threshold voltage is substantially lowered. Therefore, by setting the threshold voltage of the flag region to be higher than the threshold voltage of the data region or the code region, the same read current level as that of the region other than the flag region, i.e., the data region or the code region, is achieved. In this manner, when a plurality of bits are used as the flag region, the effective gate width (W) is increased, so that the retention characteristic (data retention characteristic) can be improved.

The extra region is located in the flash memory and is located in a particular region extending parallel to the WL. The extra region is a region for storing a trimming code or the like required for adjusting the power supply voltage of the flash memory. Since the power supply voltage may vary from one semiconductor device to another, after the semiconductor device is manufactured, the power supply voltage is trimmed and finely adjusted for each semiconductor device. Specifically, a reference voltage is applied from the outside of the semiconductor device to the inside of the semiconductor device, and the reference voltage is compared with the power supply voltage generated in the flash memory, thereby trimming the power supply voltage. The trimming code is a code representing an adjustment amount in trimming, and is a code generated at the time of a trimming operation. The trimming code is generated based on the result of the comparison. The trimming of the power supply voltage is performed during the wafer test, and the generated trimming code is stored in the extra region. Since the wafer test is followed by a packaging process or a process in which the wafer is heated to a high temperature, such as solder reflow at the time of mounting, the extra region in which the trimming code is stored needs to have a high resistance to heat.

That is, in the step of applying heat to the semiconductor device, the threshold voltage of the memory cell in the extra region fluctuates, and the data retention characteristic in the extra region deteriorates. When the number of times of rewriting of the extra region is small, the variation of the threshold voltage at the time of writing is large, and the margin is relatively large with respect to the variation of the threshold voltage at the time of erasing. Therefore, by setting the threshold value of the extra region, which is rewritten only several times, to be high, it is possible to cope with the shift (variation) of the threshold voltage due to the thermal process or the like, and it is possible to prevent the deterioration of the data retention characteristic.

In this manner, by changing the threshold voltage for each memory region, it is possible to prevent characteristic deterioration, increase the number of rewrites, increase the writing speed, and the like, increase the degree of freedom in design of the semiconductor device, and improve the reliability of the semiconductor device. Conversely, when the threshold voltages of the memory cells are the same in all the memory regions, problems such as deterioration of the characteristics of the memory cells, a decrease in the number of rewrites, and a decrease in the writing speed occur, and further, it becomes difficult to increase the degree of freedom of design, resulting in a problem of deterioration of the reliability of the semiconductor device.

In order to change the threshold voltage for each memory region, for example, the threshold voltage of the memory cell may be changed for each memory region. In order to change the threshold voltage for each memory cell, it is conceivable to change the threshold voltage of the memory transistor among the control transistor and the memory transistor constituting the memory cell.

As a method of changing the threshold voltage of a transistor, there is a method of adjusting the concentration of an impurity to be implanted into a channel region. However, when the impurity concentration is increased, there is a problem that characteristic deterioration such as carrier mobility deterioration occurs in addition to characteristic variation.

Here, a fin-type transistor has a structure in which a gate electrode covers a fin portion constituting a channel of the transistor, and has a feature that the gate controllability is better than that of a planar-type transistor. Therefore, when the threshold voltage is adjusted, the impurity concentration in the channel region can be reduced, and characteristic deterioration caused by the impurity can be suppressed.

The threshold voltage of the memory transistor can be changed as appropriate by adjusting a material (composition), a film thickness, or the like of the work function film forming the memory gate electrode.

In the semiconductor device of the present embodiment, as shown in FIG. 4, the memory transistor constituting the memory cell MC1 of the extra region ER has the metal film WF2 as a part of the memory gate electrode MG1, whereas the memory transistor constituting the memory cell MC2 of the flag region FR has the metal film WF3 as a part of the memory gate electrode MG2. In this manner, the memory gate electrodes are separately formed for each memory region. As a result, the material (composition) of the metal film (for example, the metal films WF2 and WF3) for threshold voltage adjustment, which constitutes the memory gate electrode, can be changed for each memory region, so that a memory cell including a memory transistor having different threshold voltage characteristics can be formed for each region.

Here, the case where each of the metal films WF2 and WF3 is formed of different materials has been mainly described, but by forming each of the metal films WF2 and WF3 of the same material and different thicknesses, a memory cell having a different threshold voltage may be formed for each memory region. In the case of increasing the threshold voltage, the thickness of the metal film WF2 or WF3 serving as the work function film may be increased.

In this instance, each of the metal films WF2 and WF3 may be comprised of, for example, a laminated film comprised of a TiAl (titanium aluminum) film, a TiN (titanium nitride) film, and a TaN (tantalum nitride) film formed in order from the memory gate electrodes MG1 and MG2 to the main surface of the semiconductor substrate SB. At this time, since the threshold voltage of the memory cell MC2 in the flag region FR is higher than the threshold voltage of the memory cell MC1 in the extra region ER, it is considered that a film thickness difference is provided between the metal films WF2 and WF3 as follows. That is, for example, of the films constituting the metal film WF2, a TiAl film is formed with a thickness of 6 nm, a TiN film is formed with a thickness of 0.5 nm, and a TaN film is formed with a thickness of 1 nm. On the other hand, of the films constituting the metal film WF3, a TiAl film is formed with a thickness of 6 nm, a TiN film is formed with a thickness of 1 nm, and a TaN film is formed with a thickness of 1 nm. In this manner, by providing a difference in the film thickness of a part of the stacked films constituting the metal films WF2 and WF3, the threshold voltage of the memory cell can be set to a different value for each memory region.

Although it has been described that memory cells having different threshold voltage characteristics are formed in each of the extra region ER and the flag region FR, the threshold voltage of the memory cell of the MONOS memory can be similarly changed for each memory region in other regions, for example, in the code region CR or the data region DR shown in FIG. 1. In this case, in order to make the threshold voltage of the memory cells of the code region CR higher than the threshold voltage of the memory cells of the data region DR, the metal films of the code region CR and the data region DR have a film thickness difference as follows. That is, for example, in the direction from the memory gate electrode to the main surface of the semiconductor substrate SB, a TiAl film is formed to a thickness of 6 nm and a TaN film is formed to a thickness of 1 nm among the films constituting the metal film of the coding regions CRs. On the other hand, a TiAl film is formed to a thickness of 6 nm and a TaN film is formed to a thickness of 0.5 nm among the films constituting the metal film in the data region DR.

Although not shown, a titanium nitride film, for example, may be formed as a barrier film between the memory gate electrode and the metal film.

As a result, it is possible to prevent the deterioration of the characteristics of the memory cell, increase the number of rewrites, and increase the writing speed, so that the performance of the semiconductor device can be improved. In addition, the degree of freedom in design of the semiconductor device can be increased, and the reliability of the semiconductor device can be improved.

Further, in the present embodiment, by forming the insulating film IF6 covering the upper surface of the control gate electrode CG, it is possible to protect the control gate electrode CG when the memory gate electrodes MG1 and MG2 are separately formed.

Method of Manufacturing Semiconductor Device

Hereinafter, a method of manufacturing the semiconductor device of the present embodiment will be described with reference to FIGS. 7 to 36. FIGS. 7 to 36 are cross-sectional views during the formation process of the semiconductor device of the present embodiment. FIGS. 7 to 11 are diagrams showing cross sections along the Y direction. In FIGS. 12 to 36, similarly to FIG. 4, a cross section along the X direction (see FIG. 2) is shown, and a cross section along the Y direction is shown on the right side of the cross section. In FIGS. 7 to 28, only the manufacturing process in the extra region is described, but in FIGS. 29 to 36, the manufacturing process in the extra region and the flag region is described. The process described with reference to FIGS. 7 to 28 is common to the extra region and the flag region, except that the fins FA and FB to be formed have different signs. Although the side surface of each fin is shown perpendicularly in the drawing, the side surface of the fin may have a taper with respect to the main surface of the semiconductor substrate.

In this embodiment, each of the control gate electrode and the memory gate electrode of the memory cell of the split-gate type MONOS memory to be formed later is formed by replacing the dummy gate electrode with a metal gate electrode. That is, a gate last process, which is a manufacturing method of forming a control gate electrode and a memory gate electrode which are actually used as a gate electrode after forming a dummy gate electrode, a source/drain region, and the like, is used here.

However, the metal film constituting the metal gate electrode is formed under different conditions (composition or thickness) for each region, and the control gate electrode and the memory gate electrode are formed under different conditions. Therefore, each of the control gate electrode and the memory gate electrode is replaced with a metal gate electrode in separate processes. Here, the control gate electrode is formed as a metal gate electrode first, and then the memory gate electrode is formed as a metal gate electrode. That is, after the first dummy gate electrode is formed at the position where the control gate electrode is formed and the second dummy gate electrode is formed at the position where the memory gate electrode is formed, the first dummy gate electrode is replaced with the first metal gate electrode (control gate electrode), and then the second dummy gate electrode is replaced with the second metal gate electrode (memory gate electrode).

Figure 7:
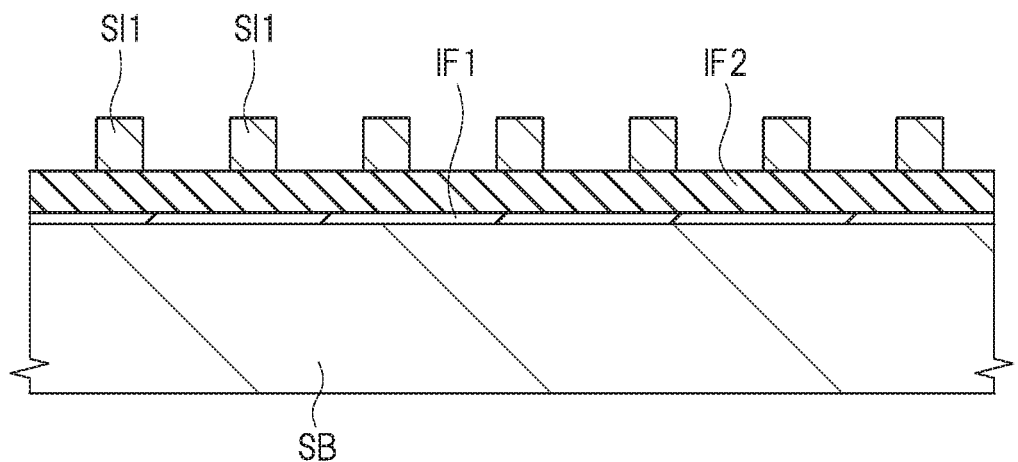
FIG. 7 is a cross-sectional view during the manufacturing process of a semiconductor device according to first embodiment of the present invention.

In the manufacturing process of the semiconductor device of this embodiment, first, as shown in FIG. 7, a semiconductor substrate SB is prepared, and an insulating film IF1, an insulating film IF2, and a semiconductor film SI1 are formed in this order on the main surface of the semiconductor substrate SB. The semiconductor substrate SB is made of, for example, p-type monocrystalline silicon having a resistivity of about 1 to 10 Ωcm. The insulating film IF1 is made of, for example, a silicon oxide film, and can be formed by, for example, an oxidation method or a CVD (Chemical Vapor Deposition) method. The thickness of the insulating film IF1 is about 2 to 10 nm. The insulating film IF2 is made of, for example, a silicon nitride film, and has a film thickness of about 20 to 100 nm. The insulating film IF2 is formed by, for example, a CVD method. The semiconductor film SI1 is made of, for example, a silicon film, and is formed by, for example, a CVD method. The thickness of the semiconductor film SI1 is, for example, 20 to 200 nm.

Subsequently, the semiconductor film SI1 is processed by using a photolithography and an etching. As a result, a plurality of patterns of the semiconductor films SI1 extending in the X direction are formed on the insulating film IF2 side by side in the Y direction. FIG. 7 is a cross-sectional view including the patterns of the plurality of semiconductor films SI1, and is a cross-sectional view along the lateral direction of each of the patterns of the plurality of semiconductor films SI1.

Figure 8:
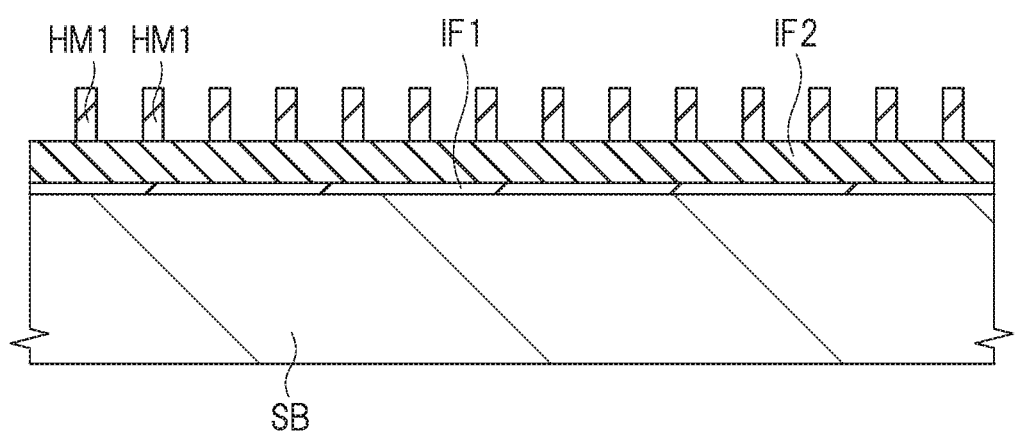
FIG. 8 is a cross-sectional view of a semiconductor device during a manufacturing process following FIG. 7.

Next, as shown in FIG. 8, a hard mask HM1 is formed to cover the side surfaces of the plurality of semiconductor films SI1. Here, for example, after a silicon oxide film having a thickness of 10 to 40 nm is formed on the semiconductor substrate SB by a CVD method, dry etching, which is anisotropic etching, is performed. Thus, the upper surfaces of the insulating film IF2 and the semiconductor film SI1 are exposed to form the hard mask HM1 of the silicon oxide film remaining on the side surface of the semiconductor film SI1. The hard mask HM1 does not completely fill the space between the adjacent semiconductor films SI1. The hard mask HM1 is formed in an annular shape so as to surround each semiconductor film SI1 in plan view.

Subsequently, the semiconductor film SI1 is removed by a wet etching method. Thereafter, part of the hard mask HM1 is removed by photolithography and etching. That is, the portion of the hard mask HM1 extending in the X direction is left, and the other portion, that is, the portion extending in the Y direction is removed. As a result, the hard mask HM1 does not have an annular structure, but only a pattern extending in the X direction. That is, on the insulating film IF2, a plurality of hard masks HM1, which are patterns extending in the X direction, are arranged side by side in the Y direction.

Figure 9:
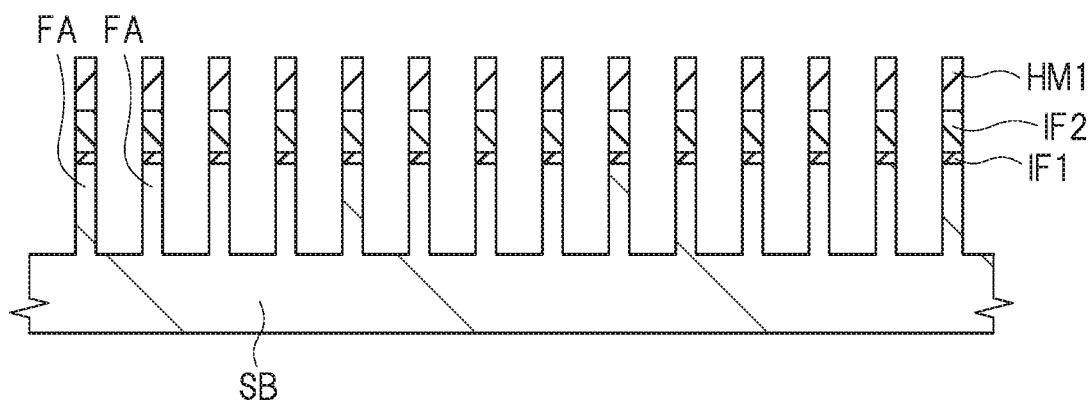
FIG. 9 is a cross-sectional view of a semiconductor device during a manufacturing process following FIG. 8.

Next, as shown in FIG. 9, anisotropic dry etching is performed on the insulating films IF2 and IF1 and the semiconductor substrate SB by using the hard mask HM1 as a mask. As a result, a pattern which is a part of the semiconductor substrate SB processed into a plate shape (wall shape), that is, a fin (protrusion) FA is formed immediately below the hard mask HM1. Here, by digging the main surface of the semiconductor substrate SB in the region exposed from the hard mask HM1 by 100 to 250 nm, a fin FA having a height of 100 to 250 nm from the main surface of the semiconductor substrate SB can be formed.

Figure 10:
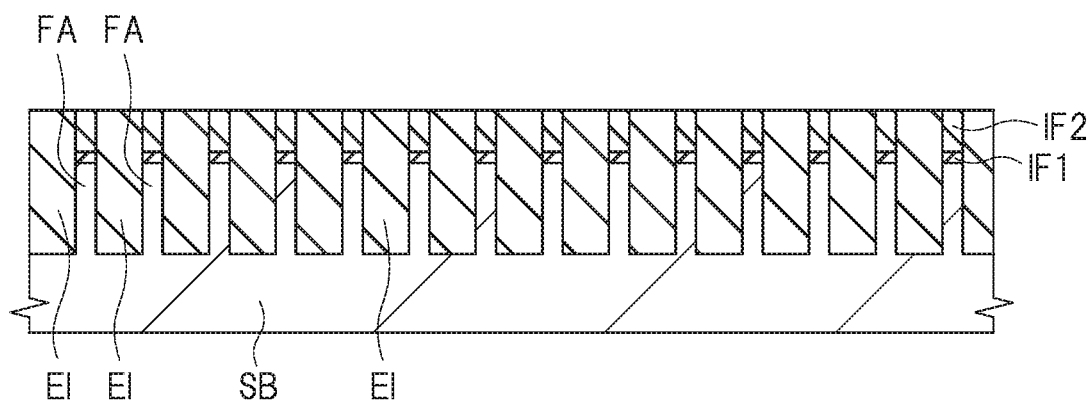
FIG. 10 is a cross-sectional view of a semiconductor device during a manufacturing process following FIG. 9.

Next, as shown in FIG. 10, an insulating film made of a silicon oxide film or the like is deposited on the semiconductor substrate SB so as to completely fill the fin FA, the insulating films IF1 and IF2. Subsequently, the insulating film is polished by the Chemical Mechanical Polishing method to expose the upper surface of the insulating film IF2. Thus, an element isolation film EI made of the insulating film is formed. The hard mask HM1 is removed by the CMP process. Note that the hard mask HM1 may be removed before the insulating film forming the element isolation film EI is formed.

Figure 11:
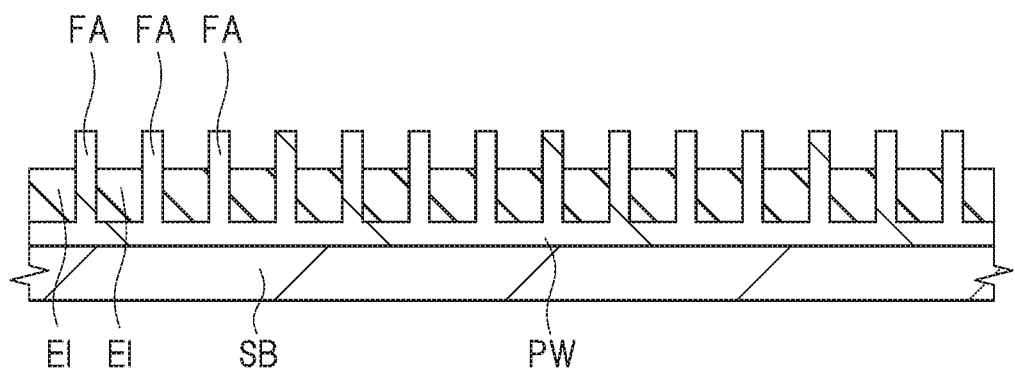
FIG. 11 is a cross-sectional view of a semiconductor device during a manufacturing process following FIG. 10.

Next, as shown in FIG. 11, the insulating films IF1 and IF2 are removed. Thereafter, an etching process is performed on the upper surface of the element isolation film EI, whereby the upper surface of the element isolation film EI is caused to recede in a direction perpendicular to the main surface of the semiconductor substrate SB. As a result, a part of the side surface and the upper surface of each of the fins FA are exposed.

Subsequently, an impurity is introduced into the main surface of the semiconductor substrate SB by ion implantation to form a p-type well PW in the fin FA. The p-type well PW is formed by implanting a p-type impurity (e.g., B (boron)). The p-type well PW is formed to extend over the entire inside of the fin FA and a part of the semiconductor substrate SB under the fin FA.

Figure 12:
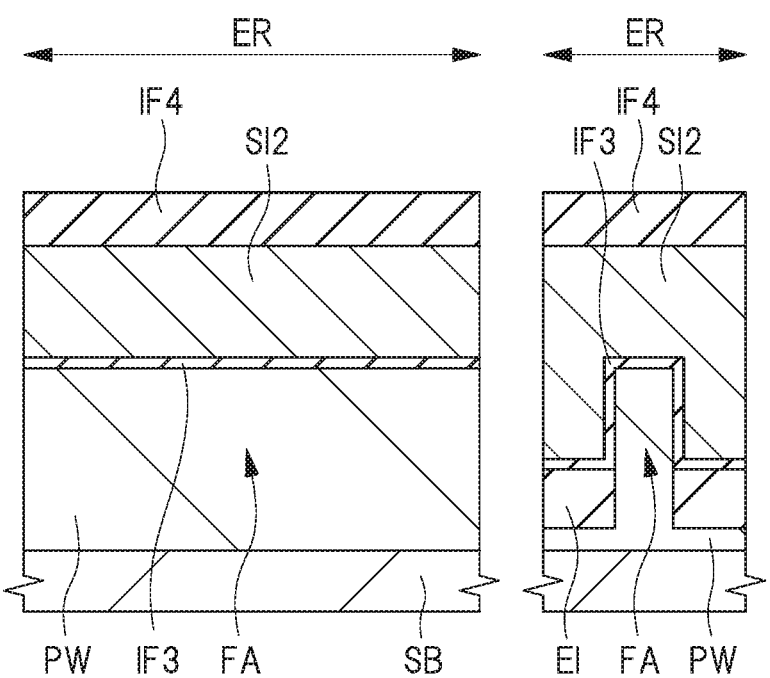
FIG. 12 is a cross-sectional view of a semiconductor device during a manufacturing process following FIG. 11.

Next, as shown in FIG. 12, an insulating film IF3 is formed to cover the upper surface and the side surface of each of the plurality of fins FA. The insulating film IF3 can be formed by, for example, a thermal oxidation method, and is made of, for example, a silicon oxide film having a thickness of about 2 nm. Although the insulating film IF3 may or may not cover the upper surface of the element isolation film EI, FIG. 12 shows the insulating film IF3 covering the upper surface of the element isolation film EI. Subsequently, after a semiconductor film SI2 having a thickness equal to or greater than the height of each fin FA is deposited on the insulating film IF3 by a CVD method or the like, the upper surface of the semiconductor film SI2 is flattened by a CMP method or the like, thereby forming a semiconductor film SI2 having a flat upper surface. The thickness of the semiconductor film SI2 whose upper surface is flattened and immediately above the fin FA is, for example, 80 to 100 nm.

Thereafter, an insulating film IF4 is formed on the semiconductor film SI2 by, e.g., CVD. The semiconductor film SI2 is made of, for example, a polysilicon film, and the insulating film IF4 is made of, for example, a silicon nitride film. Even after the semiconductor film SI2 is polished by the CMP method as described above, the semiconductor film SI2 remains on the upper surface of the fin FA. The thickness of the insulating film IF4 is, for example, 60 to 90 nm.

Figure 13:
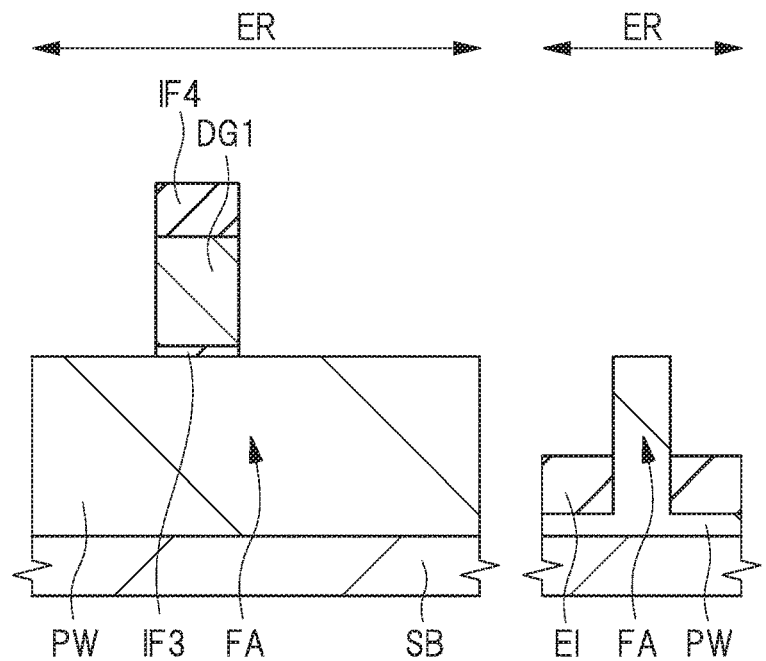
FIG. 13 is a cross-sectional view of a semiconductor device during a manufacturing process following FIG. 12.

Next, as shown in FIG. 13, a photoresist film (not shown) covering a part of the fin FA is formed. The photoresist film includes a resist pattern extending in the Y direction formed to cover a portion of each of the plurality of fins FA arranged in the Y direction (the depth direction of FIG. 13). In the region beside the resist pattern, the upper surface of the fin FA is exposed from the photoresist film.

Subsequently, etching is performed by using the photoresist film as a mask to remove portions of the insulating film IF4 and the semiconductor film SI2, thereby exposing the upper surface of the element isolation film EI and the surface of the insulating film IF3. That is, a part of the upper surface and a part of the side surface of the fin FA are exposed from the insulating film IF4 and the semiconductor film SI2. As a result, the dummy gate electrode DG1 formed of the semiconductor film SI2 is formed on the fin FA. The dummy gate electrode DG1 is a pseudo gate electrode (gate pattern) to be removed later and replaced with a control gate electrode.

Although the case where the insulating film IF3 covering the surface of the fin FA exposed from the dummy gate electrode DG1 is removed by the above-described etching and the cleaning process performed thereafter will be described here, the upper surface and the side surface of the fin FA may remain covered with the insulating film IF3.

Figure 14:
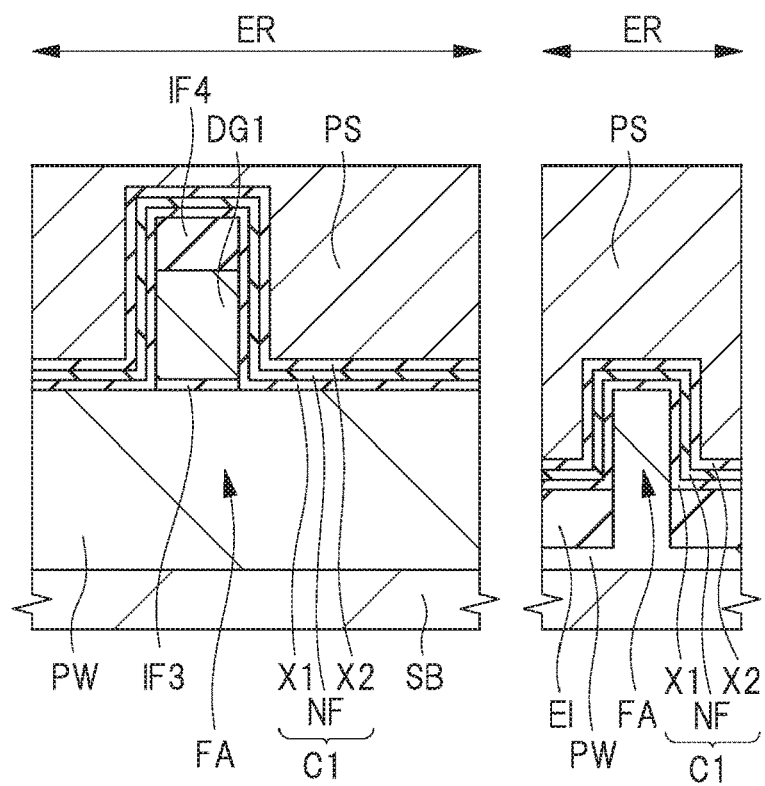
FIG. 14 is a cross-sectional view of a semiconductor device during a manufacturing process following FIG. 13.

Next, as shown in FIG. 14, a silicon oxide film (bottom oxide film) X1, a silicon nitride film NF, and a silicon oxide film (top oxide film) X2 are formed in this order on a semiconductor substrate SB, thereby forming an ONO film C1 having a stacked structure comprised of a silicon oxide film X1, a silicon nitride film NF, and a silicon oxide film X2. That is, the ONO film C1 is a laminated insulating film. The silicon oxide film X1 can be formed by an oxidation method, a CVD method, or the like. The silicon nitride film NF and the silicon oxide film X2 are formed (deposited) by, for example, a CVD method. The thickness of the silicon oxide film X1 is, for example, 4 nm, the thickness of the silicon nitride film NF is, for example, 7 nm, and the thickness of the silicon oxide film X2 is, for example, 9 nm.

The ONO film C1 covers the upper surface of the element isolation film EI and the upper surface and the side surface of the fin FA. The ONO film C1 covers the upper surface and the side surface of the stacked pattern comprised of the dummy gate electrode DG1 and the insulating film IF4. The silicon nitride film NF is a film functioning as a charge storage portion (charge storage film) of a memory cell to be formed later.

Subsequently, a polysilicon film PS is formed on the ONO film C1. The thickness of the polysilicon film PS is, for example, 200 nm. Thereafter, the upper surface of the polysilicon film PS is flattened by, e.g., CMP. However, in the planarization step, the ONO film C1 is not exposed from the polysilicon film PS. At this time, the ONO film C1 and the polysilicon film PS completely fill the region between the fins FA adjacent to each other in the Y direction, that is, the opening immediately above the element isolation film EI. The polysilicon film PS can be formed by, for example, a CVD method.

Figure 15:
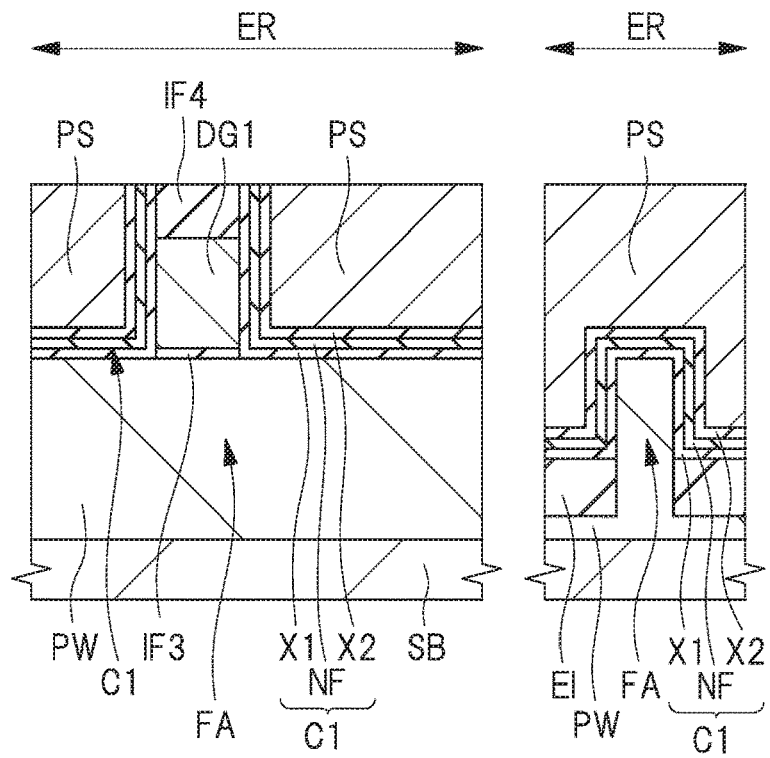
FIG. 15 is a cross-sectional view of a semiconductor device during a manufacturing process following FIG. 14.

Next, as shown in FIG. 15, the upper surfaces of the ONO film C1 and the polysilicon film PS are polished by, e.g., CMP, thereby exposing the upper surface of the insulating film IF4. However, the dummy gate electrode DG1 is not exposed from the insulating film IF4, the ONO film C1, and the polysilicon film PS.

Figure 16:
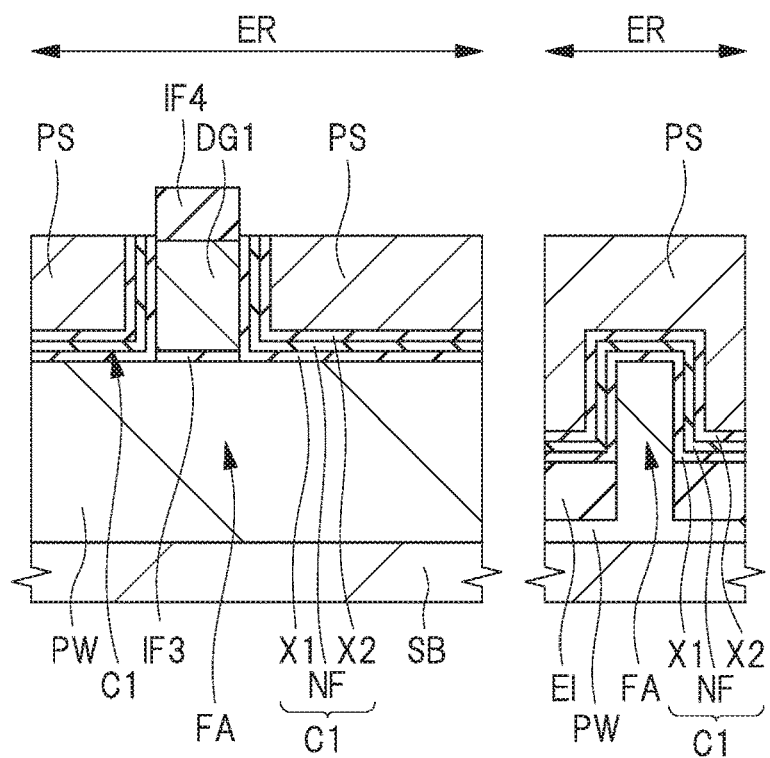
FIG. 16 is a cross-sectional view of a semiconductor device during a manufacturing process following FIG. 15.

Next, as shown in FIG. 16, by performing an etch-back process, the upper surfaces of the ONO film C1 and the polysilicon film PS are retracted to expose a part of the side surface of the insulating film IF4. After this etch-back is performed, the positions of the upper surfaces of the ONO film C1 and the polysilicon film PS are located, for example, above the upper surface of the dummy gate electrode DG1 and lower than the upper surface of the insulating film IF4. Here, the upper surfaces of the ONO film C1 and the polysilicon film PS are located at the same height and substantially the same surface. As a result, the upper surface of the insulating film IF4 and a part of the side surface of the insulating film IF4 are exposed from the ONO film C1 and the polysilicon film PS.

However, the dummy gate electrode DG1 is not exposed from the insulating film IF4, the ONO film C1, and the polysilicon film PS. In other words, the entire side surface of the dummy gate electrode DG1 is covered with the ONO film C1 and the polysilicon film PS. Here, the dummy gate electrode DG1 is not exposed in order to prevent the dummy gate electrode DG1 from being oxidized in an oxidation step described later with reference to FIG. 17. To prevent exposure of the dummy gate electrode DG1, the etch back process is stopped when the top surfaces of each of the ONO film C1 and the polysilicon film PS are retracted from the top surface of the dummy gate electrode DG1, e.g., at 5 nm. This prevents the upper surfaces of the ONO film C1 and the polysilicon film PS from further receding and exposing the dummy gate electrode DG1.

Figure 17:
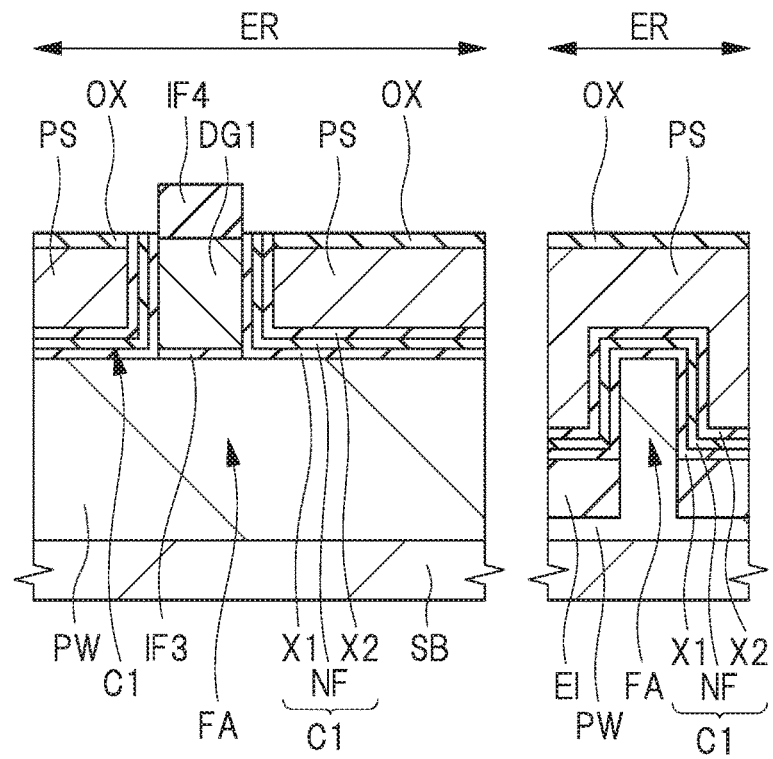
FIG. 17 is a cross-sectional view of a semiconductor device during a manufacturing process following FIG. 16.

Next, as shown in FIG. 17, the upper surface of the polysilicon film PS is oxidized by performing an oxidation process by a dry oxidation method. Thus, a silicon oxide film OX covering the upper surface of the polysilicon film PS is formed. Here, the surfaces of the insulating films made of the silicon nitride film, for example, the silicon nitride film NF and the insulating film IF4, are not oxidized. Therefore, the silicon oxide film OX is not formed on the upper surfaces of the silicon nitride film NF and the insulating film IF4.

The silicon oxide film OX is formed to erode the upper portion of the polysilicon film PS by, for example, a thermal oxidation process, and the bottom surface of the silicon oxide film OX reaches a position lower than the top surface of the dummy gate electrode DG1. That is, the upper surface of the polysilicon film PS is oxidized to a position lower than the upper surface of the dummy gate electrode DG1. Therefore, the silicon oxide film OX is formed from a position lower than the upper surface of the dummy gate electrode DG1 to a position higher than the upper surface of the dummy gate electrode DG1.

The reason why the silicon oxide film OX is formed so as to reach a position lower than the upper surface of the dummy gate electrode DG1 is to prevent the dummy gate electrode DG2 made of the polysilicon film PS from being exposed when the insulating film IF4 is deleted in the etching process described later with reference to FIG. 25. Thus, the dummy gate electrode DG1 can be removed while leaving the dummy gate electrode DG2 protected by the silicon oxide film OX in a step described later with reference to FIG. 26.

Figure 18:
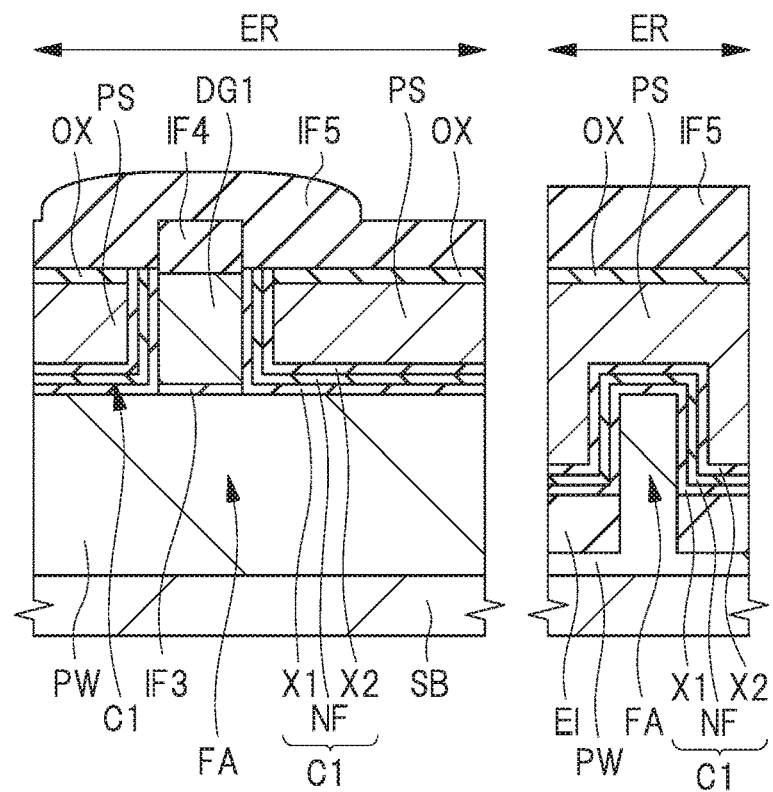
FIG. 18 is a cross-sectional view of a semiconductor device during a manufacturing process following FIG. 17.

Next, as shown in FIG. 18, an insulating film IF5 is formed on the semiconductor substrate SB by, e.g., CVD. The insulating film IF5 is made of, for example, a silicon nitride film. The insulating film IF5 covers the side surface and the upper surface of the insulating film IF4, the upper surface of the ONO film C1, and the upper surface of the silicon oxide film OX.

Figure 19:
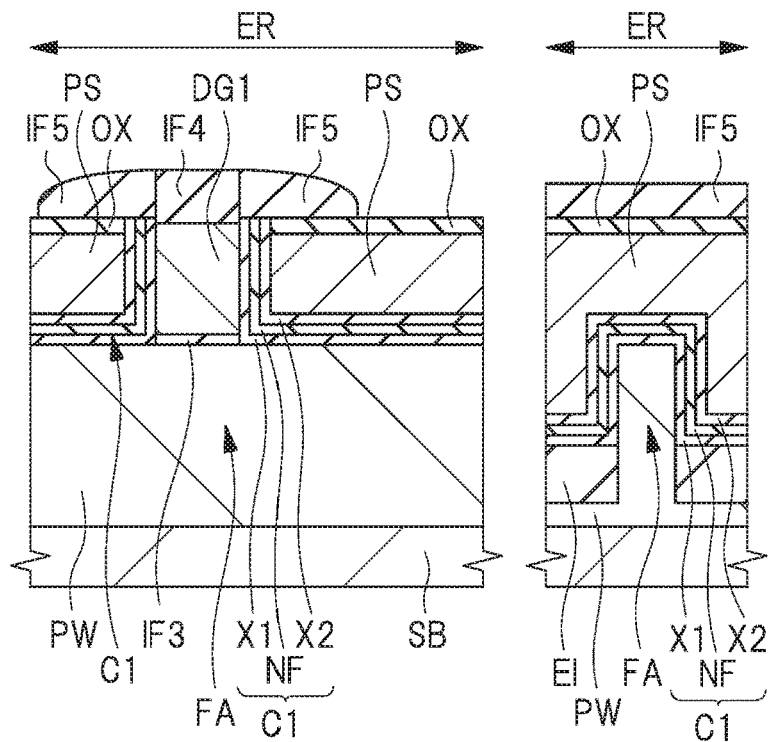
FIG. 19 is a cross-sectional view of a semiconductor device during a manufacturing process following FIG. 18.

Next, as shown in FIG. 19, dry etching is performed to remove a part of the insulating film IF5, thereby exposing the upper surface of the insulating film IF4 and a part of the upper surface of the polysilicon film PS. That is, the insulating film IF5 remains in the shape of a sidewall spacer on the side surface of the insulating film IF4. The lower surface of the sidewall spacer-shaped insulating film IF5 covers the upper surfaces of the ONO film C1 and the silicon oxide film OX.

Figure 20:
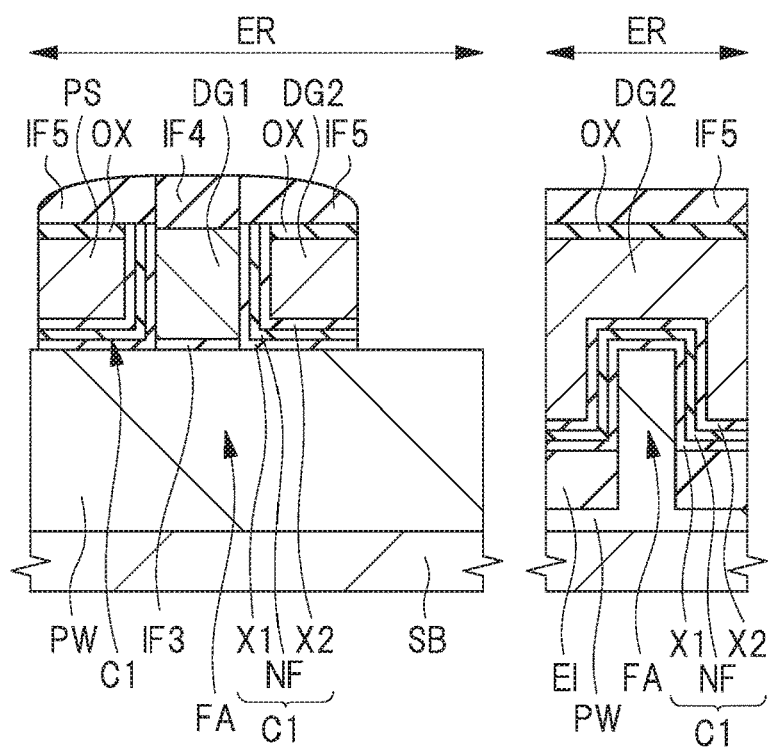
FIG. 20 is a cross-sectional view of a semiconductor device during a manufacturing process following FIG. 19.

Next, as shown in FIG. 20, the ONO film C1 and the polysilicon film PS are processed by performing etching by using the insulating films IF4 and IF5 as masks. As a result, the ONO film C1 and the polysilicon film PS remain in the regions adjacent to the side surfaces on both sides of the dummy gate electrode DG1. In addition, the upper surfaces of the fins FA are exposed from the ONO film C1 and the polysilicon film PS in regions other than regions adjacent to the side surfaces on both sides of the dummy gate electrode DG1.

The polysilicon film PS adjacent to one side surface of the dummy gate electrode DG1 in the gate length direction (X direction) via the ONO film C1 constitutes the dummy gate electrode DG2. The dummy gate electrode DG2 extends in the Y direction so as to stride the plurality of fins FA in parallel with the dummy gate electrode DG1. The dummy gate electrode DG2 is a pseudo gate electrode (gate pattern) to be removed later and replaced with a memory gate electrode.

Figure 21:
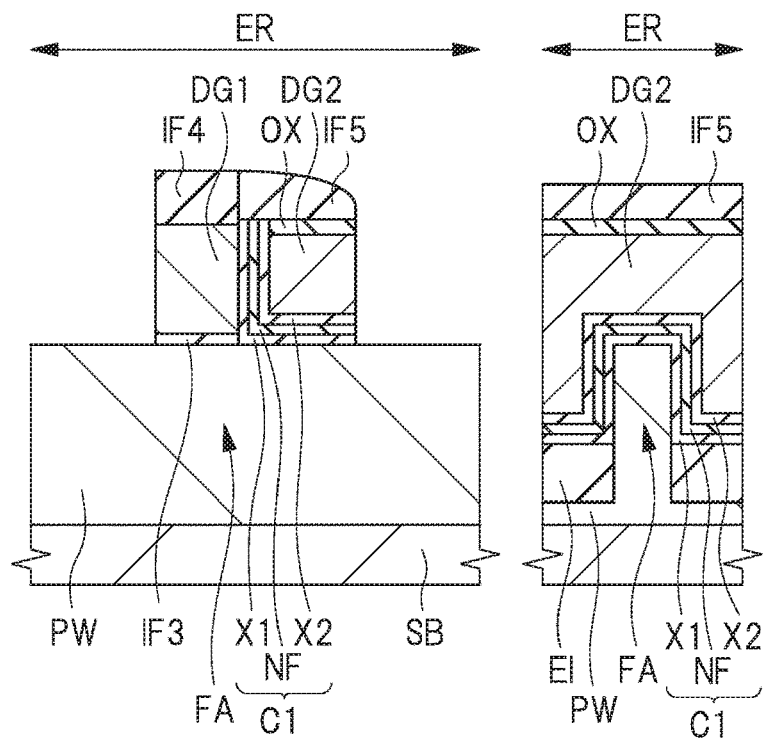
FIG. 21 is a cross-sectional view of a semiconductor device during a manufacturing process following FIG. 20.

Next, as shown in FIG. 21, a resist pattern (not shown) is formed over the dummy gate electrode DG2 and the insulating film IF5 immediately above it, and then the resist pattern is etched by using the resist pattern as a mask to remove the insulating film IF5, the ONO film C1, and the polysilicon film PS exposed from the resist pattern. As a result, the dummy gate electrode DG2 remains on one side surface of the dummy gate electrode DG1 via the ONO film C1 in the gate length direction, and the other side surface of the dummy gate electrode DG1 is exposed.

Figure 22:
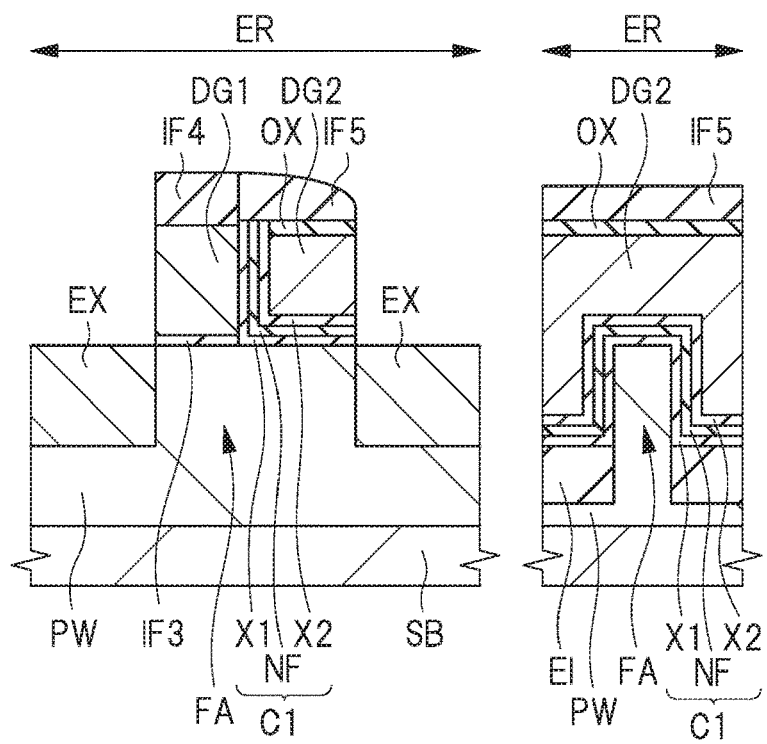
FIG. 22 is a cross-sectional view of a semiconductor device during a manufacturing process following FIG. 21.

Next, as shown in FIG. 22, ions are implanted into the upper surface of the fin FA by using the insulating films IF4 and IF5 and the dummy gate electrode DG1 as a mask. As a result, a pair of extension regions EX, which are n-type semiconductor regions, are formed on the upper surface and the side surface of the fin FA. The extension region EX can be formed by implanting an n-type impurity (for example, As (arsenic)) into the fin FA.

Figure 23:
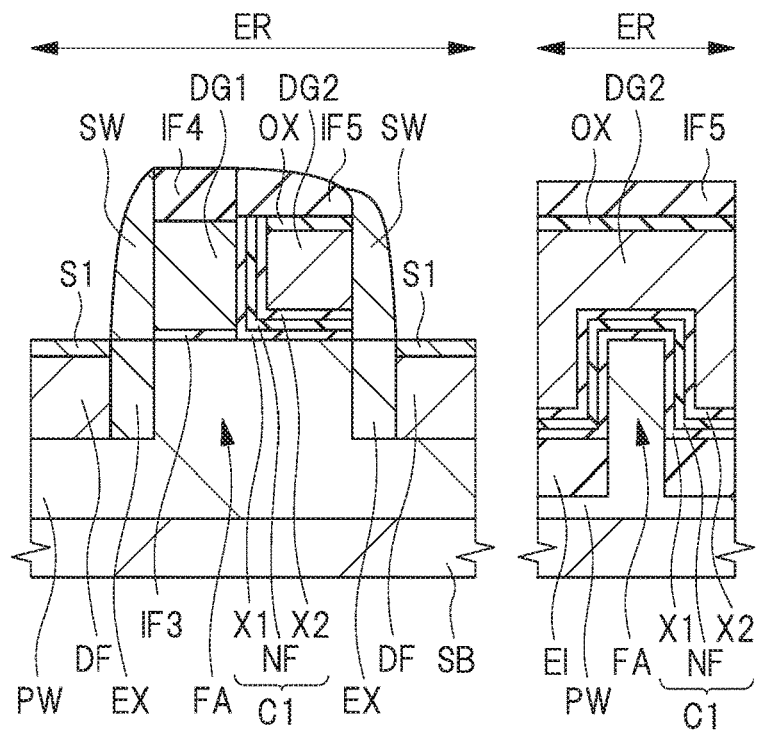
FIG. 23 is a cross-sectional view of a semiconductor device during a manufacturing process following FIG. 22.

Next, as shown in FIG. 23, an insulating film is formed on the semiconductor substrate SB by, e.g., CVD. The insulating film is mainly made of, for example, a silicon nitride film. The insulating film covers the surfaces of the element isolation film EI, the fin FA, the dummy gate electrode DG1, the dummy gate electrode DG2, the silicon oxide film OX, and the insulating films IF4 and IF5.

Subsequently, dry etching is performed to remove a part of the insulating film, thereby exposing the respective upper surfaces of the element isolation film EI, the fin FA, and the insulating films IF4 and IF5. As a result, a sidewall spacer SW made of the insulating film is formed on the side surface of the pattern including the dummy gate electrode DG1, the dummy gate electrode DG2, the silicon oxide film OX, and the insulating films IF4 and IF5.

Subsequently, ions are implanted into the upper surface of the fin FA using the insulating films IF4 and IF5, the dummy gate electrode DG1, and the sidewall spacers SW as masks. Here, by implanting an n-type impurity (e.g., P (phosphorus) or As (arsenic)), a pair of diffusion regions DF, which are n-type semiconductor regions, are formed on the upper surface and the side surfaces of the fin FA. In the step of forming the diffusion region DF, ion implantation is performed at an impurity concentration higher than that in the ion implantation step of forming the extension region EX. Thereafter, heat treatment (activation annealing) is performed to diffuse impurities and the like in the semiconductor substrate SB. As a result, impurities included in the diffusion region DF, the extension region EX, and the like are thermally diffused.

The diffusion region DF and the extension region EX constitute source/drain regions. That is, each of the source region and the drain region has an extension region EX and a diffusion region DF which are in contact with each other. The source/drain regions are formed on the upper surface and side surfaces of the fin FA exposed from the pattern including the dummy gate electrodes DG1 and DG2, that is, on the surface of the fin FA. The surface of the fin FA referred to herein includes the upper surface and the side surface of the fin FA.

Subsequently, silicide layers S1 covering the source/drain regions are formed by using well-known Salicide:Self Align silicide processes. Here, first, a metal film covering the fin FA is formed. The metal film is made of, for example, a NiPt film deposited by a sputtering method. Thereafter, heat treatment is performed on the semiconductor substrate SB to cause the surface of the fin FA to react with the metal film. Thereby, silicide layers S1 made of a NiSi film covering the upper surface and the side surfaces of the diffusion regions DF are formed. Thereafter, the unreacted metal film is removed by a chemical solution.

Figure 24:
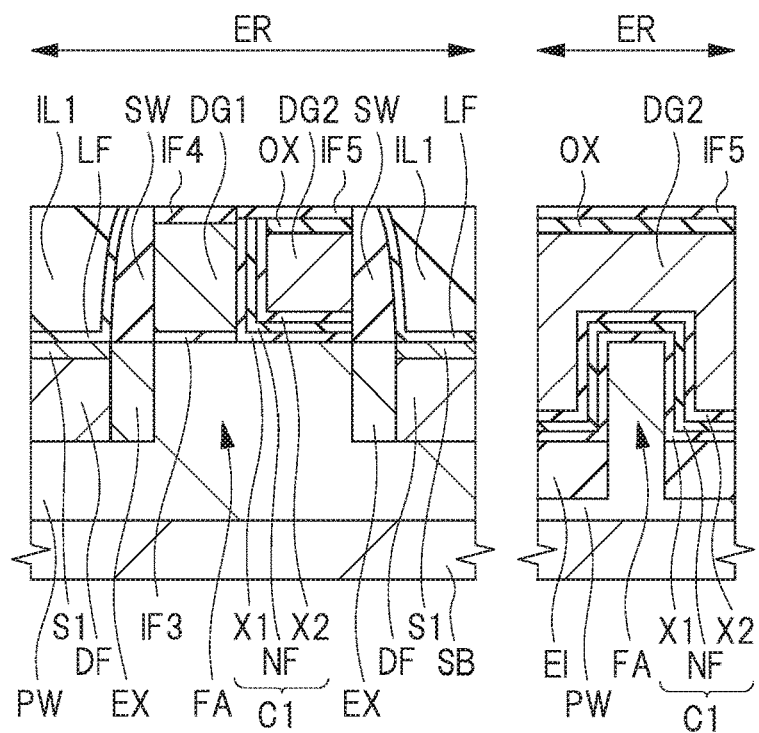
FIG. 24 is a cross-sectional view of a semiconductor device during a manufacturing process following FIG. 23.

Next, as shown in FIG. 24, a liner insulating film LF made of, for example, a silicon nitride film and an interlayer insulating film IL1 made of a silicon oxide film are sequentially formed on the main surface of the semiconductor substrate SB. The liner insulating film LF and the interlayer insulating film IL1 can be formed by, for example, a CVD method. The interlayer insulating film IL1 has a film thickness larger than the total height of the height of the fin FA on the element isolation film EI and the height of the stacked body comprised of the insulating film IF3, the dummy gate electrode DG1, and the insulating film IF4. Thereafter, the upper surface of the interlayer insulating film IL1 is flattened by, e.g., CMP.

In this planarization step, each of the insulating films IF4 and IF5 is partially removed, and the upper surfaces of the dummy gate electrodes DG1 and DG2 and the silicon oxide film OX are not exposed. That is, even after the planarization step is performed, the upper surface of the dummy gate electrode DG1 remains covered with the insulating film IF4, and the upper surfaces of the ONO film C1, the dummy gate electrode DG2, and the silicon oxide film OX remain covered with the insulating film IF5.

Figure 25:
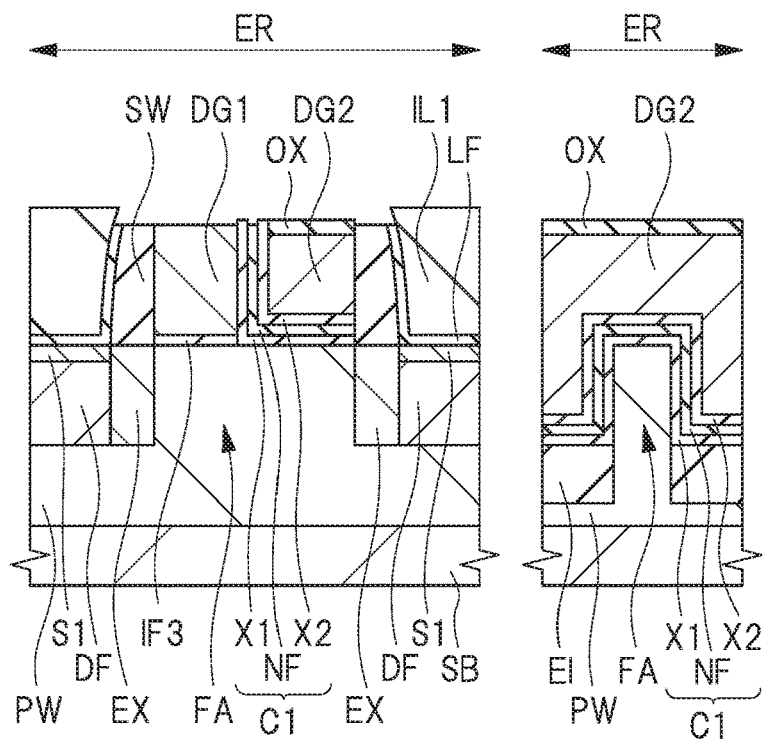
FIG. 25 is a cross-sectional view of a semiconductor device during a manufacturing process following FIG. 24.

Next, as shown in FIG. 25, for example, etching is performed to remove the insulating films IF4 and IF5, thereby exposing the upper surface of the dummy gate electrode DG1 and the silicon oxide film OX. In this step, the silicon nitride film is selectively removed by etching back under a condition having a selectivity to silicon oxide. That is, the etching process is performed using the silicon oxide film OX as a mask for preventing etching. As a result, each of the insulating films IF4 and IF5 made of the silicon nitride film is removed, and a part of the sidewall spacer SW including the silicon nitride film and a part of the liner insulating film LF made of the silicon nitride film are removed.

However, even if the sidewall spacer SW is partially removed, the dummy gate electrode DG2 is not exposed. That is, by this etching step, the upper surface of the sidewall spacer SW is retracted to a position below the upper surface of the silicon oxide film OX and above the lower surface of the silicon oxide film OX. Similarly, the upper surfaces of the silicon nitride film NF and the liner insulating film LF are lower than the upper surface of the silicon oxide film OX and retreat to a position above the lower surface of the silicon oxide film OX. The upper surface of the dummy gate electrode DG1 is located above the height of the lower surface of the silicon oxide film OX, that is, the height of the upper surface of the dummy gate electrode DG2. The dummy gate electrode DG2 is covered with a silicon oxide film OX, a sidewall spacer SW, and an ONO film C1. Here, in the etching process described later with reference to FIG. 26, the dummy gate electrode DG2 is left and is not exposed in order to remove the dummy gate electrode DG1.

Figure 26:
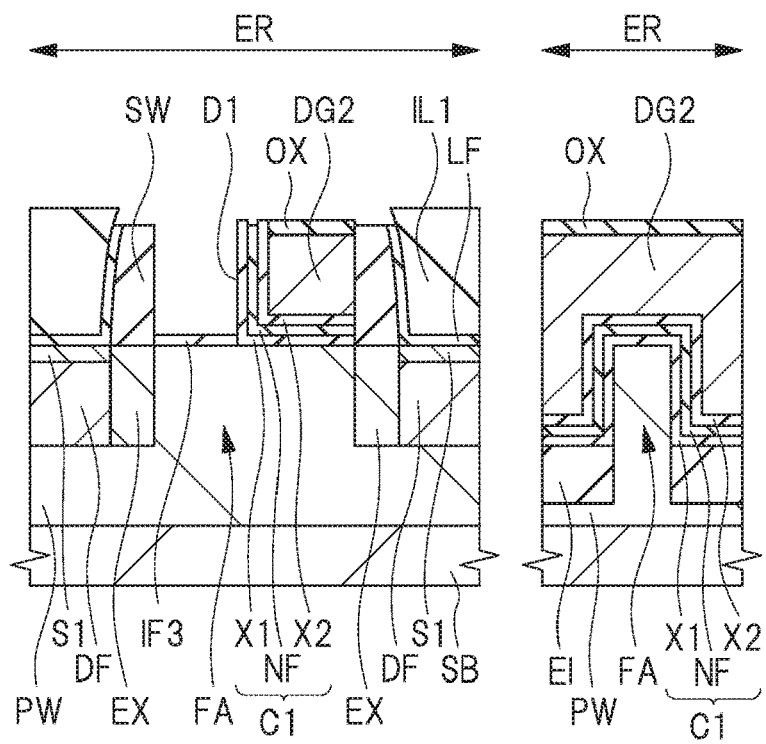
FIG. 26 is a cross-sectional view of a semiconductor device during a manufacturing process following FIG. 25.

Next, as shown in FIG. 26, for example, wet etching is performed to remove the dummy gate electrode DG1 made of the polysilicon film. As a result, the opening D1 is formed in the region where the dummy gate electrode DG1 is removed and immediately above the insulating film IF3. One side surface of the opening D1 is formed by the sidewall spacer SW, the other side surface is formed by the silicon oxide film X1, and the bottom surface is formed by the insulating film IF3. Here, in order to replace the dummy gate electrode DG1 with a metal gate electrode made of a metal film, the dummy gate electrode DG1 is removed.

Although the silicon film is selectively removed in the etching step, the dummy gate electrode DG2 is not removed because it is covered with the silicon oxide film OX, the ONO film C1, and the sidewall spacer SW. That is, in the oxidation process described with reference to FIG. 17, a silicon oxide film is not formed on the upper surface of the dummy gate electrode DG1 covered with the insulating film IF4 made of a silicon nitride film, and the upper surface of the polysilicon film PS making up the dummy gate electrode DG2 is later protected by the silicon oxide film OX. Thereafter, in the etch-back process described with reference to FIG. 25, the insulating film IF4 made of the silicon nitride film is selectively removed to expose the dummy gate electrode DG1, but the dummy gate electrode DG2 is not removed because it is protected by the silicon oxide film OX. As a result, in the etching process described with reference to FIG. 26, the dummy gate electrode DG1 can be removed while leaving the dummy gate electrode DG2 protected by the silicon oxide film OX.

Figure 27:
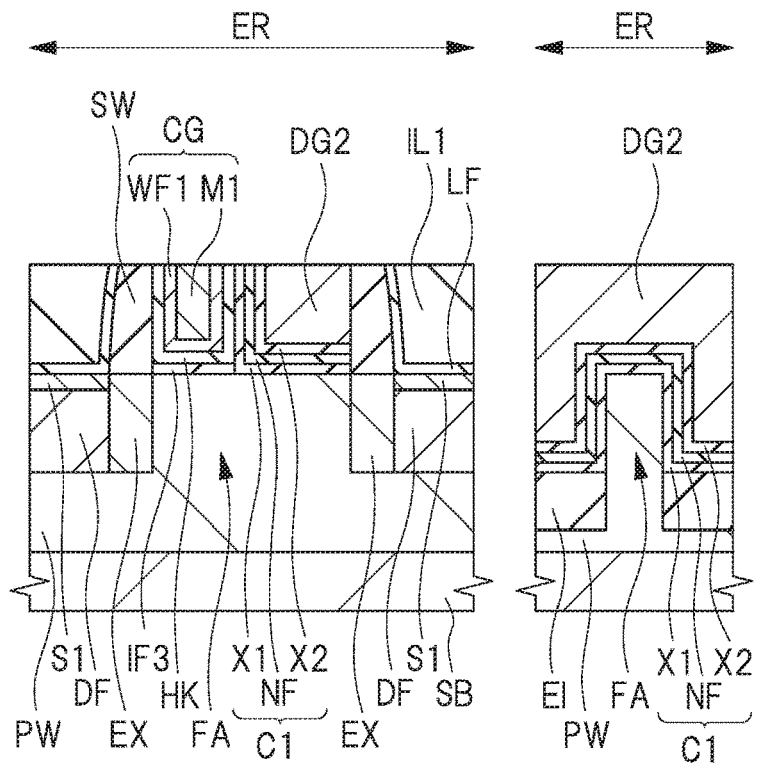
FIG. 27 is a cross-sectional view of a semiconductor device during a manufacturing process following FIG. 26.

Next, as shown in FIG. 27, a control gate electrode CG is formed in the opening D1 (see FIG. 26). That is, first, the high dielectric constant film HK, the metal film WF1, and the metal film M1 are formed in this order on the interlayer insulating film IL1 including the inside of the opening D1, so that the inside of the opening D1 is completely filled with the high dielectric constant film HK, the metal film WF1, and the metal film M1. The high dielectric constant film HK, the metal film WF1, and the metal film M1 can be formed by a sputtering method such as a PVD (Physical Vapor Deposition) method, for example. Next, the extra high dielectric constant film HK, the metal film WF1, and the metal film M1 on the interlayer insulating film IL1 are removed by, e.g., CMP, to expose the upper surface of the interlayer insulating film IL1. As a result, the high dielectric constant film HK, the metal film WF1, and the metal film M1 are left in the opening D1. In this removing step (polishing step) using a CMP method or the like, a part including the upper surfaces of the interlayer insulating film IL1, the liner insulating film LF, and the sidewall spacer SW is removed, and the silicon oxide film OX is further removed. Thus, the upper surface of the dummy gate electrode DG2 covered with the silicon oxide film OX is exposed.

The insulating film IF3 and the high dielectric constant film HK constitute a gate insulating film. The metal films WF1 and M1 constitute a control gate electrode CG. The control gate electrode CG and the source/drain regions constitute a control transistor. The control transistor is a FinFET having the surfaces of the fins FA as channels. The surface of the fin FA referred to herein includes the upper surface and the side surface of the fin FA.

The metal film WF1 is a work function film provided for adjusting the threshold voltage of the control transistor, and continuously covers the bottom surface and the side surface of the metal film M1. The high dielectric constant film HK continuously covers the bottom surface and the side surface of the metal film WF1. That is, each of the metal film WF1 and the high dielectric constant film HK has a U-shaped cross section.

Figure 28:
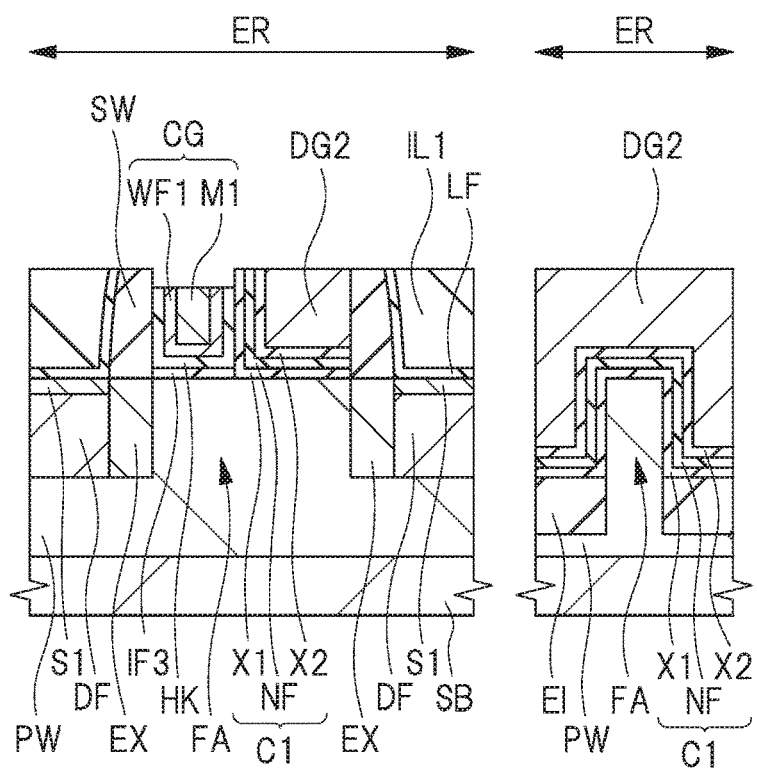
FIG. 28 is a cross-sectional view of a semiconductor device during a manufacturing process following FIG. 27.

Next, as shown in FIG. 28, the upper surfaces of the metal films M1 and WF1 and the high dielectric constant film HK are etched back by using chlorine gas ($Cl_2$). That is, metal etching for selectively etching back the metal film is mainly performed here. By the etching, openings are formed directly on the upper surfaces of the metal films M1, WF1 and the high dielectric constant film HK. This reduces the height of the upper surfaces of the interlayer insulator film IL1, liner insulator film LF, sidewall spacer SW, ONO film C1, and dummy gate electrode DG2, respectively.

Figure 29:
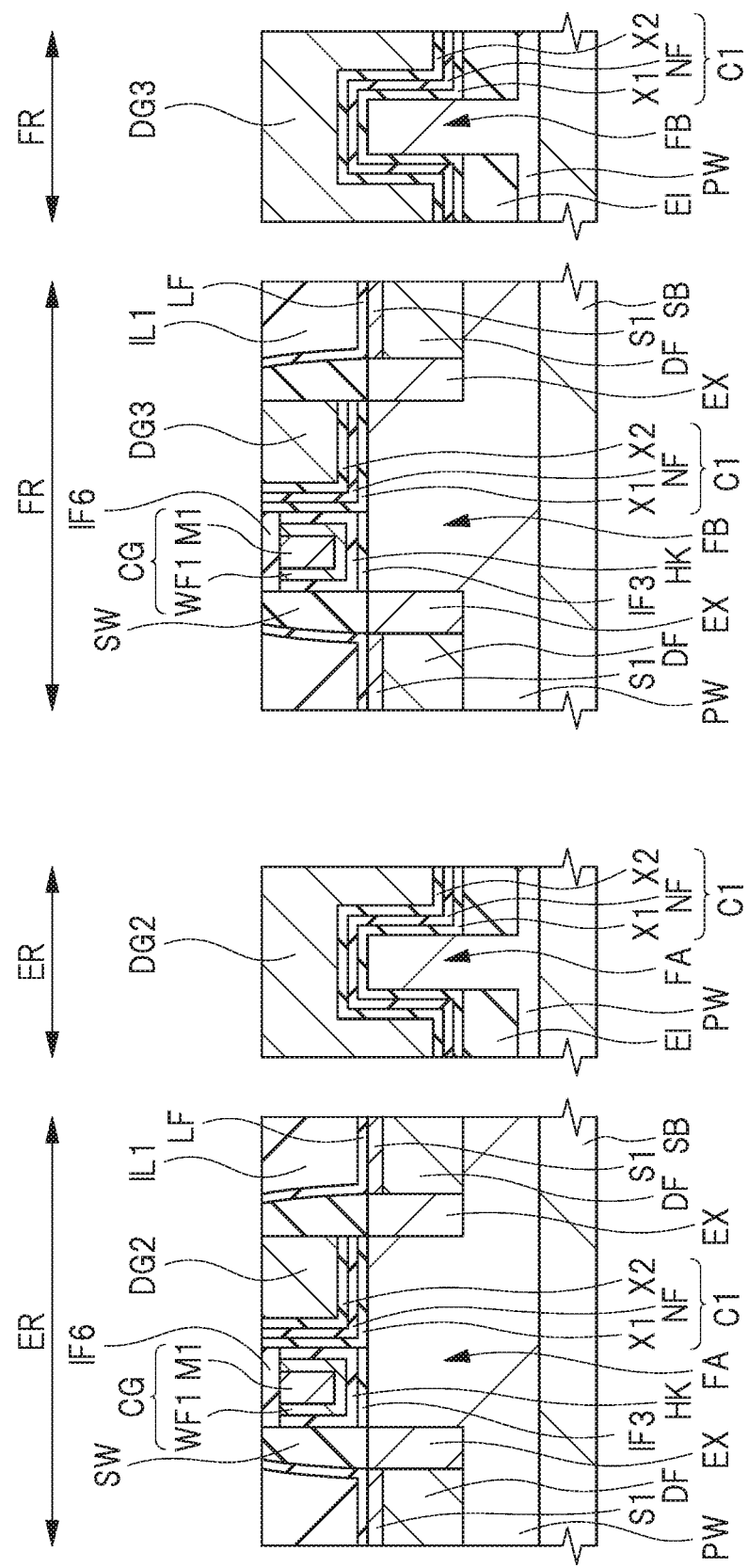
FIG. 29 is a cross-sectional view during the manufacturing process of a semiconductor device following FIG. 28.

Next, as shown in FIG. 29, an insulating film IF6 is formed (deposited) on the semiconductor substrate SB by, e.g., CVD. The insulating film IF6 is made of, for example, a silicon nitride film, and is formed so as to completely fill the openings formed immediately above the upper surfaces of the metal films M1, WF1 and the high dielectric constant film HK. Subsequently, a polishing process is performed by using, for example, a CMP method, whereby the excess insulating film IF6 is removed. As a result, the insulating film IF6 remains in the opening above the upper surfaces of the metal films M1, WF1 and the high dielectric constant film HK, and the upper surfaces of the interlayer insulating film IL1, the liner insulating film LF, the sidewall spacers SW, the ONO film C1 and the dummy gate electrode DG2 are exposed from the insulating film IF6.

Thus, the structure shown in FIG. 29 is obtained. In FIG. 29, in addition to the memory cells in the formation process in the extra region ER, the memory cells in the formation process in the flag region FR are also shown. Immediately after the process described with reference to FIG. 29 is performed, there is no difference in the structures formed in the extra region ER and the flag region FR. A fin FB is formed in the extra region ER, and a dummy gate electrode DG3 corresponding to the dummy gate electrode DG2 is formed on the fin FB.

Figure 30:
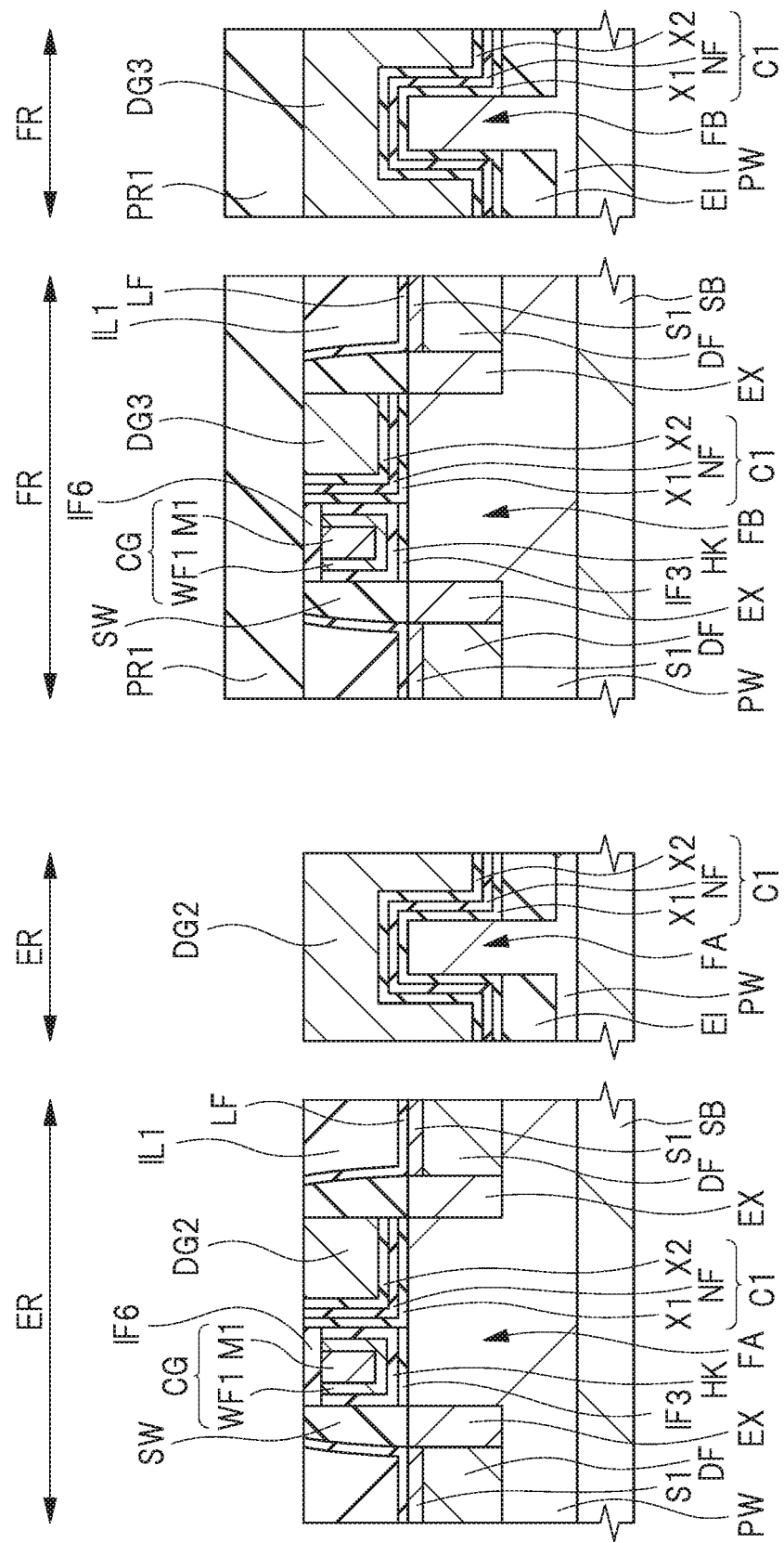
FIG. 30 is a cross-sectional view during the manufacturing process of a semiconductor device following FIG. 29.

Next, as shown in FIG. 30, a photoresist film PR1 covering the main surface of the semiconductor substrate SB in the flag region FR is formed. The photoresist film PR1 is a resist pattern that exposes the main surface of the semiconductor substrate SB in the extra region ER. That is, at least the insulating film IF6 and the dummy gate electrode DG2 in the extra region ER are exposed from the photoresist film PR1, and the insulating film IF6 and the dummy gate electrode DG3 in the flag region FR are covered with the photoresist film PR1.

Figure 31:
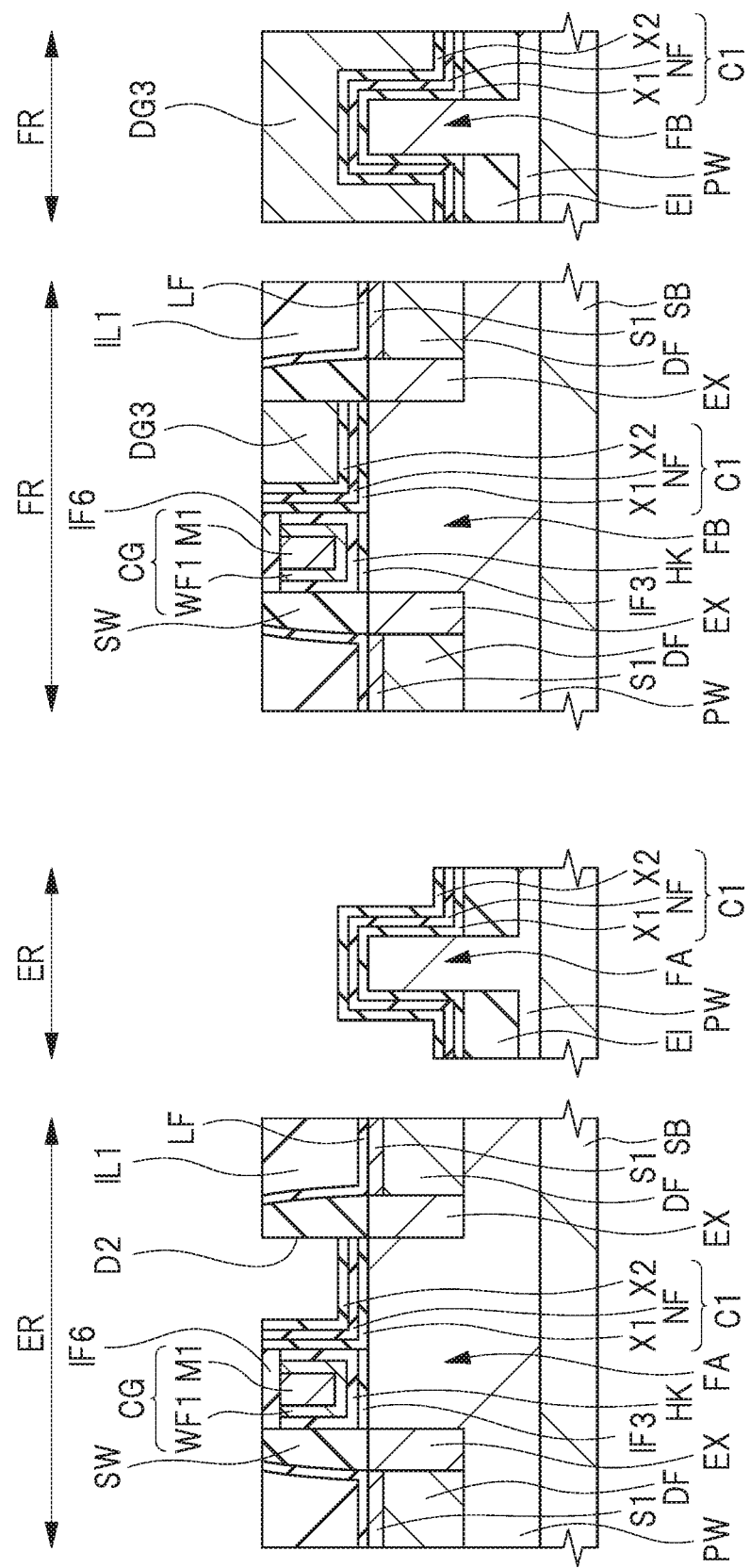
FIG. 31 is a cross-sectional view of a semiconductor device during a manufacturing process following FIG. 30.

Next, as shown in FIG. 31, using the photoresist film PR1 and the insulating film IF6 in the extra region ER as a mask (etching prevention mask), for example, wet etching is performed to remove the dummy gate electrode DG2 made of the polysilicon film. As a result, the opening D2 is formed in the region where the dummy gate electrode DG2 is removed and immediately above the ONO film C1. The opening D2 is a recess having one side surface formed by the sidewall spacer SW, the other side surface formed by the ONO film C1, and the bottom surface formed by the ONO film C1. Here, since the metal films M1 and WF1 and the high dielectric constant film HK in the extra region ER are protected by the insulating film IF6, they are not exposed to the etching solution. In this etching step, the photoresist film PR1 is also removed, and the interlayer insulating film IL1, the liner insulating film LF, the sidewall spacer SW, the insulating film IF6, the ONO film C1, and the dummy gate electrode DG3 in the flag region FR are exposed.

Figure 32:
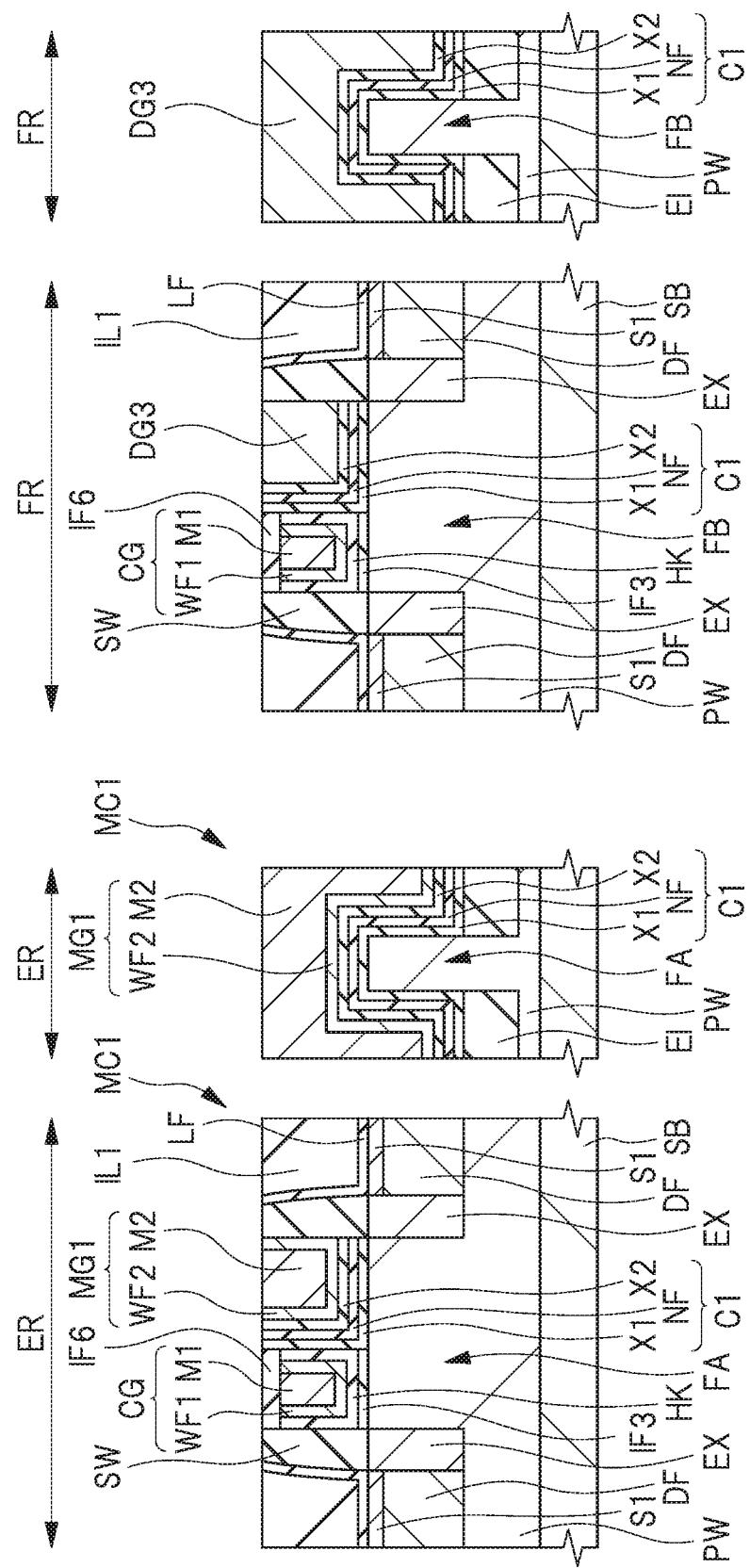
FIG. 32 is a cross-sectional view of a semiconductor device during a manufacturing process following FIG. 31.

Next, as shown in FIG. 32, a memory gate electrode MG1 is formed in the opening D2. That is, first, the metal film WF2 and the metal film M2 are formed in this order on the interlayer insulating film IL1 including the inside of the opening D2, thereby completely filling the inside of the opening D2 with the metal film WF2 and the metal film M2. The metal film WF2 and the metal film M2 can be formed by a sputtering method such as a PVD method, for example. Next, the excess metal film WF2 and the metal film M2 on the interlayer insulating film IL1 are removed by, for example, the CMP method or the like to expose the upper surface of the interlayer insulating film IL1. Thus, the metal film WF2 and the metal film M2 are left in the opening D2.

The metal films WF2 and M2 in the opening D2 constitute a memory gate electrode MG1. In the extra region ER, the memory gate electrode MG1 and the source/drain regions constitute a memory transistor. The memory transistor is a FinFET having the surfaces of the fins FA as channels. The surface of the fin FA referred to herein includes the upper surface and the side surface of the fin FA. The control transistor and the memory transistor constitute a memory cell MC1 of a split-gate type MONOS memory of the extra region ER.

The metal film WF2 is a work function film provided for adjusting the threshold voltage of the memory transistor, and continuously covers the bottom surface and the side surface of the metal film M2. That is, the metal film WF2 has a U-shaped cross section. Therefore, the metal film WF2 covers the side surface of the ONO film C1.

Figure 33:
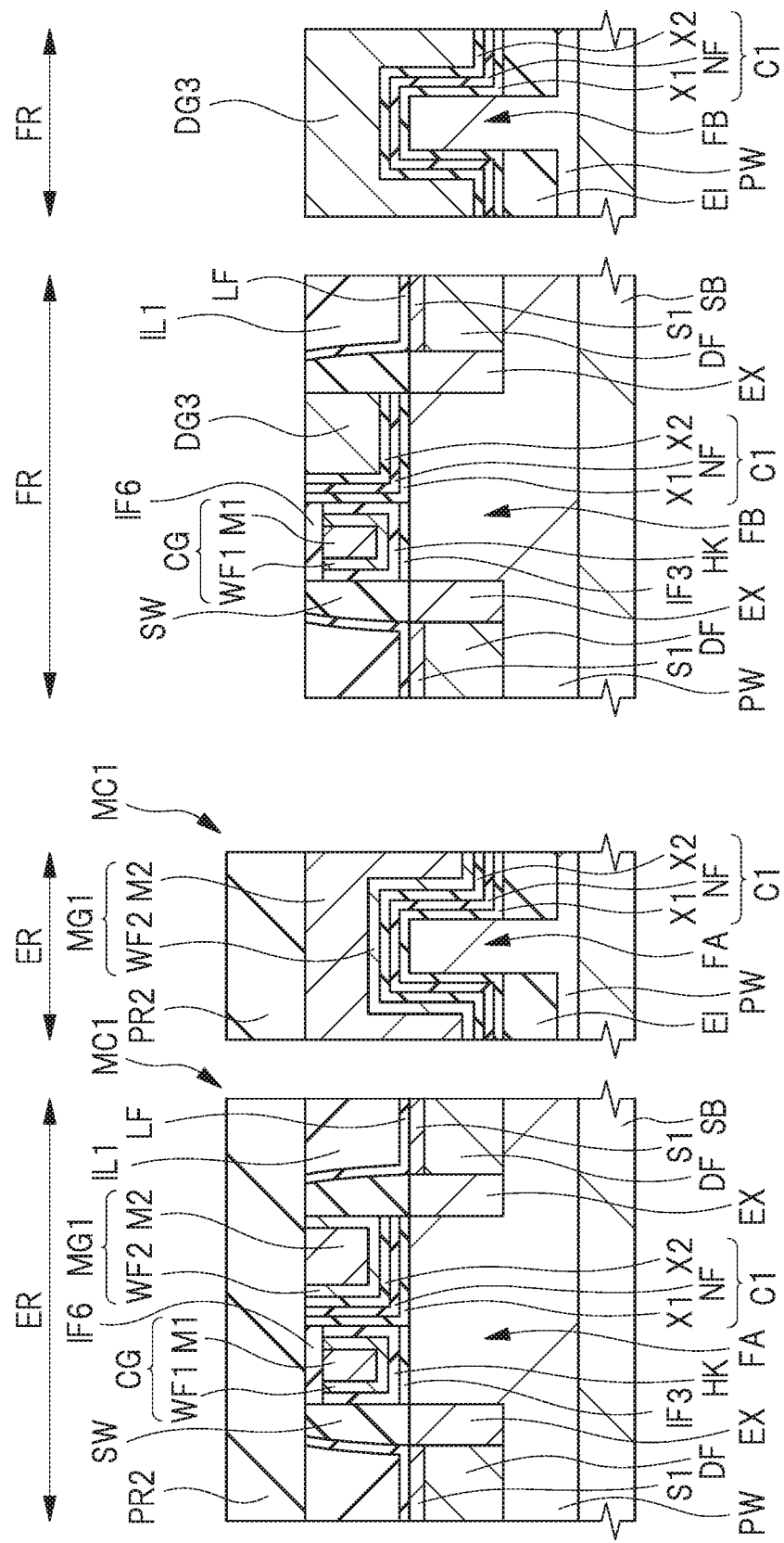
FIG. 33 is a cross-sectional view during the manufacturing process of a semiconductor device following FIG. 32.

Next, as shown in FIG. 33, a photoresist film PR2 covering the main surface of the semiconductor substrate SB in the extra region ER is formed. The photoresist film PR2 is a resist pattern that exposes the main surface of the semiconductor substrate SB in the flag region FR. That is, at least the insulating film IF6 and the dummy gate electrode DG3 in the flag region FR are exposed from the photoresist film PR2, and the insulating film IF6 and the memory gate electrode MG1 in the extra region ER are covered with the photoresist film PR2.

Figure 34:
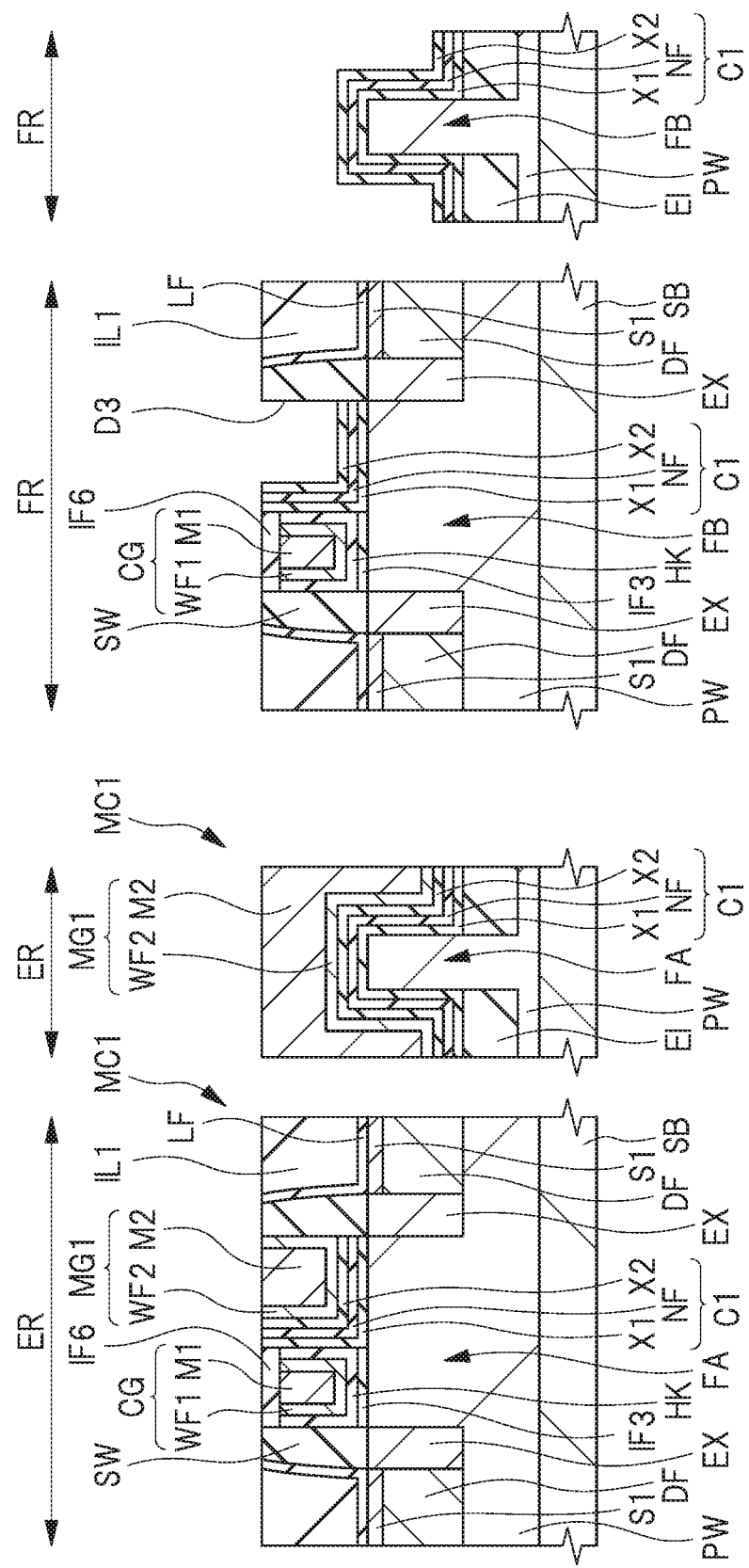
FIG. 34 is a cross-sectional view during the manufacturing process of a semiconductor device following FIG. 33.

Next, as shown in FIG. 34, using the photoresist film PR2 and the insulating film IF6 in the flag region FR as a mask (etching prevention mask), for example, wet etching is performed to remove the dummy gate electrode DG3 made of the polysilicon film. As a result, the opening D3 is formed in the region where the dummy gate electrode DG3 is removed and immediately above the ONO film C1. The opening D3 is a recess having one side surface formed by the sidewall spacer SW, the other side surface formed by the ONO film C1, and the bottom surface formed by the ONO film C1. Here, since the metal films M1 and WF1 and the high dielectric constant film HK in the flag region FR are protected by the insulating film IF6, they are not exposed to the etching solution. In this etching step, the photoresist film PR2 is also removed, and the interlayer insulating film IL1, the liner insulating film LF, the sidewall spacer SW, the insulating film IF6, the ONO film C1, and the memory gate electrode MG1 in the extra region ER are exposed.

Figure 35:
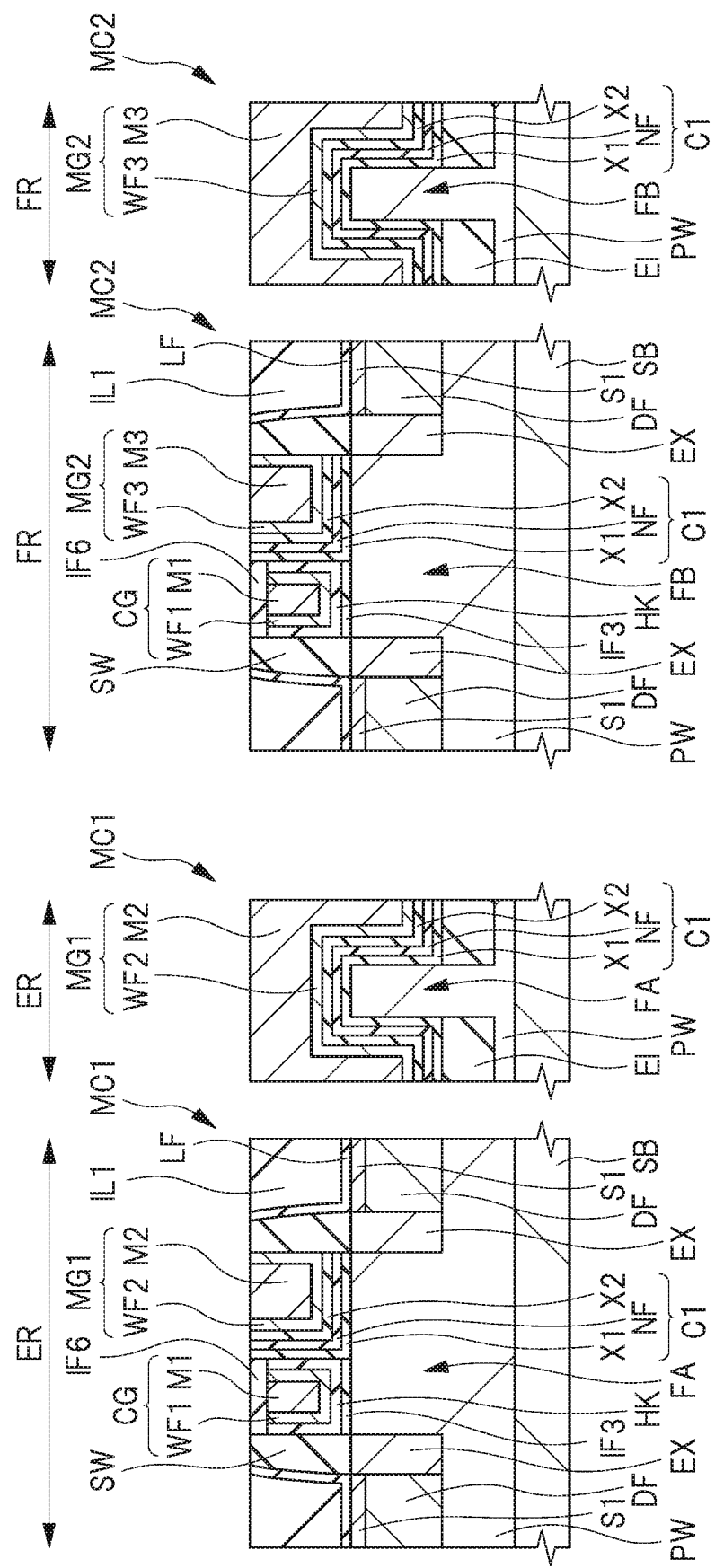
FIG. 35 is a cross-sectional view during the manufacturing process of a semiconductor device following FIG. 34.

Next, as shown in FIG. 35, the memory gate electrode MG2 is formed in the opening D3. That is, first, the metal film WF3 and the metal film M3 are formed in this order on the interlayer insulating film IL1 including the inside of the opening D3, thereby completely filling the inside of the opening D3 with the metal film WF3 and the metal film M3. The metal film WF3 and the metal film M3 can be formed by a sputtering method such as a PVD method, for example. Next, the excess metal film WF3 and the metal film M3 on the interlayer insulating film IL1 are removed by, for example, the CMP method or the like to expose the upper surface of the interlayer insulating film IL1. Thus, the metal film WF3 and the metal film M3 are left in the opening D3.

The metal films WF3 and M3 in the opening D3 constitute a memory gate electrode MG2. In the flag region FR, the memory gate electrode MG2 and the source/drain regions constitute a memory transistor. The memory transistor is a FinFET having the surfaces of the fins FBs as channels. Here, the surface of the fin FB includes the upper surface and the side surface of the fin FB. The control transistor and the memory transistor constitute a memory cell MC2 of a split-gate type MONOS memory of the flag region FR.

The metal film WF3 is a work function film provided for adjusting the threshold voltage of the memory transistor, and continuously covers the bottom surface and the side surface of the metal film M3. That is, the metal film WF3 has a U-shaped cross-sectional shape. Therefore, the metal film WF3 covers the side surface of the ONO film C1.

After the metal gate electrodes MG1 and MG2 are formed in the extra region ER and the flag region FR, the metal gate electrodes are formed in the code region CR and the data region DR in the same manner. Since the process is the same as that of FIGS. 29 to 35, the description thereof is omitted.

In addition, when the metal gate electrode is formed, there is a possibility that a thermal load such as a sputtering process may adversely affect the characteristics of another memory region which has already been formed. More specifically, the Al (aluminum) component contained in the already formed metal film may diffuse due to heat, and may adversely affect the characteristics of the charge storage film or the like under the metal film. Therefore, it is preferable to form the metal film in order from the memory region where the metal film is thick and the thermal load at the time of formation is large. Further, since the TiN film included in the metal film has an effect of suppressing diffusion of Al, the metal films of the flag region FR and the extra region ER including the TiN film in the metal film may be formed preferentially. Therefore, it is preferable to form the metal gate electrode in the order of the flag region FR, the extra region ER, the code region CR, and the data region DR.

Figure 36:
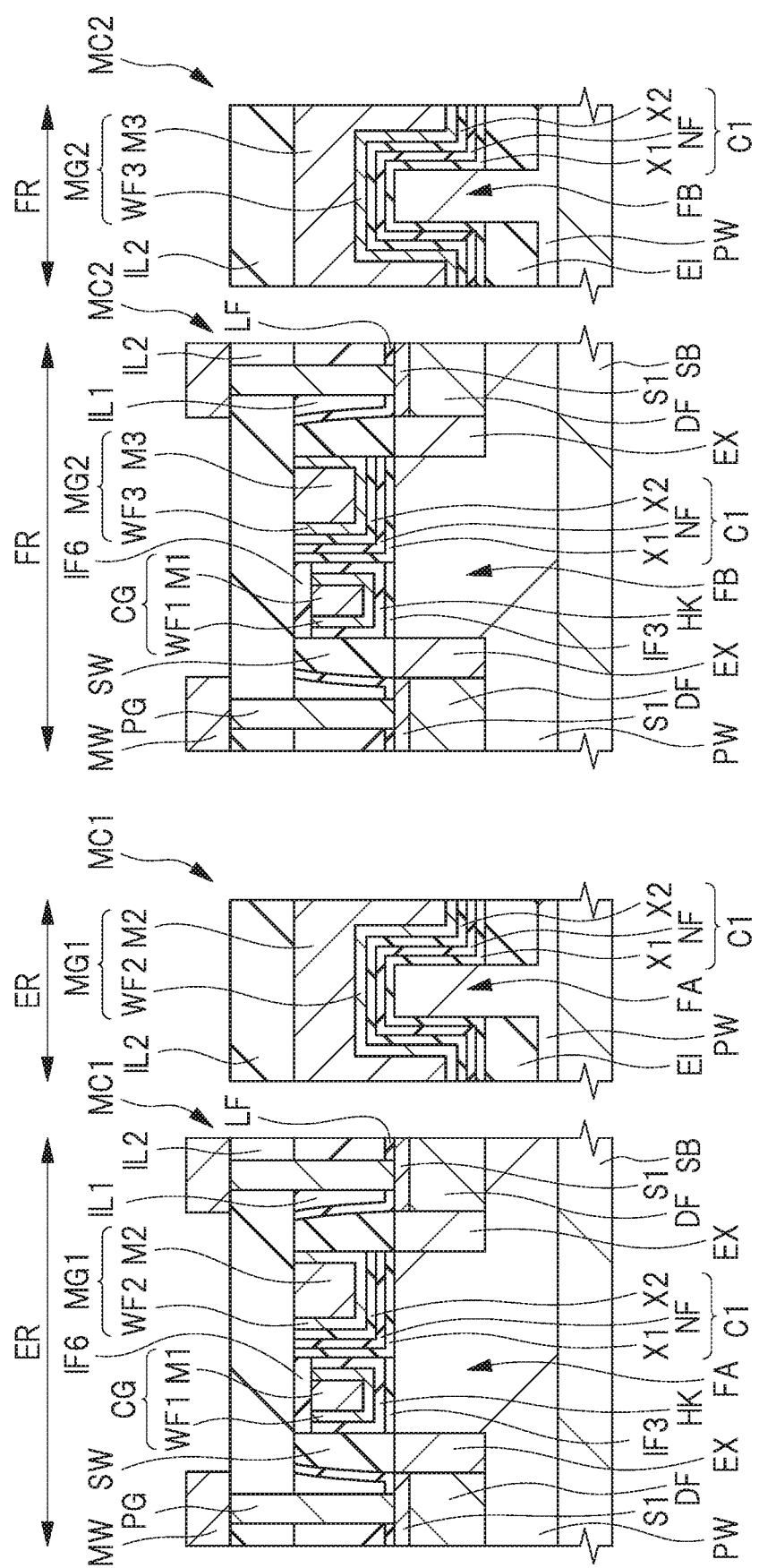
FIG. 36 is a cross-sectional view of a semiconductor device during a manufacturing process following FIG. 35.

Next, as shown in FIG. 36, in each of the extra region ER, the flag region FR, the code region CR (not shown), and the data region DR (not shown), an interlayer insulating film IL2 is formed on the main surface of the semiconductor substrate SB by, for example, the CVD method. The interlayer insulating film IL2 is made of, for example, a silicon oxide film.

Subsequently, a plurality of contact holes penetrating the interlayer insulating films IL1 and IL2 are formed by photolithography and dry etching. At the bottom of the contact hole, a part of the upper surface of the silicide layer S1 immediately above the source/drain regions is exposed. The contact holes are formed to expose portions of the upper surfaces of the control gate electrode CG and the memory gate electrodes MG1 and MG2 in a region (not shown).

Subsequently, a conductive plug PG mainly made of tungsten (W) or the like is formed in each contact hole as a conductive member for connection. The plug PG has a laminated structure of a barrier conductor film (for example, a titanium film, a titanium nitride film, or a laminated film thereof) and a main conductor film (for example, a tungsten film) positioned on the barrier conductor film. The plug PG is electrically connected to the source region and the drain region of each of the memory cells MC1 and MC2 via the silicide layer S1.

Subsequently, the wiring MW is formed on the interlayer insulating film IL2. The wiring MW has a laminated structure of a barrier conductor film (e.g., a titanium nitride film, a tantalum film, or a tantalum nitride film) and a main conductor film (e.g., a copper film) formed on the barrier conductor film. In FIG. 36, for simplification of the drawing, the barrier conductor film and the main conductor film constituting the wiring MW are integrally shown. The same applies to the plug PG. Through the above steps, the semiconductor device of this embodiment is substantially completed.

The wiring MW can be formed by, for example, a so-called single damascene method. That is, an interlayer insulating film having a wiring opening is formed on the interlayer insulating film IL2, and a metal film is filled in the wiring opening, whereby the wiring MW can be formed. Here, the interlayer insulating film on the side of the wiring MW is not shown.

Effect of Method of Manufacturing Semiconductor Device of First Embodiment

Figure 53:
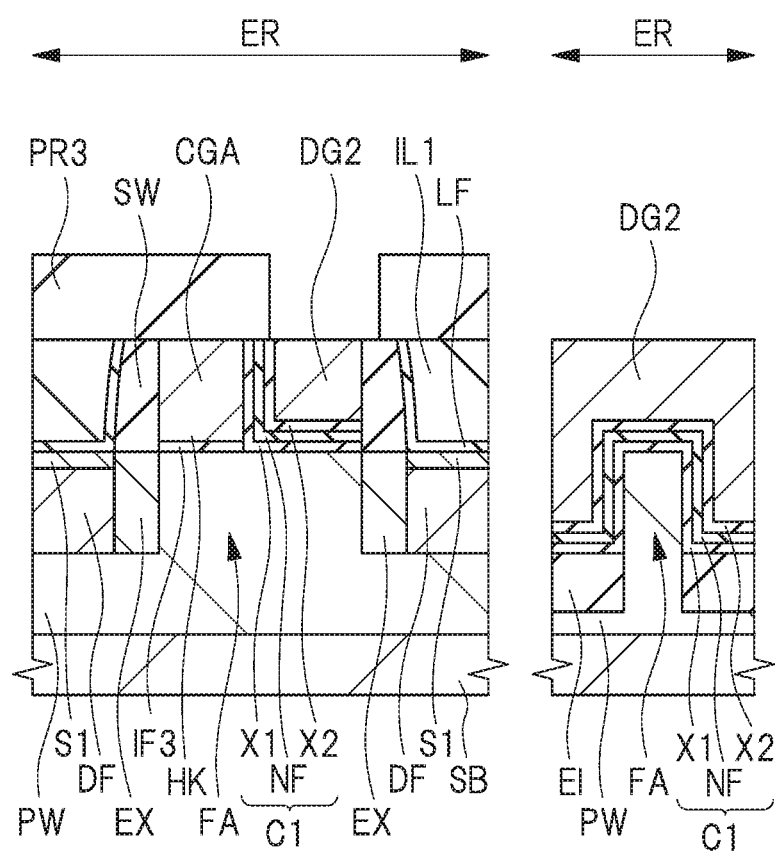
FIG. 53 is a cross-sectional view of a semiconductor device that is a comparative example during a manufacturing process.

Hereinafter, the effect of the semiconductor device of this embodiment will be described with reference to the comparative example shown in FIG. 53. FIG. 53 is a cross-sectional view during a manufacturing process of a semiconductor device as a comparative example. FIG. 53 shows a cross section at a position corresponding to the cross section of the extra region ER shown in FIG. 29, and shows a cross section of the memory cell in the manufacturing process along the longitudinal direction of the fin and a cross section of the memory cell in the manufacturing process along the lateral direction of the fin.

As described above, in the semiconductor device having the nonvolatile memory device, by changing the threshold value for each memory region, it is possible to prevent characteristic deterioration, increase the number of rewrites, increase the writing speed, and the like, to widen the degree of freedom in design of the semiconductor device, and to improve the reliability of the semiconductor device. In order to change the threshold value for each memory region, for example, the threshold voltage of the memory cell may be changed for each memory region. In order to change the threshold voltage for each memory cell, it is conceivable to change the threshold voltage of the memory transistor among the control transistor and the memory transistor constituting the memory cell. The threshold voltage of the memory transistor can be changed as appropriate by adjusting a material (composition), a film thickness, or the like of the work function film forming the memory gate electrode.

As a method of manufacturing for separately forming a material (composition) or a film thickness of a work function film constituting a memory gate electrode for each memory region, a method using a photolithography technique is considered as described in a comparative example below. That is, in the method of manufacturing of the semiconductor device of the following comparative example, the dummy gate electrode provided at the position where the memory gate electrode is to be formed is replaced with a metal gate electrode for each memory region by performing etching using a resist pattern exposing only the dummy gate electrode as a mask.

In the manufacturing process of the semiconductor device of the comparative example shown in FIG. 53, first, the process described with reference to FIGS. 7 to 13 is performed. At this time, instead of the dummy gate electrode DG1 shown in FIG. 13, the control gate electrode CGA is formed on the fin FA. Next, after the steps described with reference to FIGS. 14 to 16 are performed, the steps described with reference to FIGS. 18 to 24 are performed. That is, the oxidation process described with reference to FIG. 17 is not performed. In the polishing step during the process described with reference to FIG. 24, the insulating film IF4 is entirely removed, thereby exposing the control gate electrode CGA and the dummy gate electrode DG2.

Next, a photoresist film PR3 covering the control gate electrode CGA and exposing the dummy gate electrode DG2 is formed. Thus, the structure shown in FIG. 53 is obtained.

In a subsequent step, it is considered that the dummy gate electrode DG2 and the photoresist film PR3 are removed by performing wet etching using the photoresist film PR3 as a mask, and then a memory gate electrode made of a metal film is formed in the opening in the region where the dummy gate electrode DG2 is removed. By using such a process, it appears that a memory gate electrode comprised of different metal films can be formed in each of the data region DR, the flag region FR, the code region CR, and the extra region ER shown in FIG. 1.

However, with the miniaturization of semiconductor devices in recent years, the width of the memory gate electrode of a split-gate type MONOS memory and the thickness of the ONO film C1 adjoining the side surface of the memory gate electrode (lateral width) are becoming smaller. Therefore, it is difficult to form the photoresist film PR3 exposing only the dummy gate electrode DG2 at a desired position by using the photolithography technique. That is, when the photoresist film PR3 is formed, the control gate electrode CGA may be exposed due to a shift in the exposure position or the like, and the photoresist film PR3 may be formed so as to completely cover the dummy gate electrode DG2. Therefore, it is difficult to separately form a memory gate electrode for each memory region by using the method of manufacturing described with reference to FIG. 53, because this causes a decrease in yield.

In contrast, in the method of manufacturing the semiconductor device of the present embodiment, the upper surface of the polysilicon film PS is oxidized to form the silicon oxide film OX in the step described with reference to FIG. 17. Thus, in the etch-back process described with reference to FIG. 25, when the silicon nitride film is selectively removed, the dummy gate electrode DG1 can be exposed while protecting the dummy gate electrode DG2 made of the polysilicon film PS with the silicon oxide film OX. Therefore, in the next etching step shown in FIG. 26, the dummy gate electrode DG1 is removed while protecting the dummy gate electrode DG2, and the control gate electrode CG (see FIG. 29) can be formed as the metal gate electrode before the memory gate electrode.

In the process described with reference to FIGS. 28 and 29, the insulating film IF6 is formed to cover the upper surface of the control gate electrode CG that has been retracted. Therefore, by protecting the control gate electrode CG with the insulating film IF6, the dummy gate electrodes DG2 and DG3 can be replaced with the memory gate electrodes MG1 and MG2, respectively, while preventing the control gate electrode CG from being removed in the process described with reference to FIGS. 31 to 35. That is, in the process described with reference to FIGS. 31 to 35, the metal film or the silicon film exposed from the insulating film on the main surface side of the semiconductor substrate SB is only the dummy gate electrodes DG2 and DG3. Therefore, even if a resist pattern exposing a fine dummy gate pattern is not formed as in the photoresist film PR3 shown in FIG. 53, each of the dummy gate electrodes DG2 and DG3 can be replaced with a metal gate electrode in a separate step by using the photoresist films PR1 and PR2 protecting each memory region as a mask.

In this manner, by using the two hard masks of the silicon oxide film OX (see FIG. 25) and the insulating film IF6 (see FIG. 29), after the control gate electrode CG is formed first, the memory gate electrodes MG1 and MG2 of the respective memory regions can be separately formed while protecting the control gate electrode CG. Therefore, since the material (composition) or the film thickness of the work function film (metal films WF2 and WF3) constituting the memory gate electrode can be set separately for each memory region, the threshold voltage of the memory transistor can be adjusted to a different desired value for each memory region. As a result, it is possible to prevent the deterioration of the characteristics of the memory cell, increase the number of rewrites, and increase the writing speed, so that the performance of the semiconductor device can be improved. In addition, the degree of freedom in design of the semiconductor device can be increased, and the reliability of the semiconductor device can be improved.

Modified Example

In the above embodiment, an ONO film in which a silicon oxide film, a silicon nitride film, and a silicon oxide film are stacked in order is used as a stacked film including a charge storage film for storing information, but an AHA film in which an aluminum oxide film, a hafnium oxide film, and an aluminum oxide film are stacked in order may be used as the stacked film.

Figure 37:
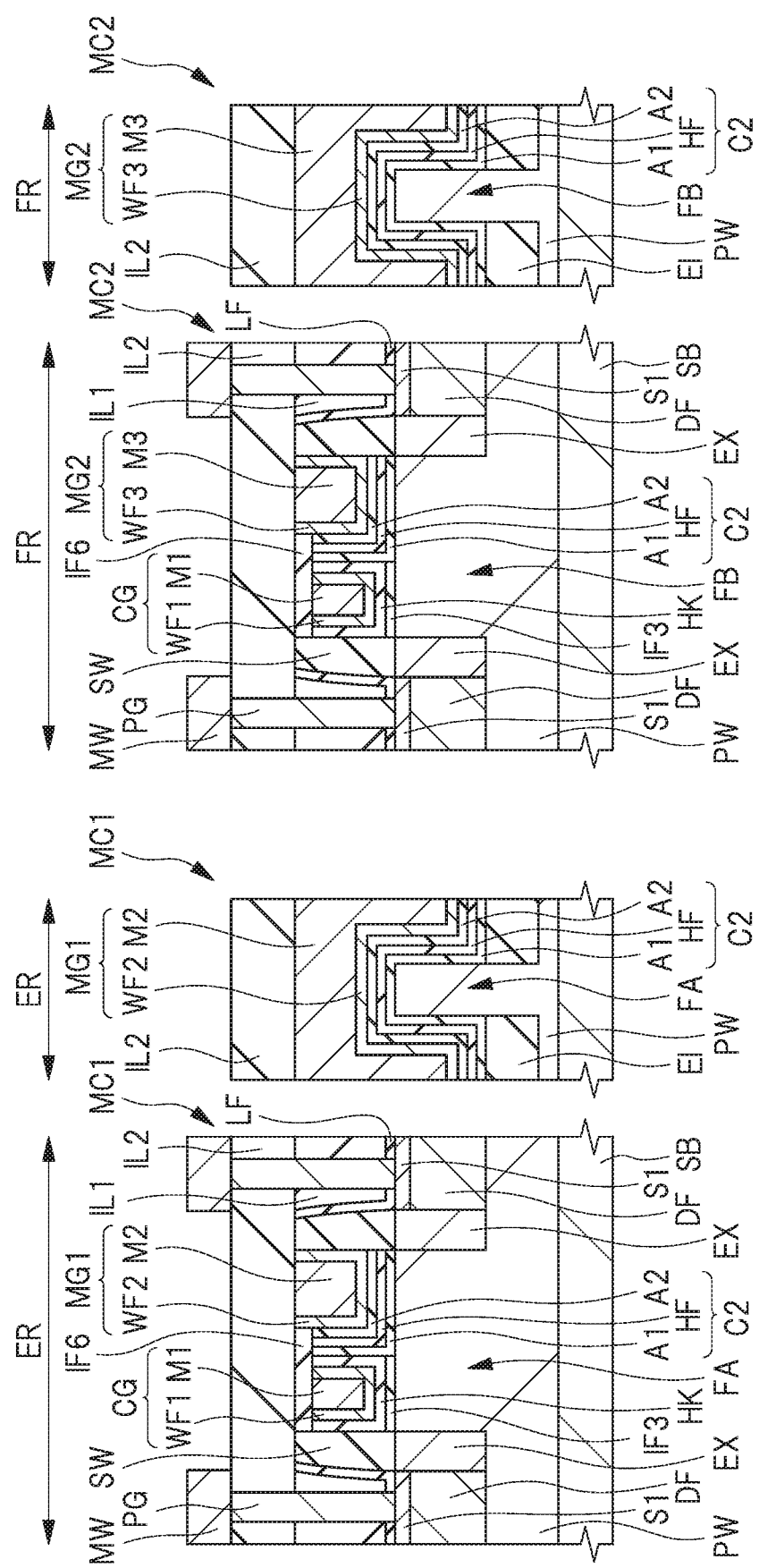
FIG. 37 is a cross-sectional view illustrating a semiconductor device that is a modified example of the first embodiment of the present invention.

Hereinafter, a modification of the semiconductor device of the present embodiment will be described with reference to FIGS. 37 to 41. FIG. 37 is a cross-sectional view showing a semiconductor device which is a modification of the present embodiment, and shows a portion corresponding to FIG. 4. FIGS. 38 to 41 are cross-sectional views during a manufacturing process of a semiconductor device which is a modification of the present embodiment.

As shown in FIG. 37, the semiconductor device according to the present modified example differs from the semiconductor device described with reference to FIGS. 1 to 4 in that the laminated film, which is the gate insulating film of the memory transistor, is made of AHA film (insulating film) C2, and that the upper surface of the AHA film C2 is retracted and contacts the upper surface of the insulating film IF6, so that the insulating film IF6 is in contact with each side of the memory gate electrode MG1 or MG2. The AHA film C2 is a laminated film comprised of an aluminum oxide (AlO, alumina) film A1, a hafnium oxide film HF, and an aluminum oxide (AlO, alumina) film A2 which are laminated in order on the semiconductor substrate SB. Each of the aluminum oxide films A1 and A2 is an insulating film made of, for example, an $Al_2O_3$ film. The hafnium oxide film HF is an insulating film made of, for example, a hafnium silicon oxide (HfSiO) film, and functions as a charge storage film (charge storage portion). The operating conditions of the semiconductor device in the case of using the AHA film C2 are the same as those described with reference to FIGS. 5 and 6, for example.

The insulating film IF6 in the extra region ER is formed from the side surface of the sidewall spacer SW in contact with the side surface of the high dielectric constant film HK to the side surface of the memory gate electrode MG1, and the control gate electrode CG and the AHA film C2 are formed immediately below the insulating film IF6. Similarly, the insulating film IF6 of the flag region FR is formed from the side surface of the sidewall spacer SW in contact with the side surface of the high dielectric constant film HK to the side surface of the memory gate electrode MG2, and the control gate electrode CG and the AHA film C2 are formed immediately below the insulating film IF6. That is, the upper surface of the AHA film C2 is located lower than the upper surface of each of the memory gate electrodes MG1 and MG2. Therefore, the AHA film C2 exposes a portion including the upper end of each side surface of the memory gate electrodes MG1 and MG2.

Figure 38:
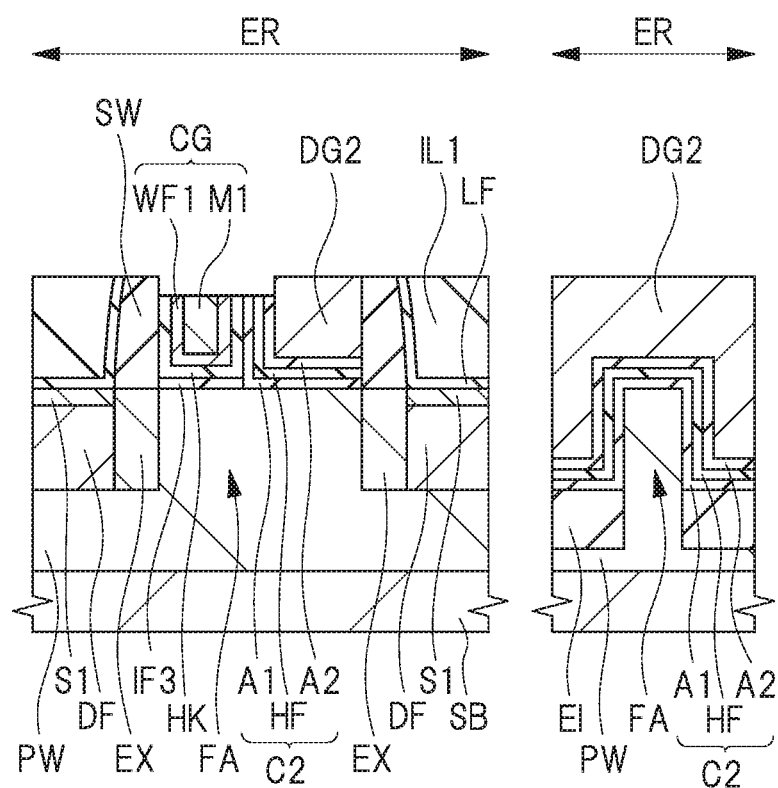
FIG. 38 is a sectional view during the manufacturing process of a semiconductor device that is a modified example of the first embodiment of the present invention.

Next, a method of manufacturing the semiconductor device of the present modified example will be described. Here, first, the same steps as those described with reference to FIGS. 7 to 27 are performed. Next, as shown in FIG. 38, the same steps as those described with reference to FIG. 28 are performed. Here, etching is performed to recede the upper surface of the control gate electrode CG formed of the metal films WF1 and M1. At this time, the upper surface of the AHA film C2, which is a metal oxide film, also recedes similarly to the upper surface of the control gate electrode CG. Therefore, the side surface of the dummy gate electrode DG2 is partially exposed.

Figure 39:
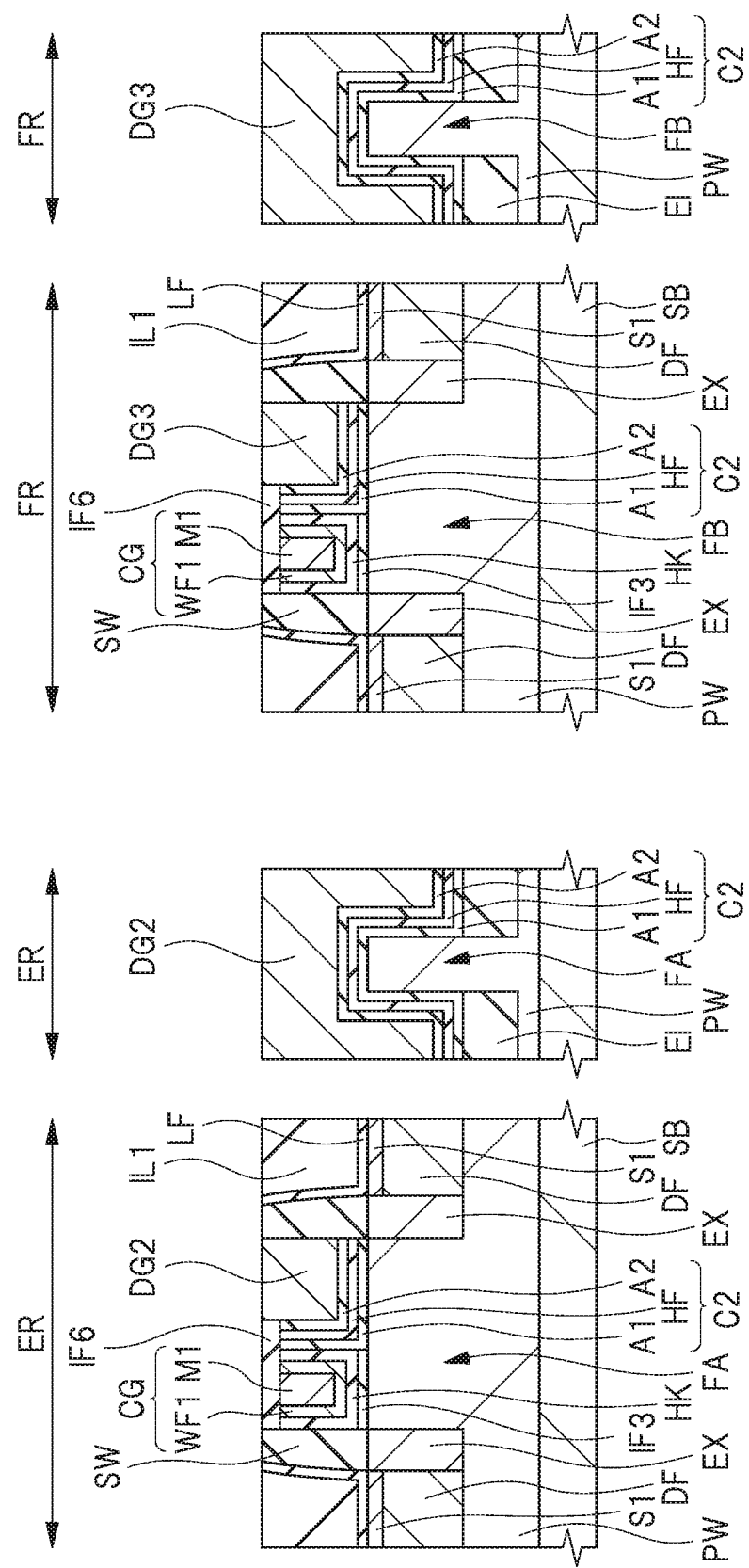
FIG. 39 is a cross-sectional view during the manufacturing process of a semiconductor device following FIG. 38.

Next, as shown in FIG. 39, the same steps as those described with reference to FIG. 29 are performed. As a result, the insulating film IF6 is filled in the opening formed immediately above each of the control gate electrode CG and the AHA film. That is, the upper surface of each of the control gate electrode CG and the AHA film is in contact with the lower surface of the insulating film IF6, and each of the control gate electrode CG and the AHA film is covered with the insulating film IF6.

Figure 40:
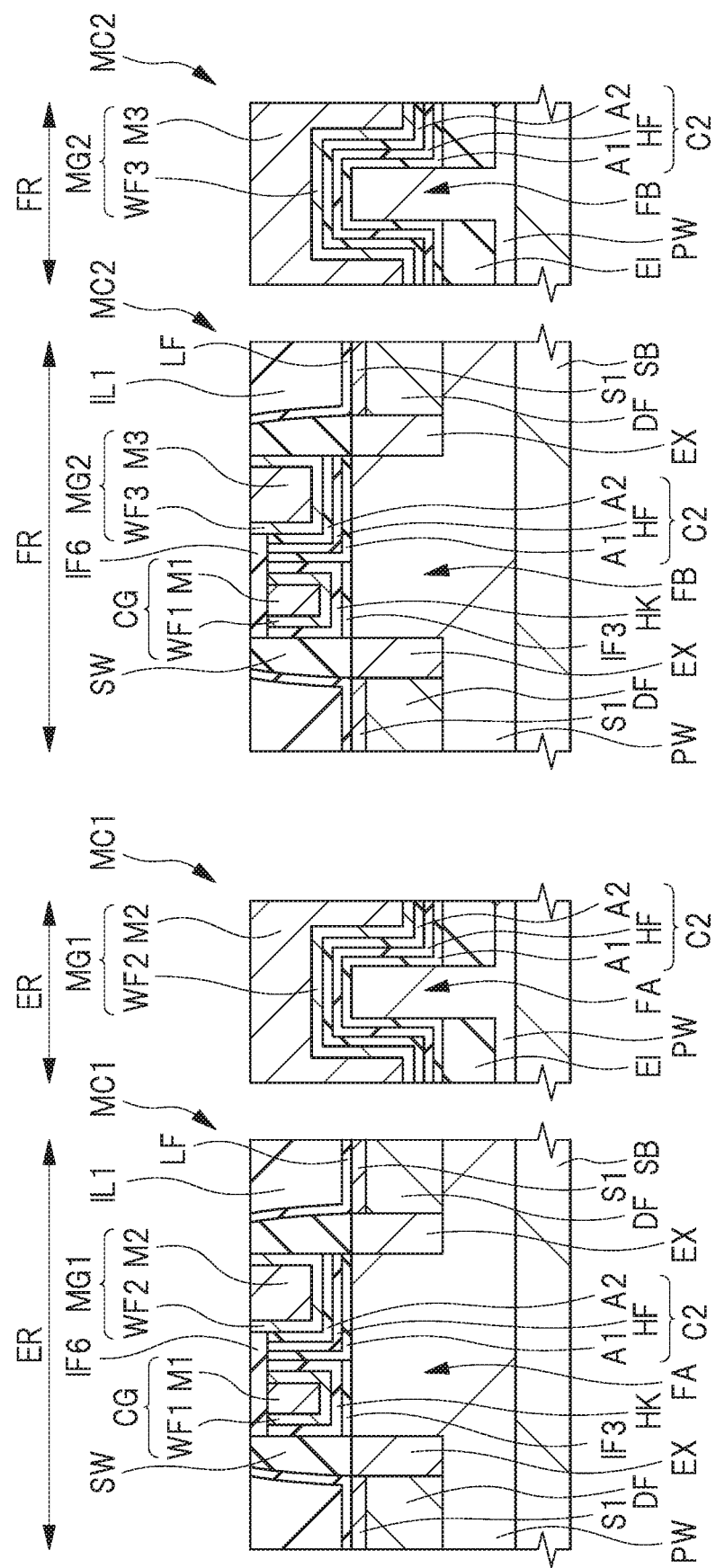
FIG. 40 is a cross-sectional view during the manufacturing process of a semiconductor device following FIG. 39.

Next, as shown in FIG. 40, the same steps as those described with reference to FIGS. 30 to 35 are performed. As a result, in the extra region ER and the flag region FR, the dummy gate electrodes DG2 and DG3 are replaced with the memory gate electrodes MG1 and MG2, respectively.

Figure 41:
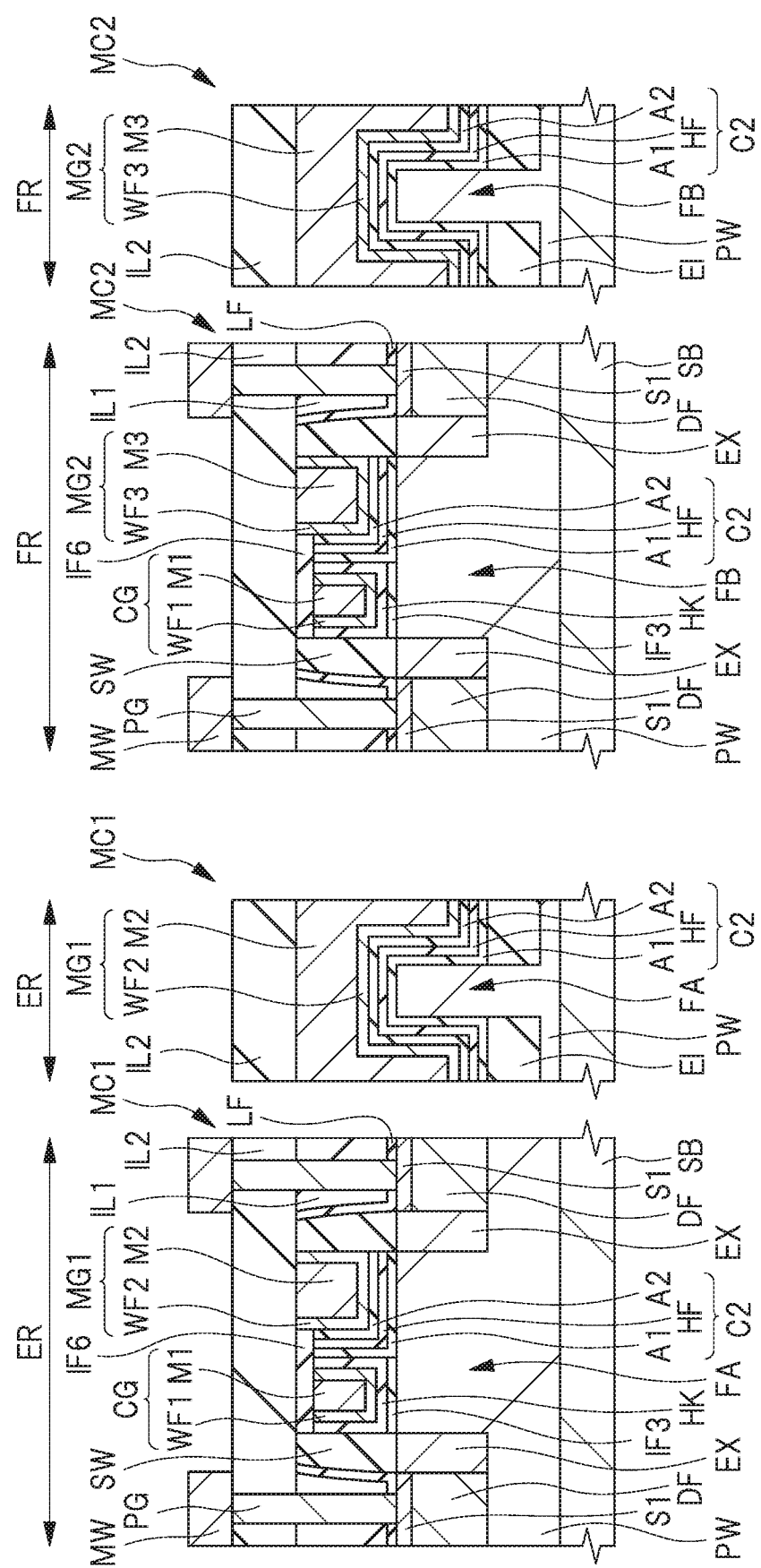
FIG. 41 is a cross-sectional view of a semiconductor device during a manufacturing process following FIG. 40.

Next, as shown in FIG. 41, the same steps as those described with reference to FIG. 36 are performed. Thus, the plug PG and the like are formed, and the semiconductor device of the present modified example is substantially completed.

In the present modified example, the same effect as the effect of the embodiment described with reference to FIGS. 1 to 36 can be obtained.

Second Embodiment

In the first embodiment, a split-gate type MONOS memory formed on the fins has been described. However, the present invention can also be applied to a planar memory without fins. In other words, the present embodiment is applied to split-gate type MONOS memories having channels only on the main surfaces of semiconductor substrates.

Figure 42:
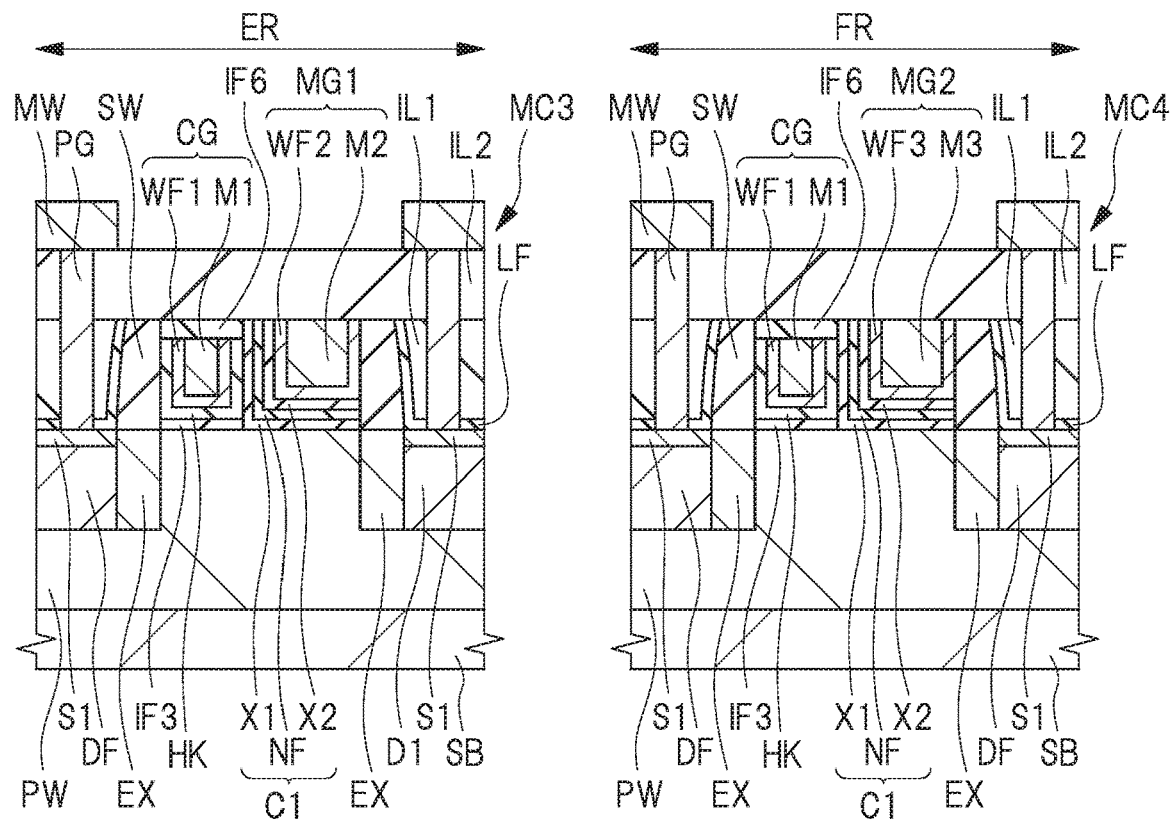
FIG. 42 is a sectional view illustrating a semiconductor device according to second embodiment of the present invention.

Hereinafter, a semiconductor device of this embodiment will be described with reference to FIGS. 42 to 52. FIG. 42 is a cross-sectional view showing a semiconductor device according to the present embodiment, and shows a portion corresponding to FIG. 4. FIGS. 43 to 52 are cross-sectional views during the manufacturing process of the semiconductor device according to the present embodiment.

As shown in FIG. 42, the semiconductor device of this embodiment does not have a fin-structure, and split-gate MONOS memories are formed on a flat main surface of the semiconductor substrate SB. That is, the difference between the present embodiment and the first embodiment is only the presence or absence of fins. FIG. 42 shows cross-sectional views of the memory cells MC 3 and MC 4 of the extra region ER and the flag region FR, respectively, in order from the left. The structure of the memory cell MC 3 shown in FIG. 42 is the same as the structure of the first cross section from the left among the four cross sections shown in FIG. 4. The structure of the memory cell MC 4 shown in FIG. 42 is the same as the structure of the third cross section from the left among the four cross sections shown in FIG. 4.

Each of the control transistor and the memory transistor constituting each of the memory cells MC 3 and MC 4 is a field effect transistor having only a plane which is a main surface of the semiconductor substrate SB as a channel region.

A method of manufacturing the semiconductor device according to the present embodiment will be described below.

Figure 43:
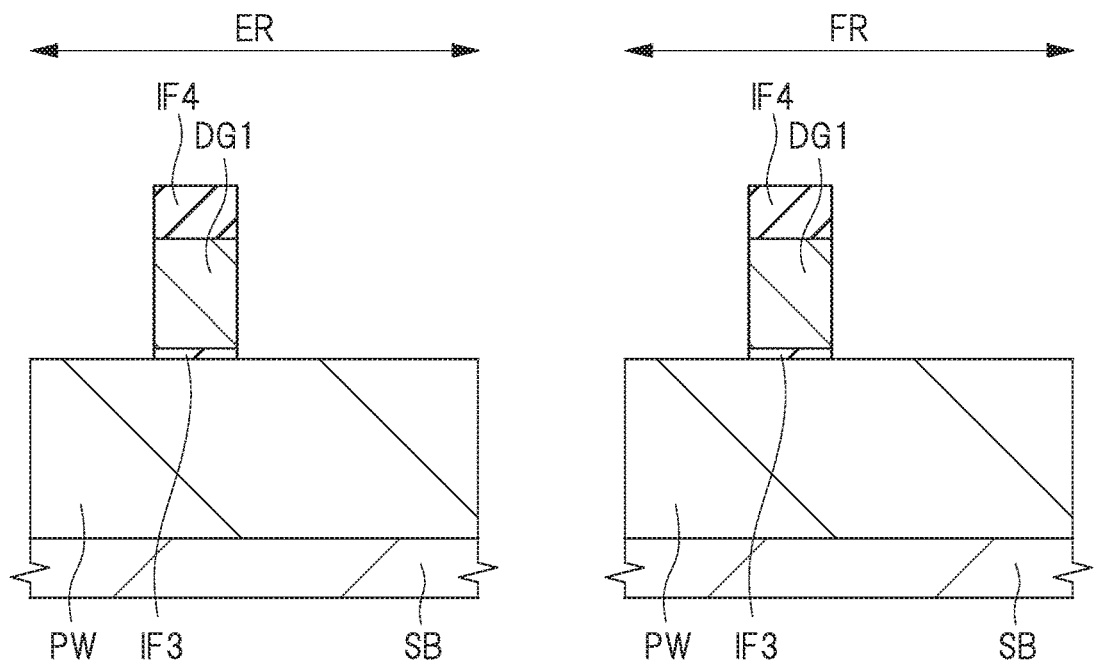
FIG. 43 is a cross-sectional view during the manufacturing process of a semiconductor device according to second embodiment of the present invention.

In the manufacturing process of the semiconductor device of the present embodiment, first, as shown in FIG. 43, after a semiconductor substrate SB is prepared, an element isolation region (not shown) made of an insulating film is formed on the main surface of the semiconductor substrate SB. The element isolation region (element isolation film) can be formed, for example, by filling the main surface of the semiconductor substrate SB with a silicon oxide film by a CVD method or the like by using a hard mask, then removing the insulating film on the main surface of the semiconductor substrate SB, thereby leaving the silicon oxide film only in the opening.

Subsequently, the same steps as those described with reference to FIGS. 12 and 13 are performed. Thus, the dummy gate electrode DG1 is formed, and the structure shown in FIG. 43 is obtained.

Figure 44:
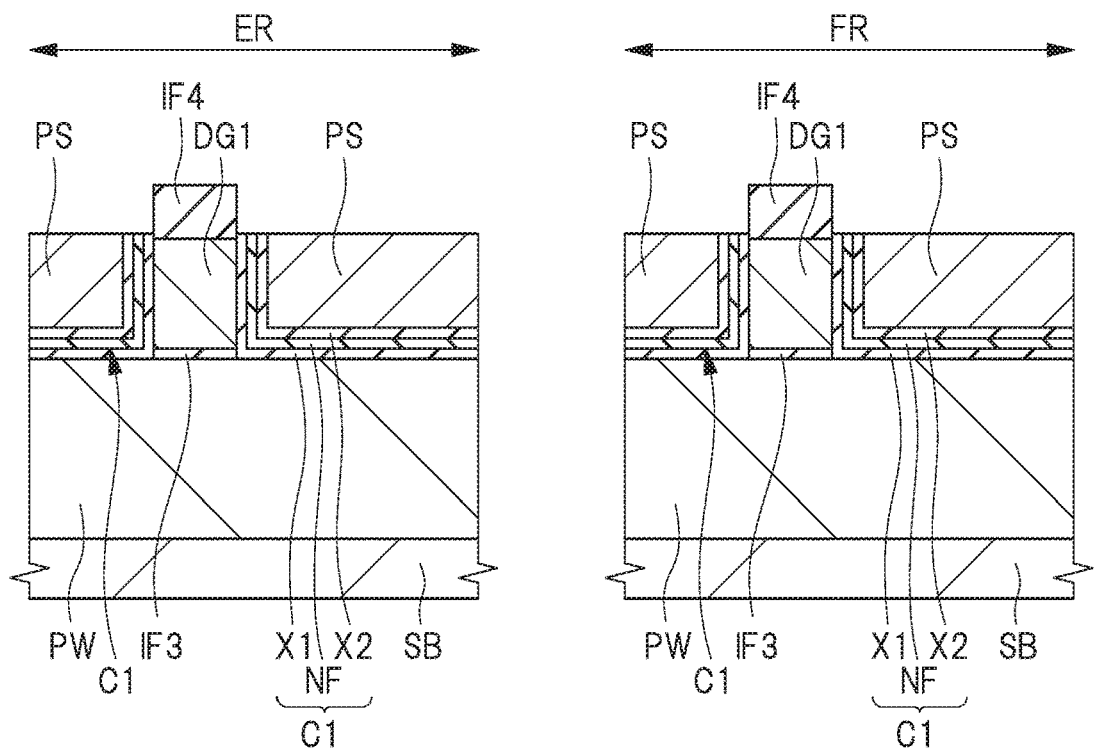
FIG. 44 is a cross-sectional view during the manufacturing process of a semiconductor device following FIG. 43.

Next, as shown in FIG. 44, the same steps as those described with reference to FIGS. 14 to 16 are performed. As a result, the polysilicon film PS is formed on the side of the dummy gate electrode DG1 with the ONO film C1 interposed therebetween. Here, the upper surface of the polysilicon film PS is located lower than the upper surface of the insulating film IF4 which is the cap insulating film on the dummy gate electrode DG1 and higher than the lower surface of the insulating film IF4.

Figure 45:
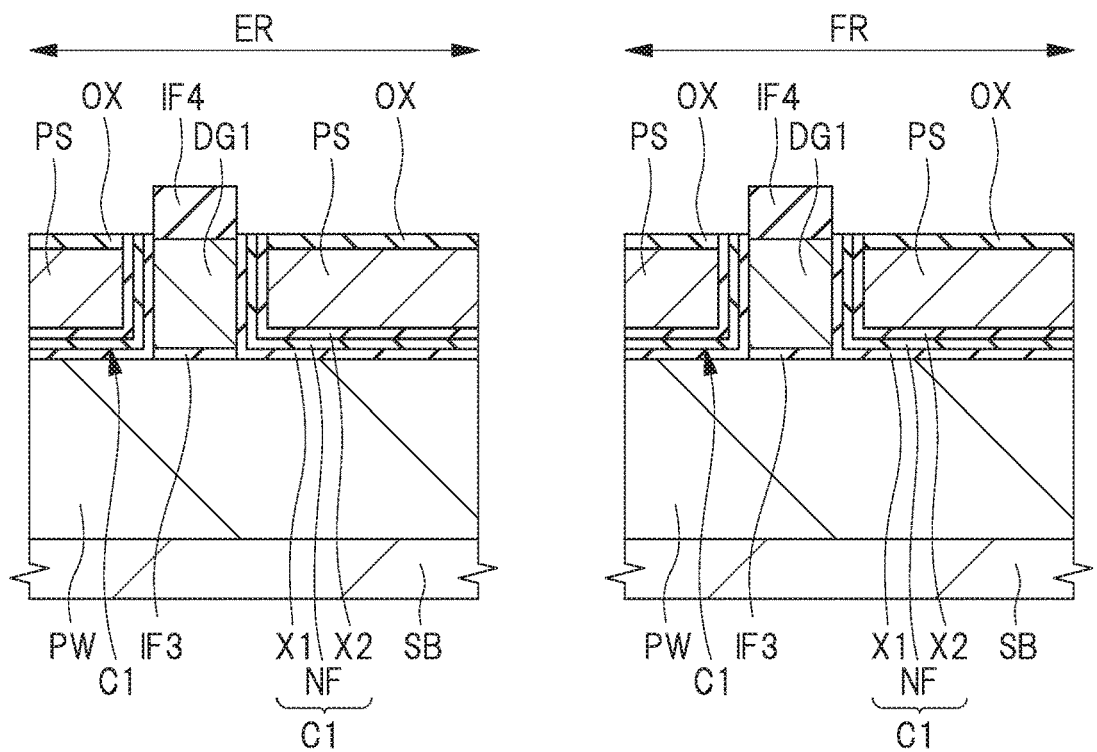
FIG. 45 is a cross-sectional view during the manufacturing process of a semiconductor device following FIG. 44.

Next, as shown in FIG. 45, a silicon oxide film OX covering the upper surface of the polysilicon film PS is formed by performing the same process as the process described with reference to FIG. 17. Here, the lower surface of the silicon oxide film OX is located lower than the upper surface of the dummy gate electrode DG1.

Figure 46:
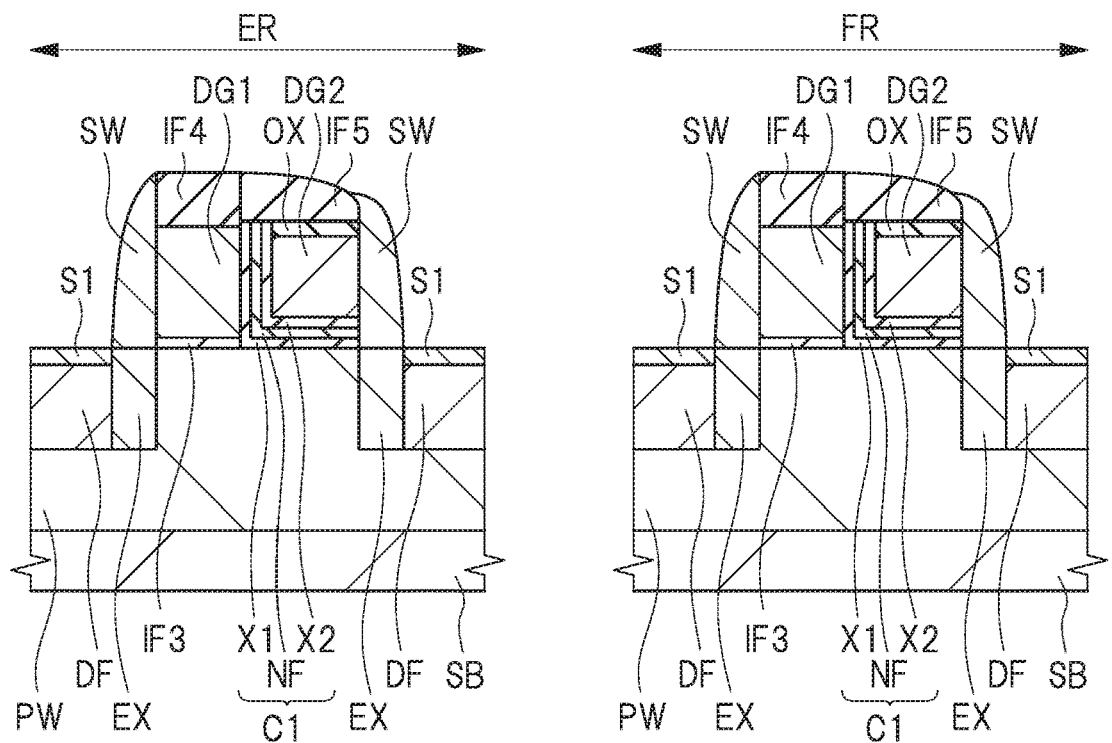
FIG. 46 is a cross-sectional view during the manufacturing process of a semiconductor device following FIG. 45.

Next, as shown in FIG. 46, the same steps as those described with reference to FIGS. 18 to 23 are performed. Thus, a pattern including the dummy gate electrodes DG1 and DG2, the insulating films IF3 to IF5, and the ONO film C1, and a sidewall spacer SW covering the side surface of the pattern are formed. Further, the extension region EX and the diffusion region DF are formed from the main surface of the semiconductor substrate SB to an intermediate depth of the semiconductor substrate SB. A silicide layer S1 is formed on the upper surface of the diffusion region DF.

Figure 47:
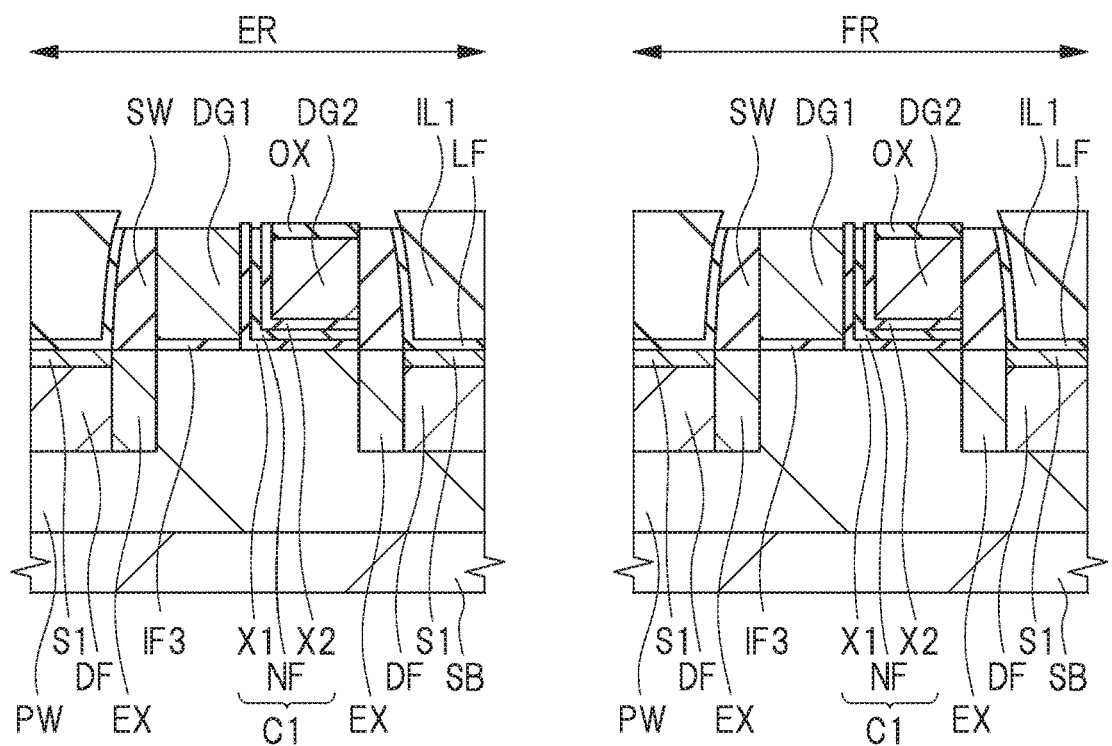
FIG. 47 is a cross-sectional view during the manufacturing process of a semiconductor device following FIG. 46.

Next, as shown in FIG. 47, the same steps as those described with reference to FIGS. 24 and 25 are performed. That is, after the liner insulating film LF and the interlayer insulating film IL1 are formed, the silicon nitride film such as the insulating film IF4 is etched back, thereby exposing the upper surface of the dummy gate electrode DG1. At this time, the position of the upper surface of the dummy gate electrode DG1 is higher than the position of the upper surface of the dummy gate electrode DG2, and the upper surface of the dummy gate electrode DG2 is covered with the silicon oxide film OX.

Figure 48:
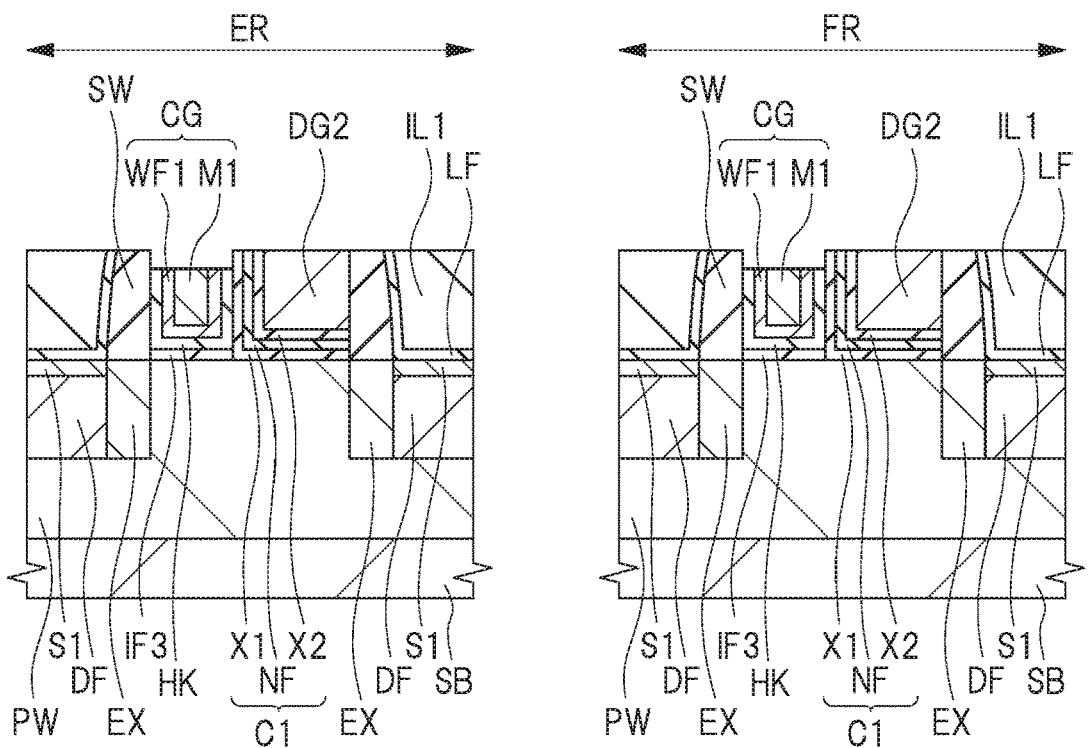
FIG. 48 is a cross-sectional view during the manufacturing process of a semiconductor device following FIG. 47.

Next, as shown in FIG. 48, the same steps as those described with reference to FIGS. 26 to 28 are performed. As a result, the dummy gate electrode DG1 is replaced with the control gate electrode CG, and the upper surface of the control gate electrode CG is recessed to form a opening.

Figure 49:
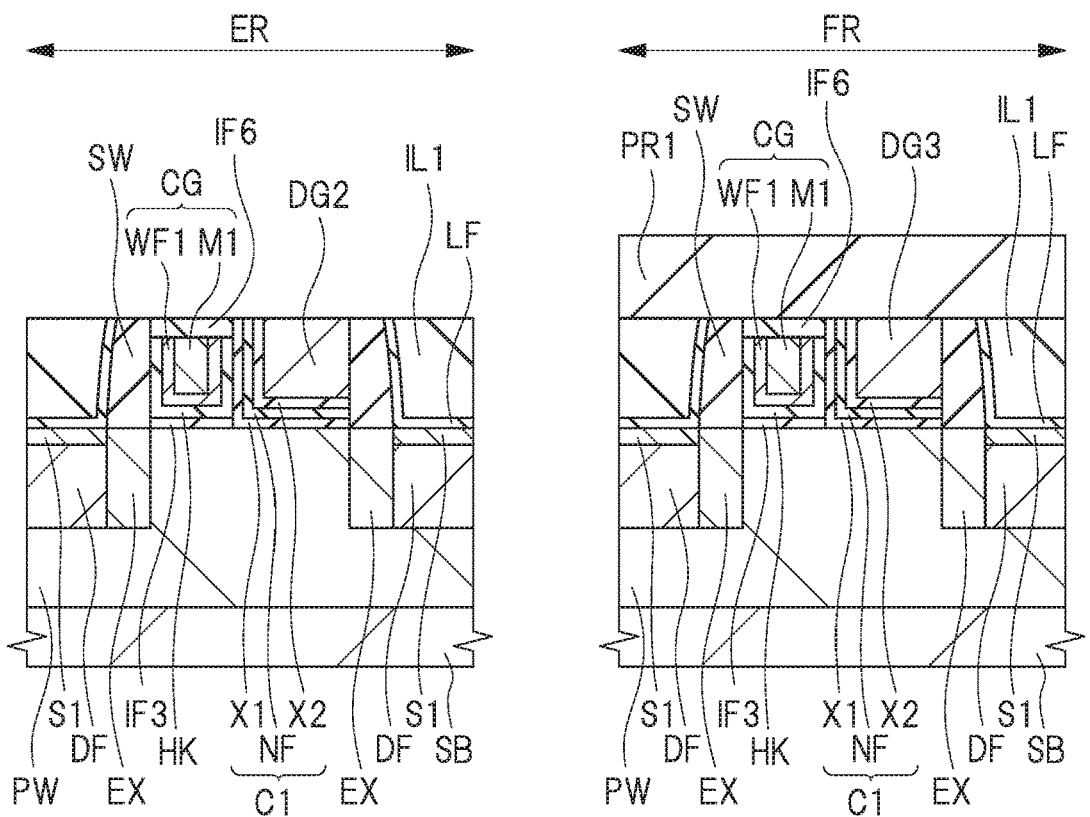
FIG. 49 is a cross-sectional view during the manufacturing process of a semiconductor device following FIG. 48.

Next, as shown in FIG. 49, the same steps as those described with reference to FIGS. 29 and 30 are performed. Thereby, an insulating film IF6 is formed in the opening, and then a photoresist film PR1 covering the entire main surface of the semiconductor substrate SB in the flag region FR is formed.

Figure 50:
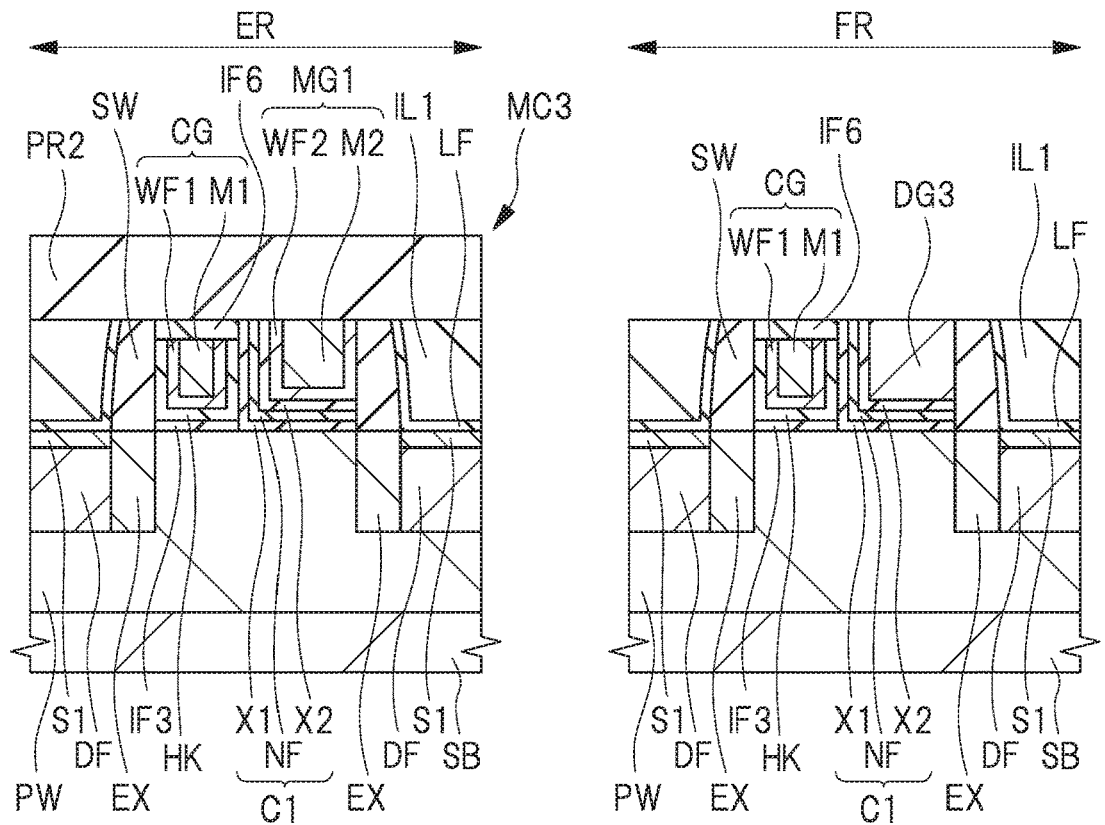
FIG. 50 is a cross-sectional view during the manufacturing process of a semiconductor device following FIG. 49.

Next, as shown in FIG. 50, the same steps as those described with reference to FIGS. 31 to 33 are performed. As a result, the dummy gate electrode DG2 of the extra region ER is replaced with the memory gate electrode MG1 to form the memory cell MC 3 including the control gate electrode CG and the memory gate electrode MG1. The memory gate electrode MG1 has a structure in which a metal film WF2 and a metal film M2 are stacked in this order. Next, a photoresist film PR2 is formed to cover the entire main surface of the semiconductor substrate SB in the extra region ER.

Figure 51:
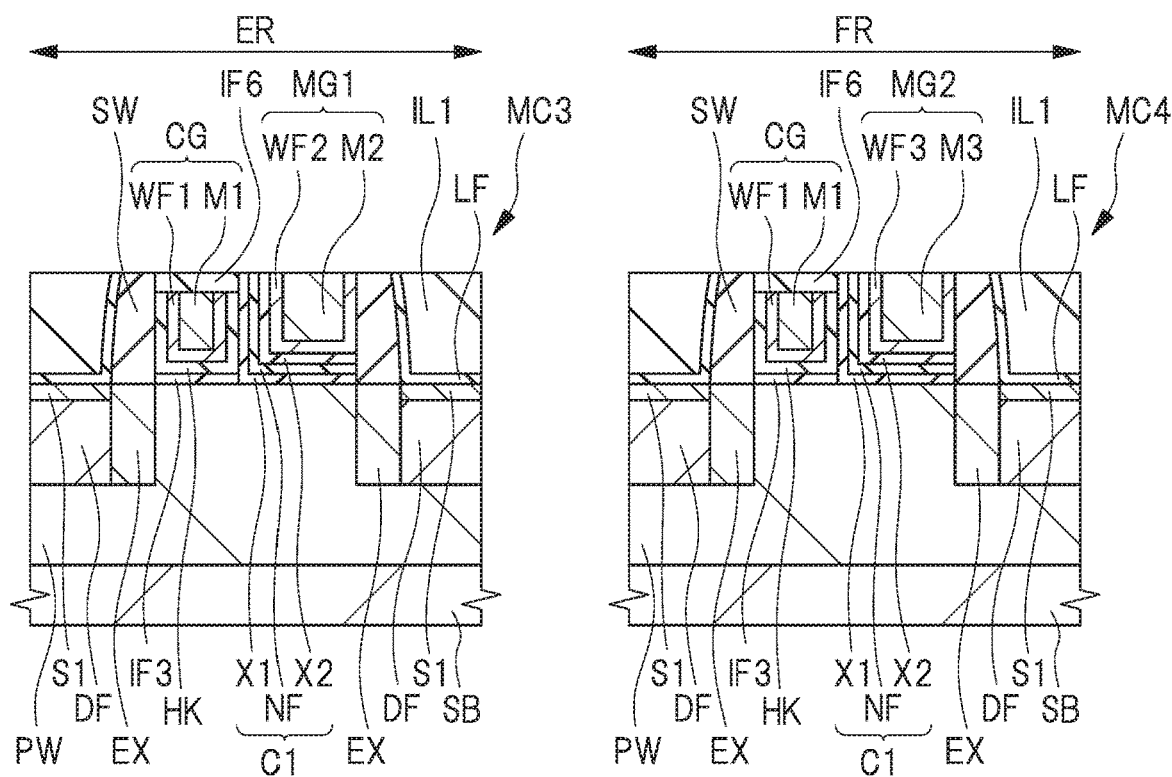
FIG. 51 is a cross-sectional view of a semiconductor device during a manufacturing process following FIG. 50.

Next, as shown in FIG. 51, the same steps as those described with reference to FIGS. 34 and 35 are performed. Thus, the memory cell MC 4 including the control gate electrode CG and the memory gate electrode MG2 is formed by replacing the dummy gate electrode DG3 of the flag region FR with the memory gate electrode MG2. The memory gate electrode MG2 has a structure in which a metal film WF3 and a metal film M3 are stacked in this order.

Each of the metal films WF2 and WF3 is comprised of a TiAl (titanium aluminum) film or a TiN (titanium nitride) film. However, each of the metal films WF2 and WF3 is made of a different material or has a different film thickness, so that the memory transistor configuring the memory cell MC 3 and the memory transistor configuring the memory cell MC 4 have threshold voltages different from each other.

Figure 52:
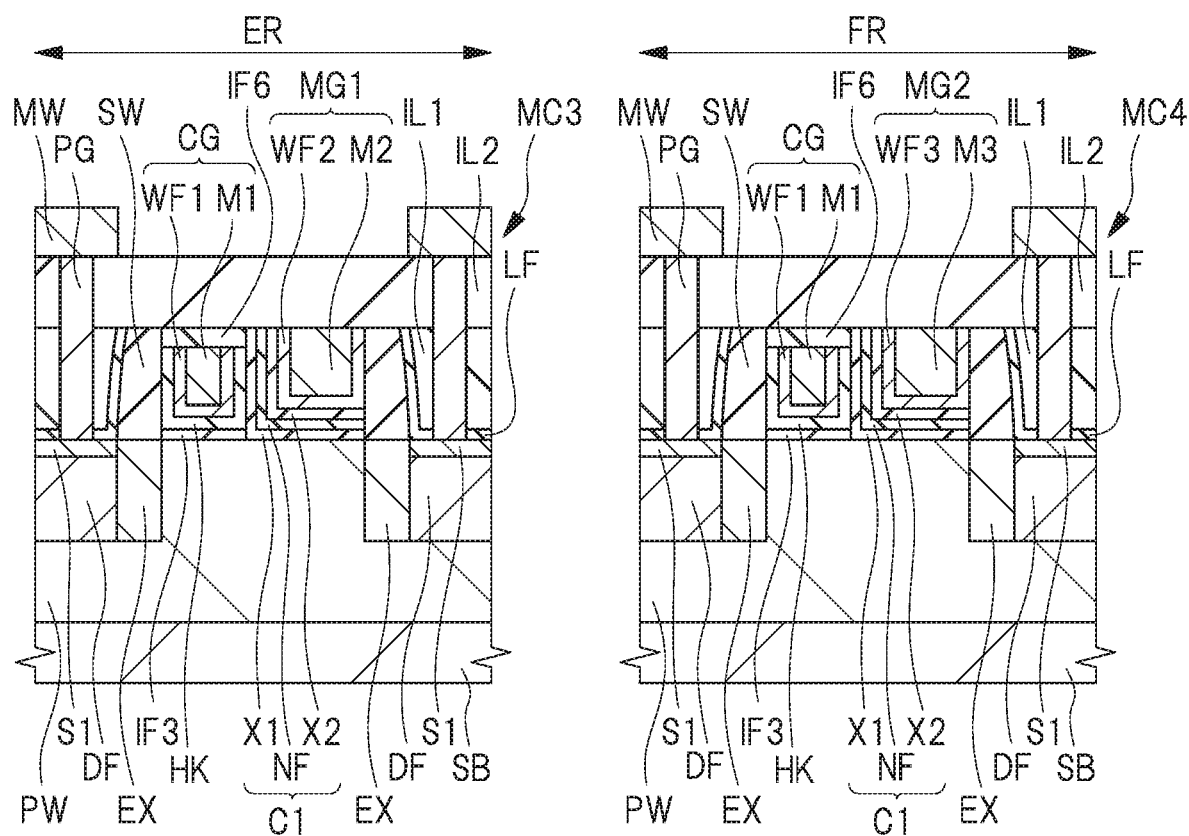
FIG. 52 is a cross-sectional view of a semiconductor device during a manufacturing process following FIG. 51.

Next, as shown in FIG. 52, a process similar to the process described with reference to FIG. 36 is performed, whereby the semiconductor device of this embodiment is substantially completed.

In the present embodiment, the same effects as those of the first embodiment can be obtained in planar MONOS memories having no fin-structure.

Although the invention made by the present inventors has been specifically described based on the embodiment, the present invention is not limited to the embodiment, and it is needless to say that various modifications can be made without departing from the gist thereof.

For example, the modified example of the first embodiment may be applied to the second embodiment.

(Supplementary Note 1)

A method of manufacturing of a semiconductor device comprising steps of;

(a) preparing a semiconductor substrate having a first region and second region;

(b) forming a first gate pattern on an upper surface of the semiconductor substrate in the first region via a first insulating film, and forming a second insulating film on the first gate pattern, and forming a second gate pattern on an upper surface of the semiconductor substrate in the second region via a third insulating film, and forming a fourth insulating film on the second gate pattern;

(c) forming a fifth insulating, a third gate pattern, and a sixth insulating film on the first region of the semiconductor substrate, the fifth insulating film including a first charge storage portion, and the third gate pattern being located adjacent to a side surface of the first gate pattern in a first direction via the fifth insulating film and being located on the semiconductor substrate via the fifth insulating film, and the sixth insulating film covering an upper surface of the third gate pattern, and forming a seventh insulating film, a fourth gate pattern, and an eighth insulating film on the second region of the semiconductor substrate, the seventh insulating film including a second charge storage portion, and the fourth gate pattern being located adjacent to a side surface of the second gate pattern in a second direction via the sixth insulating film and being located on the semiconductor substrate via the sixth insulating film, and the eight insulating film covering an upper surface of the fourth gate pattern;

(d) forming a first source region and a first drain region in the semiconductor substrate adjacent to a first pattern including the first and second gate pattern, and forming a second source region and a second drain region in the semiconductor substrate adjacent to a second pattern including the third gate pattern and the fourth gate pattern;

(e) exposing the first gate pattern and the second gate pattern by removing the second insulating film and the fourth insulating film by using the sixth insulating film and the eighth insulating film as a mask;

(f) after the step (e), replacing the first gate pattern with a first gate electrode being comprised of a first metal layer, replacing the second gate pattern with a second gate electrode being comprised of a second metal layer, and removing the sixth insulating film and the eighth insulating film;

(g) forming a ninth insulating film covering an upper surface of the first gate electrode and exposing the third gate pattern, and forming a tenth insulating film covering an upper surface of the second gate electrode and exposing the fourth gate pattern;

(h) after the step (g), forming a first nonvolatile memory cell comprising the first gate electrode, the third gate electrode, the first source region, and the first drain region by replacing the third gate pattern with a third gate electrode being comprised of a third metal film; and (i) after the step (g), forming a second nonvolatile memory cell comprising the second gate electrode, the fourth gate electrode, the second source region, and the second drain region by replacing the fourth gate pattern with a fourth gate electrode being comprised of a fourth metal film, wherein a threshold voltage of a first transistor configured by the third gate electrode, the first source region, and the first drain region is larger than a threshold voltage of a second transistor configured by the fourth gate electrode, the second source region, and the second drain region.

(Supplementary Note 2)

The semiconductor device according to Supplementary Note 1, wherein the step (h) further comprises steps of:

(h1) forming a first opening by removing the third gate pattern, and (h2) forming the third metal film being comprised of a fifth and sixth metal film by filling the first opening with the fifth and sixth metal film in order, the sixth metal film having a lower resistance than the fifth metal film, and wherein the step (i) further comprises steps of:

(i1) forming a second opening by removing the fourth gate pattern, (i2) forming the fourth metal film being comprised of a seventh and eighth metal film by filling the second opening with the seventh and eighth metal film in order, the eighth metal film having a lower resistance than the seventh metal film.

(Supplementary Note 3)

The semiconductor device according to Supplementary Note 2, wherein a material of the fifth metal film and a material of the seventh metal film are different from each other.

(Supplementary Note 4)

The semiconductor device according to Supplementary Note 2, wherein a thickness of the fifth metal film is larger than a thickness of the seventh metal film.

(Supplementary Note 5)

The semiconductor device according to Supplementary Note 1, wherein the step (g) further comprises steps of:

(g1) forming a third opening in the first gate electrode and forming a fourth opening in the second gate electrode by retreating each of the upper surface of the first and second gate electrode respectively, and (g2) filling the third opening with the ninth insulating film and filling the fourth opening with the tenth insulating film.

(Supplementary Note 6)

The semiconductor device according to Supplementary Note 1, wherein the step (g) further comprises steps of:

(g1) forming a third opening in the first gate electrode and forming a fourth opening in the second gate electrode by retreating each of the upper surface of the first and second gate electrode respectively, and (g2) filling the third opening with the ninth insulating film and filling the fourth opening with the tenth insulating film.

(Supplementary Note 7)

The semiconductor device according to Supplementary Note 4, wherein the fifth insulating film includes a first hafnium oxide film, and the seventh insulating film includes a second hafnium oxide film, and wherein, in the step (g1), the third opening is formed on the first gate electrode and the fifth insulating film, and the fourth opening is formed on the second gate electrode and the seventh insulating film by retreating the upper surface of the first gate electrode, the upper surface of the second gate electrode, the upper surface of the fifth insulating film, and the seventh insulating film respectively.

(Supplementary Note 8)

The semiconductor device according to Supplementary Note 1, further comprising steps of:

(a1) after the step (a) and before the step (b), forming a first protrusion which is part of the semiconductor substrate, protrudes from the upper surface of the semiconductor substrate, and extends in the first direction by retreating a part of the upper surface of the semiconductor substrate in the first region, and forming a second protrusion which is part of the semiconductor substrate, protrudes from the upper surface of the semiconductor substrate, and extends in the second direction by retreating a part of the upper surface of the semiconductor substrate in the second region, wherein in the step (b), forming the first gate pattern and the second insulating film covering the upper and side surface of the first protrusion via the second insulating film, and forming the second gate pattern and the fourth insulating film covering the upper and side surface of the second protrusion via the fourth insulating film, wherein in the step (c), forming the third gate pattern covering the upper and side surface of the first protrusion via the fifth insulating film, the sixth insulating film, the fourth gate pattern covering the upper and side surface of the second protrusion via the seventh insulating film, and the eighth insulating film, and wherein in the step (d), forming the first source and drain region in the first protrusion, and forming the second source and drain region in the second protrusion.

What is claimed is:

1. A semiconductor device comprising:
a semiconductor substrate having a first region and a second region;
a first protrusion which is part of the first region of the semiconductor substrate, protrudes from an upper surface of the semiconductor substrate, and extends in a first direction along the upper surface of the semiconductor substrate;
a second protrusion which is a part of the second region of the semiconductor substrate, protrudes from the upper surface of the semiconductor substrate, and extends in the first direction along the upper surface of the semiconductor substrate;
a first gate electrode covering the upper surface of the semiconductor substrate in the first region and an upper and side surface of the first protrusion via a first insulating film including a first charge storage portion;
a first source region and a first drain region formed in the first protrusion so as to sandwich a first channel formed region therebetween in the first direction, the first channel formed region being a region inside the first protrusion and being covered with a pattern comprised of the first gate electrode;
a second gate electrode covering the upper surface of the semiconductor substrate in the second region and an upper surface and a side surface of the second protrusion via a second insulating film including a second charge storage portion; and
a second source region and a second drain region formed in the second protrusion so as to sandwich a second channel formed region therebetween in the first direction, the second channel formed region being a region inside the second protrusion and being covered with a pattern comprised of the second gate electrode, wherein at least the first gate electrode, the first source region and the first drain region configure a first nonvolatile memory cell, wherein at least the second gate electrode, the second source region and the second drain region configure a second nonvolatile memory cell, wherein the first gate electrode comprises a first metal film and a first work function film, the first work function film contacting the first metal film and the first insulating film, the first work function film having a first work function different from a work function of the first channel formed region, wherein the second gate electrode comprises a second metal film and a second work function film, the second work function film contacting the second metal film and the second insulating film, the second work function film having a second work function different from a work function of the second channel formed region, and wherein the first work function of the first work function film and the second work function of the second work function film are different from each other.

2. The semiconductor device according to the claim 1, wherein a thickness of the first work function film is larger than a thickness of the second work function film.

3. The semiconductor device according to the claim 1, further comprising:
a third gate electrode being adjacent to the first gate electrode and covering the upper surface and the side surface of the first protrusion via a third insulating film; and
a fourth gate electrode being adjacent to the second gate electrode and covering the upper surface and the side surface of the second protrusion via a fourth insulating film,
wherein the first gate electrode, the third gate electrode, the first source region, and the first drain region configure the first nonvolatile memory, and
wherein the second gate electrode, the fourth gate electrode, the second source region, and the second drain region configure the second nonvolatile memory cell.

4. The semiconductor device according to the claim 3, further comprising:
a fifth insulating film covering an upper surface of the third gate electrode and not covering an upper surface of the first gate electrode such that the upper surface of the first gate electrode is exposed from the fifth insulating film; and
a sixth insulating film covering an upper surface of the fourth gate electrode and not covering an upper surface of the second gate electrode such that the upper surface of the second gate electrode is exposed from the sixth insulating film.

5. The semiconductor device according to the claim 1, wherein the first work function film covers a side surface of the first insulating film, and
wherein the second work function film covers a side surface of the second insulating film.

6. The semiconductor device according to the claim 1, wherein the semiconductor substrate further comprises a third region different from the first region and the second region,
wherein the third region comprises:
a third protrusion which is a part of the third region of the semiconductor substrate, protrudes from the upper surface of the semiconductor substrate, and extends in the first direction along the upper surface of the semiconductor substrate,
a third gate electrode covering the upper surface of the semiconductor substrate in the third region and an upper and side surface of the third protrusion via a third insulating film including a third charge storage portion, and
a third source region and third drain region formed in the third protrusion so as to sandwich a third channel formed region therebetween in the first direction, the third channel formed region being a region inside the third protrusion and being covered with a pattern comprised of the third gate electrode,
wherein at least the fifth third gate electrode, the third source region, and the third drain region configure a third nonvolatile memory cell,
wherein the third gate electrode comprises a third metal film and a third work function film, the third work function film having a third work function different from the work functions of the first channel formed region and the second channel formed region, and
wherein the third work function of the third work function film is different from the first work function of the first work function film and the second work function of the second work function film.

7. The semiconductor device according to the claim 1, wherein the first nonvolatile memory cell stores codes of a program, and the second nonvolatile memory cell stores data used when executing the program.

8. The semiconductor device according to the claim 6, wherein the first nonvolatile memory cell stores codes of a program, and the second nonvolatile memory cell stores data used when executing the program, and the third nonvolatile memory cell stores a flag which indicates whether the data is written or not written.

9. The semiconductor device according to the claim 6, further comprising:
a fourth region different from the first region, the second region, and the third region,
wherein the fourth region comprises:
a fourth protrusion which is a part of the fourth region of the semiconductor substrate, protrudes from an upper surface of the semiconductor substrate, and extends in the first direction along the upper surface of the semiconductor substrate,
a fourth gate electrode covering the upper surface of the semiconductor substrate in the fourth region and an upper and side surface of the fourth protrusion via a fourth insulating film including a fourth charge storage portion, and
a fourth source region and fourth drain region formed in the fourth protrusion so as to sandwich a fourth channel formed region therebetween in the first direction, the fourth channel formed region being a region inside the fourth protrusion and being covered with a pattern comprised of the fourth gate electrode,
wherein at least the fourth gate electrode, the fourth source region, and the fourth drain region configure a fourth nonvolatile memory cell,
wherein the fourth gate electrode comprises a fourth metal film and a fourth work function film, the fourth work function film having a fourth work function different from the work functions of the first channel formed region, the second channel formed region, and the third channel formed region, and wherein the fourth work function of the fourth work function film is different from the first work function of the first work function film, second work function of the second work function film, and third work function of the third work function film.

10. The semiconductor device according to the claim 9, wherein the first nonvolatile memory cell stores codes of a program, and the second nonvolatile memory cell stores data used when executing the program, and the third nonvolatile memory cell stores a flag which indicates whether the data is written or not written, and the fourth nonvolatile memory cell stores trimming codes.

11. A semiconductor device, comprising:
a nonvolatile memory having a plurality of memory regions,
wherein the nonvolatile memory includes:
a code region corresponding to one of the plurality of memory regions, and configured to store program codes; and
a data region corresponding to another one of the plurality of memory regions, and configured to store data executed by the program codes, and
wherein a first gate electrode of a fin-type first transistor in the code region covers a part of a first protrusion via a first insulating film including a first charge storage portion,
wherein the first gate electrode comprising a first metal film and a first work function film, the first work function film contacting the first metal film and the first insulating film, the first work function film having a first work function,
wherein a second gate electrode of a fin-type second transistor in the data region covers a part of a second protrusion via a second insulating film including a second charge storage portion,
wherein the second gate electrode comprising a second metal film and a second work function film, the second work function film contacting the second metal film and the second insulating film, the second work function film having a second work function, and
wherein the first work function of the first work function film and the second work function of the second work function film are different from each other.

12. The semiconductor device according to claim 11, wherein the first work function is different from a work function of a channel formed region of the fin-type first transistor, and
wherein the second work function is different from a work function of a second channel formed region of the fin-type second transistor.

13. The semiconductor device according to claim 12, a thickness of the first work function film and a thickness of the second work function film are different from each other.

* * * * *